US007906229B2

(12) United States Patent  
Goyal

(10) Patent No.: US 7,906,229 B2  
(45) Date of Patent: Mar. 15, 2011

(54) SEMICONDUCTOR-BASED, LARGE-AREA, FLEXIBLE, ELECTRONIC DEVICES

(76) Inventor: Amit Goyal, Knoxville, TN (US)

( * ) Notice: Subject to any disclaimer, the term of this patent is extended or adjusted under 35 U.S.C. 154(b) by 347 days.

(21) Appl. No.: 11/715,047

(22) Filed: Mar. 8, 2007

(65) Prior Publication Data

US 2008/0217622 A1    Sep. 11, 2008

(51) Int. Cl.
  *B32B 9/00*   (2006.01)
  *B32B 19/00*  (2006.01)
  *B32B 9/04*   (2006.01)
  *B32B 15/04*  (2006.01)
(52) U.S. Cl. ......... 428/698; 428/446; 428/450; 428/699
(58) Field of Classification Search .................. 428/446, 428/450, 698, 699
  See application file for complete search history.

(56) References Cited

U.S. PATENT DOCUMENTS

| | | | |
|---|---|---|---|
| 6,784,139 B1* | 8/2004 | Sankar et al. ................. | 505/237 |
| 6,872,988 B1* | 3/2005 | Goyal ........................... | 257/190 |
| 2004/0003768 A1* | 1/2004 | Goyal .............................. | 117/2 |
| 2004/0261837 A1* | 12/2004 | Friedman et al. ............. | 136/249 |
| 2005/0163692 A1* | 7/2005 | Atanackovic .................. | 423/263 |
| 2006/0033160 A1* | 2/2006 | Findikoglu et al. ........... | 257/347 |
| 2006/0115964 A1* | 6/2006 | Findikoglu et al. ........... | 438/509 |
| 2006/0208257 A1* | 9/2006 | Branz et al. .................... | 257/49 |
| 2007/0044832 A1* | 3/2007 | Fritzemeier .................... | 136/252 |
| 2010/0167084 A1* | 7/2010 | Bhattacharya et al. ....... | 428/637 |

OTHER PUBLICATIONS

Goyal et al. "Low Cost, Single Crystal-like Substrates for Practical, High Efficiency Solar Cells", AIP Conference Proceedings, vol. 404, Issue 1, Apr. 1997, p. 377-394.*
Metals Handbook, Desk Edition, American Society of Metals, Metals Park, Ohio 44073, p. 14-10.
Recrystallization and Related Annealing Phenomena by F. J. Humpreys and M. Hatherly, Pergamon Press, 1995, pp. 43-47.
Structure of Metals, Crystallographic Methods, Principles and Data, Third Revised Edition by C. S. Barrett and T. B. Massalski, Pregamon Press, 1980, pp. 568-575.
Letter of transmittal to DOE Office of Chief Council from UT-Battelle Patent Council dated Jan. 16, 2002 disclosing the invention titled "Method of fabricating flexible, semiconductor-based devices".
Letter of transmittal to DOE Office of Chief Council from UT-Battelle Patent Council dated May 3, 2002 disclosing the invention titled "Method of fabricating GaAS-based devices on low-cost substrates using scalable methods and articles resulting thereform".

* cited by examiner

*Primary Examiner* — Jennifer C McNeil
*Assistant Examiner* — Jonathan C Langman

(57) ABSTRACT

Novel articles and methods to fabricate the same resulting in flexible, large-area, triaxially textured, single-crystal or single-crystal-like, semiconductor-based, electronic devices are disclosed. Potential applications of resulting articles are in areas of photovoltaic devices, flat-panel displays, thermophotovoltaic devices, ferroelectric devices, light emitting diode devices, computer hard disc drive devices, magnetoresistance based devices, photoluminescence based devices, non-volatile memory devices, dielectric devices, thermoelectric devices and quantum dot laser devices.

29 Claims, 29 Drawing Sheets

FIG. 1
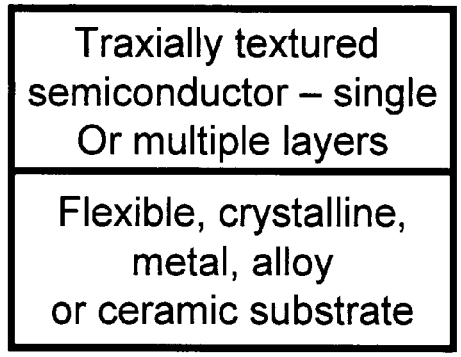
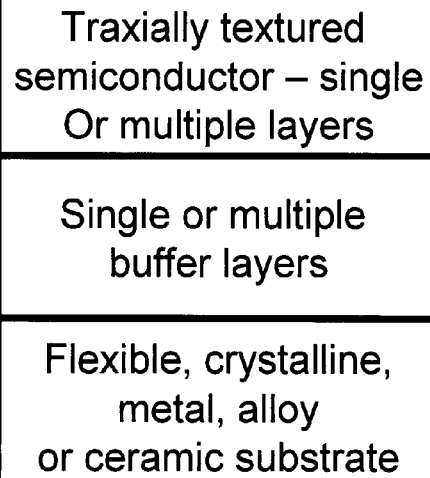
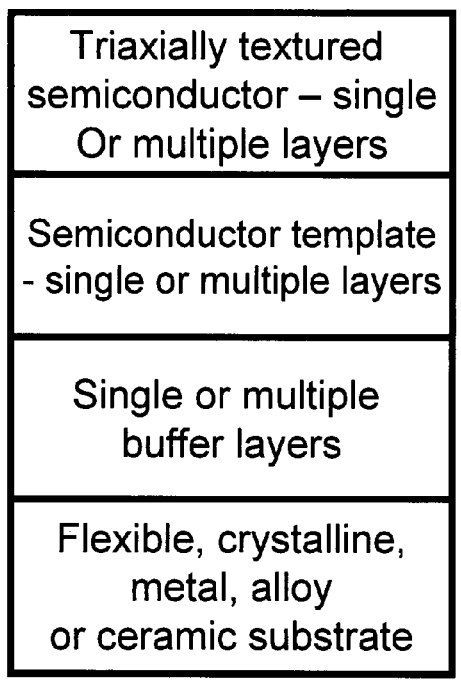
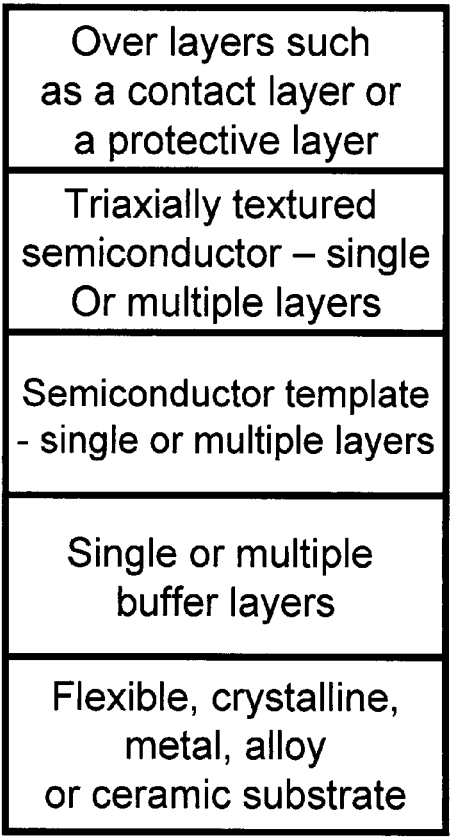

| Triaxially textured semiconductor – single or multiple layers |
| --- |
| Single or multiple triaxially textured, buffer layers |
| Flexible, triaxially textured Cu, Mo, Nb, Al, Fe or Ni-alloy substrate |

(B)

| Triaxially textured semiconductor – single or multiple layers |
| --- |
| Flexible, triaxially textured semiconductor template |
| Single or multiple triaxially textured, buffer layers |
| Flexible, triaxially textured Cu, Mo, Nb, Al, Fe or Ni-alloy substrate |

FIG. 14

| Single crystal like or triaxially textured Silicon |
|---|
| Single crystal like or triaxially textured TiN |
| Single crystal like or triaxially textured NiW substrate |

In-plane texture: FWHM = 6.6°
Out-of-plane texture:
FWHM = 3.2° (in rolling direction of NiW)
FWHM = 6.6° (about rolling direction of NiW)

FIG. 17
(A)
Color coded grains
≤ 2 degree
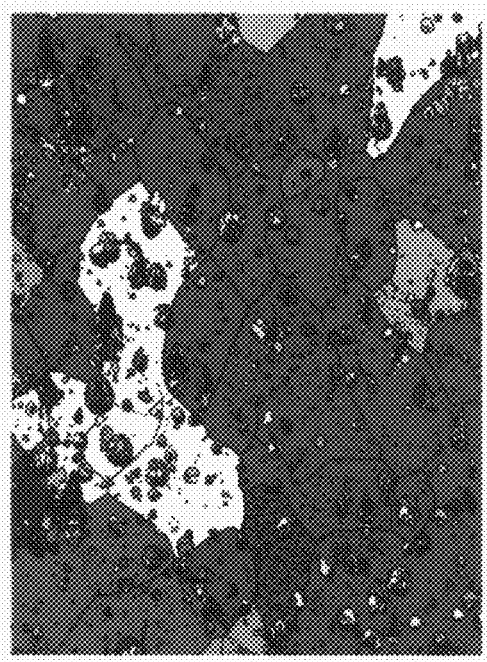
(B)
Color coded grains
≤ 3 degree
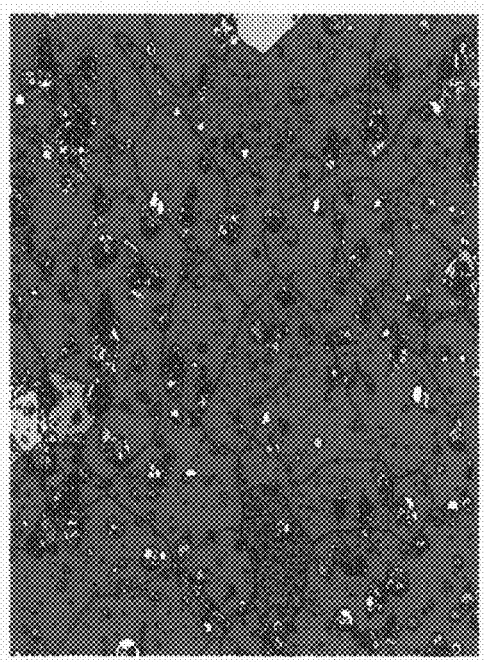

Selected area diffraction pattern from <100> zone axis of a plan view of Si/TiN/NiW, showing alignment of Si{220}, TiN{200} and Ni{200} diffraction spots.

FIG. 23
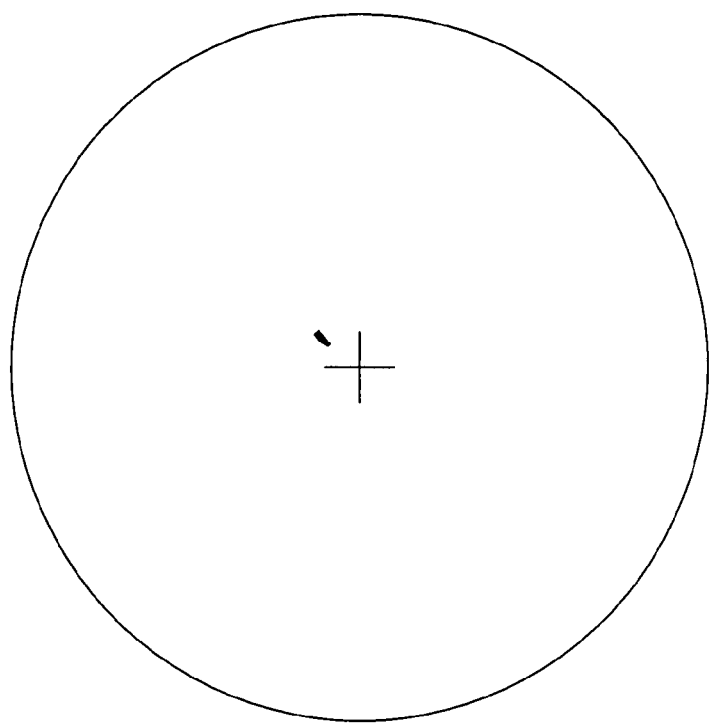
Ni (200)
Pole figure
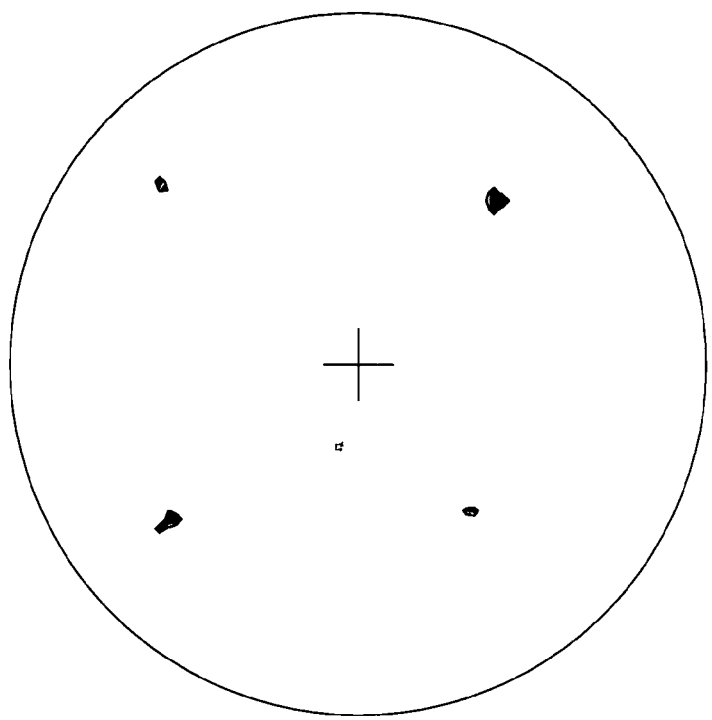
Ni (111)
Pole figure

SEMICONDUCTOR-BASED, LARGE-AREA, FLEXIBLE, ELECTRONIC DEVICES

STATEMENT REGARDING FEDERALLY FUNDED RESEARCH OR DEVELOPMENT

This invention was made with Government support under Contract No. DE-AC05-00OR22725 awarded by the United States Department of Energy. The Government has certain rights in this invention

FIELD OF THE INVENTION

The invention relates to fabrication of high performance electronic devices comprising various types of semiconductors and articles made therefrom.

BACKGROUND OF THE INVENTION

Electronic devices based on semiconductors such as diodes, transistors and integrated circuits can be found everywhere in our daily lives, in televisions, automobiles, household gadgets and computers. We have come to rely on them and increasingly have come to expect higher performance at a lower cost. Personal computers clearly illustrate this trend. A significant factor in the successful growth of the computer industry is that through technological advances, smaller and smaller transistors were fabricated and more of them could be incorporated in a given area. These devices deliver year after year better performance while consuming less power and because of their smaller size they can also be manufactured at a lower cost per device. For many of these applications, if the cost of the device is significantly reduced, many more applications can be envisaged. This is especially true for the photovoltaic or solar energy application, for a whole range of sensors as well as for other application areas such as ferroelectric devices, light emitting diodes for solid state lighting applications, storage applications such as computer hard disc drives, magnetoresistance based devices, photoluminescence based devices, non-volatile memory applications, dielectric devices, thermoelectric devices, The use of renewable energy sources is essential for the future of the world we are living in. There is an unlimited potential for solar energy to power all the world's energy needs. However, for the past two decades, the promise of solar energy has remained unrealized. This is primarily because of the unfavorable price/performance metric of solar cells being manufactured today. In 1996, photovoltaics was a $1 Billion dollar per year business worldwide with more than 20 percent annual growth. Further increase in market share of the photovoltaic industry will require significant reductions in cost compared to most other forms of electricity generation typical in the utility industry. Higher efficiency cells made using more automated manufacturing processes are expected to lead the way to cost reduction. As prices decrease, usage of photovoltaic cells will increase, specially because of the environmental benefits offered by this technology compared to other forms of energy generation. Further technological innovations have the potential to cause the economic and commercial breakthrough necessary to lower prices to make solar energy cheaper than or equal to fossil fuels in cost.

Thin-film photovoltaics (PV) have a significant advantage over the traditional wafer-based crystalline Si cells. The primary advantage of thin films is cheaper materials and manufacturing costs and higher manufacturing yields compared to single-crystal technologies. Thin films use 1/20 to 1/100 of the material needed for crystalline Si PV and appear to be amenable to more automated, less expensive production. Currently, three film technologies are receiving significant interest from the industry for large scale PV: amorphous Si, $CuInSe_2$ and CdTe. In most cases, module efficiencies are closely related to cell efficiencies, with minor losses (~10%) due to some loss of active area and some electrical resistance losses. In order to further increase the efficiency and to be able to reproducibly fabricate thin-film based, high efficiency cells, microstructural features which limit the performance need to be controlled. While a complete understanding of the microstructural features which limit the performance are still unclear, it is reasonably well established that recombination at grain boundaries, intragrain defects and impurities is critical. In an effort to minimize the effect of grain boundaries, films with large grains are an objective.

Most thin-film solar cells are based on polycrystalline device layers since the cost of single crystal substrates is prohibitively expensive. Because they are polycrystalline, they do not have a well-defined crystallographic orientation (both out-of-plane and in-plane). Crystallographic orientation can have two important effects. The first is the effect of orientation of the growth surface on incorporation of dopants, intrinsic defects, and other impurities. Previous studies on a wide variety of dopants have shown that variations of 1 to 2 orders of magnitude can occur based on crystallographic orientation. An extreme effect of anisotropic doping is Si doping in GaAs films. Si doping in GaAs films, causes n-type conduction on (111) B-type GaAs, but p-type on (111) A-type GaAs. The second effect of crystallographic orientation is a variation in growth rate of the film being deposited. Both experiments as well as simulations have shown that under certain conditions growth rates can vary by 1 to 2 orders of magnitude as a function of crystallographic orientation. Uncontrolled crystallographic orientation in PV materials with large grain sizes may therefore result in reproducibility problems and hence lower yields during high volume production. Of course, grain boundaries at the intersection of grains in the polycrystalline film act as detrimental, recombination centers.

Most of the microstructural features currently thought to be limiting polycrystalline, thin-film, solar cell performance can be avoided by growing epitaxial films on lattice-matched, single crystal substrates. However, the high costs of single crystal substrates, prohibits their use for realistic applications. The effect of grain boundaries can be circumvented in polycrystalline photovoltaic thin films if the grain sizes are large enough (grain size at which effects on properties are minimal depend among other things on the doping level). However, in thin-films, grain growth is typically restricted to only twice the thickness of the film. Hence, grain boundaries in polycrystalline films have a dominant effect on efficiencies. A large number of studies have reported the effects of grain boundaries on photovoltaic properties.

While GaAs based solar cells need only be a micron or so thick to be effective. Silicon solar cells have to be much thicker, about 5-10 times thicker. Again as is the case with GaAs based solar cells, single crystal solar cells have the highest efficiencies of all. However, the high costs of fabricating single crystal Si or Ge wafers, prohibits the use of PV as an alternative energy source to fossil fuels. For Si-based solar cells, one would require a single crystal-like Si layer of greater than 10 µm, with an effective grain size of several hundred microns, preferably approaching a mm.

While much of the discussion above has focused on the solar cell application, there are numerous applications where a low cost, practically scalable method of fabricating single crystal-like semiconductor films is required where the effective size of the single crystal is at most a few cms in diameter. Furthermore, for certain applications, the semiconductor surfaces/films/wafers need to be flexible, thus enabling applications where a curved semiconductor may be desirable. For example, for a solar cell application it may be desirable to conform the PV module to the contour of a roof upon where it is placed. Thin-film transistors are used for fabricating displays. In this application one can also easily appreciate the use for a flexible and large-area displays.

Several techniques to fabricate single crystal-like substrates have recently been developed. These substrates have a surface which has a cubic crystal structure and is biaxially or triaxially textured. Triaxial texture in the substrate refers to situation when the three crystallographic axis of all the grains in a polycrystalline substrate are aligned within a certain angular range with respect to one another. The orientation of any grain in a material can be determined based on the orientation of the three crystallographic axis of the grain. These crystallographic axis are in general referred to as a, b, and c axis. For materials with higher crystal symmetry, such as cubic and tetragonal, these three axis are at right angles to one another or at 90 degrees with respect to one another. For such materials of high crystal symmetry, the alignment of any two axis necessarily implies the alignment of the third axis. Hence, description of the material as a biaxially textured material is adequate. However, for materials with lower symmetry such as monoclinic, the three axis are not at right angles to one another. In a polycrystalline sample of a complex monoclinic material, if the composition varies from grain to grain resulting in a change between the angles of the three crystallographic axis, then alignment of any two axis does not necessarily imply the alignment of the third. Hence, triaxial texture is the complete description of texture in such cases.

For cubic substrates used in the high temperature superconductor application, biaxial texture of sufficient quality for electromagnetic applications can be generally defined as being characterized by an x-ray diffraction phi scan peak of no more than 20° full-width-half-maximum (FWHM) and a omega-scan of 10° FWHM. The X-ray phi-scan and omega-scan measure the degree of in-plane and out-of-plane texture respectively. An example of a single-crystal-like texture is the cube texture with orientation {100}<100>, wherein the (100) crystallographic plane of all grains is parallel to the substrate surface and the [100] crystallographic direction is aligned along the substrate length. Another example of a single-crystal-like texture is the Goss texture with the orientation {110}<100>, wherein the (110) crystallographic plane of all grains is parallel to the substrate surface and the [100] crystallographic direction is aligned along the substrate length. Yet another example of a single-crystal-like texture is the orientation {210}<100>, wherein the (210) crystallographic plane of all grains is parallel to the substrate surface and the [100] crystallographic direction is aligned along the substrate length. Other suitable definitions have also been set forth in varying terms. Fabrication of single-crystal-like textured sheets or substrates via thermomechanical processing such as rolling and annealing is well established in the metallurgical and texture community worldwide. In addition to texturing via the thermomechanical processing route, there are other known routes to fabrication of biaxially textured, flexible electromagnetic devices known as ion-beam-assisted deposition (IBAD), inclined-substrate deposition (ISD) and deposition in the presence of a magnetic field. IBAD processes are described in U.S. Pat. Nos. 6,632,539, 6,214,772, 5,650,378, 5,872,080, 5,432,151, 6,361,598, 5,872,080, 6,190,752, 6,756,139, 6,884,527, 6,899,928, 6,921,741; ISD processes are described in U.S. Pat. Nos. 6,190,752 and 6,265,353; and biaxial texture by deposition in the presence of a magnetic field are described in U.S. Pat. No. 6,346,181; all these patents are incorporated herein by reference. Post-deposition ion-bombardment of uniaxially textured metal and/or alloy films on a unoriented, polycrystalline substrate can also result an in-plane texture via a selective grain growth process and in the extreme case the film can become triaxially textured. In all of these processes, a flexible, polycrystalline, untextured substrate or an amorphous substrate is used upon which buffer layers are deposited. One the key buffer layers is a biaxially textured layer that is deposited on this substrate using either IBAD, ISD or deposition in a magnetic field.

The following literature citations are incorporated by reference herein:

1. NREL News release, NR-01296, May 10, (1996), http://www.nrel.gov/hotstuff/press/thinfilm.html.
2. Zweibel, K., "Thin Films: Past, Present, Future," Progress in PV, The future of Thin Film Solar Cells, V. 3, # 5, 279-294, (1995).
3. Martin A. Green, Third Generation Photovoltaics, Advanced Solar Energy Conversion, Published by Springer-Verlag, ISSN 1437-0379, 2003.
4. Venkatasubramanian, R., O'Quinn, B. C., Hills, J. S., Sharps, P. R., Timmons, M. L., Hutchby J. A., Field, H., Ahrenkiel, R. and Keyes, B., "18.2% efficient GaAs Solar Cell on Optical-grade Polycrystalline Ge Substrates", in Proceedings of the 25th IEEE Photovoltaic Specialists Conference, 1996, 31-36.
5. Bhat, R., Caneau, C., Zalt, C. E., Koza, M. A., Borner, W. A., Hwang, D. M., Schartz, S. A., Menocal S. G. and Favire, F. G., "Orientation dependence of S, Zn, Si, Te, and Sn doping in OMCVD growth of InP and GaAs—application to DH lasers and lateral p-n junction arrays grown on non-planar substrates," J. Cryst. Growth, 107, 772-778 (1991).
6. Kondo, M., Anayama, C., Okada, N., Sekiguchi, H., Domen, K. and Tanabashi, T., "Crystallographic orientation dependence of impurity incorporation into III-IV compound semiconductors grown by metallorganic vapor phase epitaxy," J. Appl. Phys., 76, 914-927 (1994).
7. Pavesi, I., Piazza, F., Hernioi, M and Harrison, I., Orientation dependence of the Si doping of GaAs grown by molecular beam epitaxy," Semicond. Sci. and Tech., 8, 167-171 (1993).
8. Jones, S. H., Salinas, L. S., Jones, J. R. and Mayer, K, "Crystallographic orientation dependence of the growth rate for GaAs low pressure organometallic vapor phase epitaxy," J. of Electron. Mater., 24, 5-14 (1995).
9. Salermo, J. P., Fan, C. C., McClelland, R. W., Vohl, P., Mavroides, J. G., Bozler, C. O., "Electronic Properties of Grain Boundaries in GaAs: A Study of Oriented Bicrystals Prepared by Epitaxial Lateral Overgrowth," MIT Technical Report 669, May 10, 1984.
10. "Polycrystalline and Amorphous Thin Films and Devices", edited by Kazmerski, L. L., Academic Press, New York, 1980.
11. "Grain Boundaries in Semiconductors," edited by Leamy, H. J., Pike, G. E. and Seager, C. H., North-Holland, New York, 1982.
12. Card, H. C. and Yang E. S., "Electronic Processes at Grain Boundaries in Polycrystalline Semiconductors Under Optical Illumination," IEEE Trans. Electron Devices, ED-24, 397 (1977).
13. Singh, R., Bhar, T. N., Shewchun, J. and Loferski, J. J., "Effect of Grain Boundaries on the Performance of Polycrystalline Tunnel MIS Solar Cells," J. Vac. Sci. & Tech., 16, 236 (1979).

14. Kazmerski, L. L., "The Effects of Grain Boundaries and Interface recombination on the Performance of Thin-Film Solar Cells," Solid-State Electron, 21, 1545 (1978); Kazmerski, L. L., Sheldon, P. and Ireland, P. J., Thin-Solid Films, 58, 95 (1979).
15. Goyal, A, Norton, D. P., Budai, J. D., Paranthaman, M., Specht, E. D., Kroeger, D. M., Christen, D. K., He, Q., Saffian, B., List, F. A., Lee, D. F., Martin, P. M., Klabunde, C. E., Hatfied, E. and Sikka, V. K., "High critical Current Density Tapes by Epitaxial Deposition of YBa2Cu3Ox Thick Films on Biaxially Textured Metals," Appl. Phys. Lett., Sept., 69, 1795 (1996).
16. Silicon processing for the VSLI Era, Vol. 1, eds. S. Wolf and R. N. Tanber, pages 539-574, Lattice Press, Sunset Park, Calif., 1986.
17. Thesis S. D. and Wagner S., "Amorphous silicon thin-film transistors on steel foil substrates," IEEE Electron Device Lett., vol. 17, no. 12, pp. 578-580, December 1996.
18. Serikawa T. and Omata F., "High-mobility poly-Si TFT's fabricated on flexible stainless steel substrates," IEEE Electron Device Lett., vol. 20, no. 11, pp. 574-576, November 1999.
19. Afentakis T. and Hatalis M., "High performance polysilicon circuits on thin metal foils," Proc. SPIE, vol. 5004, pp. 122-126, 2003.
20. Howell R. S., Stewart M., Karnik S. V., Saha S. K. and Hatalis M. K., IEEE Electron Device Lett., vol. 21, no. 2, pp. 70-72, February 2000.
21. Afentakis T., Hatalis M., Voutsas T. and Hartzell J., "Polysilicon TFT AM-OLED on thin flexible metal substrates," Proc. SPIE, vol. 5004, pp. 187-191, 2003.
22. Martin A. Green, Keith Emery, Klaus Bücher, David L. King, Sanekazu Igari, "Solar cell efficiency tables (version 11)," Progress in Photovoltaics: Research and Applications, Volume 6, Issue 1, Pages 35-42, 4 May 1999.
23. Karam, N. H.; King, R. R.; Cavicchi, B. T.; Krut, D. D.; Ermer, J. H.; Haddad, M.; Li Cai; Joslin, D. E.; Takahashi, M.; Eldredge, J. W.; Nishikawa, W. T.; Lillington, D. R.; Keyes, B. M.; Ahrenkiel, R. K., "Development and characterization of high-efficiency Ga0.5In0.5P/GaAs/Ge dual- and triple-junction solar cells," Electron Devices, IEEE Transactions on, Vol. 46, No. 10, pp. 2116-2125, October 1999.
24. H. Hou, K. Reinhardt, S. Kurtz, J. Gee, A. Allerman, B. Hammons, P. Chang, E. Jones, Novel InGaAsN pn junction for high-efficiency multiple-junction solar cells, The Second World Conference on PV Energy Conversion, 1998, pp. 3600-3603.
25. D. Friedman, J. Geisz, S. Kurtz, J. Olson, 1-eV GaInNAs solar cells for ultra high efficiency multijunction devices, The Second World Conference on PV Energy Conversion, 1998, pp. 3-7; T. V. Torchynska and G. Polupan, "High efficiency solar cells for space applications," Superficies y Vacío 17(3), 21-25, septiembre de 2004.
26. R. McConnell and M. Symko-Davies, "DOE High Performance Concentrator PV Project," International Conference on Solar Concentrators for the Generation of Electricity or Hydrogen, 1-5 May 2005, Scottsdale, Ariz., NREL/CD-520-38172.
27. Michelle J. McCann, Kylie R. Catchpole, Klaus J. Weber, Andrew W. Blakers, "A review of thin-film crystalline silicon for solar cell applications. Part 1: Native substrates," Solar Energy Materials and Solar Cells, Vol. 68, Issue 2, May 2001, Pages 135-171.
28. Kylie R. Catchpole, Michelle J. McCann, Klaus J. Weber and Andrew W. Blakers, "A review of thin-film crystalline silicon for solar cell applications. Part 2: Foreign substrates," Solar Energy Materials and Solar Cells, Vol. 68, Issue 2, May 2001, Pages 173-215.
29. B. Cunningham, H. Strunk and D. G. Ast, "First and second order twin boundaries in edge defined film growth silicon ribbon, Appl. Phys. Lett., 40, pp. 237-239, 982
30. M. Rinio, M. Kaes, G. Hahn and D. Borchert, "Hydrogen passivation of extended defects in multicrystalline silicon solar cells," Presented at the 21$^{st}$ European Photovoltaic Solar Energy Conference and Exhibition, Dresden, Germany, 4-8, 9, 2006.
31. A. Ebong, M. Hilali, A. Rohtagi, D. Meier and D. S. Ruby, "Belt furnace gettering and passivation of n-web silicon for high-efficiency screen-printed front-surface field solar cells," Progress in Photovoltaics: Research and Applications, 9, pp. 327-332, 2001.
32. C. H. Seager, D. J. Sharp and J. K. G. Panitz, "Passivation of grain boundaries in silicon," J. Vac. Sci. & tech., 20, pp. 430-435, 1982; N. H. Nickel, N. M. Johnson and W. B. Jackson, "Hydrigen passivation of grain boundary defects in polycrystalline silicon thin films," Appl. Phys. Lett., 62, pp. 3285-3287, 1993.
33. A. Ashok, "Research in hydrogen passivation of defects and impurities in silicon," NREL Report No. NREL/SR-520-36096, May 2004; M. Lipinski, P. Panek, S. Kluska, P. Zieba, A. Szyszka and B. Paszkiewicz, "Defect passivation of multicrystalline silicon solar cells by silicon nitride coatings," Materials Science-Poland, vol. 24, pp. 1003-1007, 2006.
34. V. Yelundur, "Understanding and implementation of hydrogen passivation of defects in string ribbon silicon for high-efficiency, manufacturable, silicon solar cells," Ph.D. thesis, Georgia Institute of Technology, Atlanta, Ga., November 2003.
35. R. Hühne, S. Fähler, B. Holzapfel, "Thin biaxially textured TiN films on amorphous substrates prepared by ion-beam assisted pulsed laser deposition," Appl. Phys. Lett., vol. 85, pp. 2744-2746, 2004.
36. Jin-Hyo Boo 1, S. A. Ustin, W. Ho, "Supersonic jet epitaxy of single crystalline cubic SiC thin films on Si substrates from t-Butyidimethylsilane," Thin Solid Films 324, pp. 124-128, 1988.
37. Lars Oberbeck, Jan Schmidt, Thomas A. Wagner and Ralf B. Bergman, "High rate deposition of epitaxial layers for efficient low-temperature thin film epitaxial silicon solar cells," Progress in Photovoltaics: Research and Applications, vol. 9, pp. 333-340, 2001.
38. J. Carabe and J. J. Gandia, "Thin-film-silicon Solar Cells," OPTO-Electronics Review, vol. 12, pp. 1-6, 2004; S Summers, H S Reehal and G H Shirkoohi, "The effects of varying plasma parameters on silicon thin film growth by ECR plasma CVD," J. Phys. D: Appl. Phys. Vol. 34, pp. 2782-2791, 2001.
39. Thomas A. Wagner, Ph.D. thesis, "Low temperature silicon epitaxy: Defects and electronic properties," Institut fur Physikalische Elektronik der Universit at Stuttgart, 2003.
40. Hjemas, P. C., Lohne, O., Wandera, A., Tathgar, H. S., "The effect of grain orientations on the efficiency of multicrystalline solar cells," Solid State Phenomena, vol. 95-96, pp. 217-222, 2004.
41. Liwen tan, Qiyuan Wang, Jun Wang, Yuanhuan Yu, Zhongli Liu and Lanying Lin, "Fabrication of novel double-hetero-epitaxial SOI structure $Si/\gamma-Al_2O_3/Si$," Journal of Crystal Growth, vol. 247, pp. 255-260, 2003.
42. K. Sawada, M. Ishida, T. Nakamura and N. Ohtake, "Metalorganic moelecular beam epitaxy of films on si at low growth temperatures," Appl. Phys. Lett., vol. 52, pp. 1672-1674, 1988.

43. M. Shahjahan, Y. Koji, K. Sawada and M. Ishida, "Fabrication of resonance tunnel diode by gamma-Al2O3/Si multiple heterostructures," Japn. J. of Appl. Phys. Part 1, vol. 41 (4B), pp. 2602-2605, 2002.
44. Hattangady, S. V., Posthill, J. B., Fountain, G. G., Rudder R. A., Mantini and M. J., Markunas, R. J., "Epitaxial silicon deposition at 300° C. with remote plasma processing using $SiH_4/H_2$ mixtures," Appl. Phys. Lett., vol. 59(3), pp. 339-341, 1991.
45. Wagner, T. A., Oberbeck, L., and Bergmann, R. B., "Low temperature epitaxial silicon films deposited by ion-assisted deposition," Materials Science & Engineering B-Solid State Materials for Advanced Technology, vol. 89, pp. 1-3, 2002.
46. Overbeck, L., Schmidt, J., Wagner, T. A., and Bergmann R. B., "High-rate deposition of epitaxial layers for efficient low-temperature thin film epitaxial silicon solar cells," Progress in Photovoltaics, vol. 9(5), pp. 333-340, 2001.
47. Thiesen, J., Iwaniczko, E., Jones, K. M., Mahan, A., and Crandall, R., "Growth of epitaxial silicon at low temperatures using hot-wire chemical vapor deposition," Appl. Phys. Lett., vol. 75(7), pp. 992-994, 1999.
48. Ohmi, T., Hashimoto, K., Morita, M., Shibata, T., "Study on further reducing the epitaxial silicon temperature down to 250° C. in low-energy bias sputtering," Journal of Appl. Phys., vol. 69(4), pp. 2062-2071, 1991.
49. Cline H. E., "A single crystal silicon thin-film formed by secondary recrystallization," Journal of Appl. Phys., vol. 55 (12), pp. 4392-4397, 1984.
50. R. Chowdhury, X. Chen and J. Narayan, "Pulsed laser deposition of Si/TiN/Si(100) heterostructures," Appl. Phys. Lett., vol. 64, pp. 1236-1239, 1994.
51. Santos, P. V.; Trampert, A.; Dondeo, F.; Comedi, D.; Zhu, H. J.; Ploog, K. H.; Zanatta, A. R.; Chambouleyron, I. "Epitaxial pulsed laser crystallization of amorphous germanium on GaAs," Journal of Applied Physics, Vol. 90, pp. 2575-2581, 2001.
52. T. Sameshima, H. Watakabe, H. Kanno, T. Sadoh and M. Miyao, "Pulsed laser crystallization of silicon-germanium films," Thin Solid Films Vol. 487 pp. 67-71, 2005.
53. Jin-Hyo Boo, S. A. Ustin and W. Ho, "Supersonic jet epitaxy of single crystalline cubic SiC thin films on Si substrates from t-Butyidimethylsilane," Thin solid Films, vol. 324, pp. 124-128, 1998.
54. K. Eisenbeiser, R. Emrick, R. Droopad, Z. Yu, J. Finder, S. Rockwell, J. Holmes, C. Overgaard, and W. Ooms, "GaAs MESFETs Fabricated on Si Substrates Using a $SrTiO_3$ Buffer Layer," IEEE Electron Device Letters, Vol. 23, No. 6, pp. 300-302, 2002.
55. Droopad R, Yu ZY, Li H, Liang Y, Overgaard C, Demkov A, Zhang XD, Moore K, Eisenbeiser K, Hu M, Curless J, Finder J, "Development of integrated hetero structures on silicon by MBE," Journal of Crystal Growth, vol. 251 (1-4), pp. 638-644, 2003.
56. R. D. Ott, P. Kadolkar, C. A. Blue, A. C. Cole, and G. B. Thompson, "The Pulse Thermal Processing of Nanocrystalline Silicon Thin-Films," JOM, vol. 56, pp. 45-47, October, 2004.
57. D. Cahen and R. Noufi, "Defect chemical explanation for the effect of air anneal on $CdS/CuInSe_2$ solar cell performance," Appl. Phys. Lett., vol. 54, pp. 558-560, 1989).
58. L. Kronik, D. Cahen, and H. W. Schock, "Effects of Sodium on Polycrystalline $Cu(In,Ga)Se_2$ and Its Solar Cell Performance," Advanced Materials, vol. 10, pp. 31-36, 1999.
59. M. J. Romero, K. Ramanathan, M. A. Contreras, M. M. Al-Jassim, R. Noufi, and P. Sheldon, "Cathodoluminescence of $Cu(In,Ga)Se_2$ thin films used in high-efficiency solar cells," Appl. Phys. Left., vol. 83, pp. 4770-4772, 2003.
60. Persson C, Zunger A., "Anomalous grain boundary physics in polycrystalline $CuInSe_2$: the existence of a hole barrier," Phys. Rev. Left. vol. 91, pp. 266401-266406, 2003.
61. C.-S. Jiang, R. Noufi, K. Ramanathan, J. A. AbuShama, H. R. Moutinho, and M. M. Al-Jassim, "Local Built-in Potential on Grain Boundary of $Cu(In,Ga)Se_2$ Thin Films," Conference Paper, NREL/CP-520-36981, 2005.
62. M. J. Hetzer, Y. M. Strzhemechny, M. Gao, M. A. Contreras, A. Zunger, and L. J. Brillson, "Direct observation of copper depletion and potential changes at copper indium gallium diselenide grain boundaries," Appl. Phys. Left. vol. 86, pp. 162105-162107, 2005.
63. A. Ohno, "Grain growth control by solidification technology," Materials Science Forum, vol. 204-206, pp. 169-178, 1996.
64. S. Chaisitsak, A. Yamada and M. Konagai, "Preferred Orientation Control of $Cu(In1-xGax)Se_2$ (x≈0.28) Thin Films and Its Influence on Solar Cell Characteristics," Jpn. J. Appl. Phys. vol. 41, pp. 507-513, 2002.
65. Olliges S, Gruber P, Bardill A, Ehrler D, Carstanjen HD and Spolenak R, "Converting polycrystals into single crystals—Selective grain growth by high-energy ion bombardment," Acta Meterialia, vol. 54, pp. 5393-5399.
66. Dinescu M, Stanciu C, Ghica D, Dinu R, Sandu V, Nastase N, Balucani M, Bondarenko V, Frachina L, Lamedica G, Ferrari A, "Multilayer structures deposited by laser ablation," Sensors and Actuators, vol. 74, pp. 27-30, 1999.
67. J. M. E. Harper, J. Gupta, D. A. Smith, J. W. Chang, K. L. Holloway, D. P. Tracey and D. B. Knorr, "Crystallographic texture change during abnormal grain growth in Cu—Co thin films," Appl. Phys. Lettl, vol. 65, pp. 177-179, 1994.
68. T. Ohmi, T. Saito, M. Otsuki, T. Shibuta and T. Nitta, "Formation of copper thin films by a low kinetic energy particle process," J. of Electrochemical Soc., vol. 138, pp. 1089-1097, 1991

SUMMARY OF THE INVENTION

The invention relates to fabrication of large-area, flexible, semiconductor based electronic devices which have high performance. The invention results in semiconductor devices which are crystallographically, single crystal like. The invention can also result in devices which are essentially single crystal or single grain. In the most general case, the invention results in the fabrication of "triaxially" textured semiconductor device layers.

"Triaxially textured" as used herein refers to the three crystallographic axis of all grains in a material being aligned with respect to one another. The unit cells of all materials can be characterized by three co-ordinate axis, a, b and c. The orientation of an individual grain in a polycrystalline specimen can be defined by the angles made by it's a, b, and c crystallographic axis with the reference specimen co-ordinate system. "Uniaxial texture" refers to alignment of any one of these axis in all the grains comprising the polycrystalline specimen. The "degree of uniaxial texture" can determined using electron backscatter diffraction or by X-ray diffraction. Typically, it is found that the grains have a normal or a Gaussian distribution of orientations with a characteristic bell curve. The full-width-half-maximum (FWHM) of this Gaussian distribution or peak, is the "degree of uniaxial texture" and defines the "sharpness of the texture". Biaxial texture refers to a case wherein two of the three crystallographic axis of all the grains are aligned within a certain degree or sharpness. Triaxial texture refers to a case wherein all three crystallographic axis of all the grains are aligned within a certain degree or sharpness. For example, a triaxial texture characterized by a FWHM of 10°, implies that the independent distribution of orientations of three crystallographic axis, namely a, b and c, of all the grains comprising the material can be described by a distribution whose full-width-half-maximum is 10°.

"Flexible" as used herein refers to the ability to bend the device around a 12 inch mandrel without degradation of device electronic properties.

The invention also provides a method for the fabrication of single grained semiconductor device layers, and articles formed thereof. As used herein, the phrase "single grain" and "single crystal" are defined herein as having only one grain, as opposed to polycrystalline which includes a plurality of grains. The definition of a grain is a compositionally homogeneous region of material which has the same crystallographic orientation in all directions. However, sub-grain boundaries can occur within a large grain. These are typically less than 1-2 degrees in misorientation. For a large grain, however, one can have a series of sub-grain boundaries which can make the total FWHM of the grain or the total spread of grain orientations larger, such as to 3 to 7 degrees. However, no boundary would exist within the grain which will have a misorientation greater than 2 degrees. Both single grain and single crystal substrates are triaxially textured by definition.

To achieve the foregoing and other articles, and in accordance with the purposes of the present invention, as embodied and broadly described herein, the present invention provides an electronic device article comprising (a) a flexible, large-area, crystalline, metal, alloy or ceramic substrate, and (b) at least one triaxially textured layer of an electronic material on said substrate, selected from a group comprising of but not limited to those based on indirect bandgap semiconductors such as Si, Ge, GaP; direct bandgap semiconductors such as CdTe, CuInGaSe$_2$ (CIGS), GaAs, AlGaAs, GaInP and AlInP; multiband semiconductors such as II-O-VI materials like Zn$_{1-y}$Mn$_y$O$_x$Te$_{1-x}$ and III-N-V multiband semiconductors such as GaN$_x$As$_{1-x-y}$P$_y$, and combinations thereof. This includes minor dopants of other materials in the semiconductor layers for obtaining the required n-type or p-type semiconducting properties.

In a preferred embodiment of the present invention, the said semiconductor layer in the article is a compound semiconductor composed of elements from two or more different groups of the Periodic Table, including compounds of Group III (B, Al, Ga, In) and Group V (N, P, As, Sb, Bi) for the compounds AlN, AlP, AlAs, GaN, GaP, GaAs, InP, InAs, InSb, AlInGaP, AlGaAs, InGaN etc, and the compounds of Group II (Zn, Cd, Hg) and Group VI (O, S, Se, Te) such as ZnS, ZnSe, ZnTe, CdTe, HgTe, CdHgTe etc. In addition to binary compounds of the above, ternary (three elements, e.g. InGaAs) and quaternary (four elements, e.g. InGaAsP) compounds are also are included.

In a preferred embodiment of the present invention, the said semiconductor layer in the article comprises an elemental semiconductor or alloys of elements within the same group such as SiC and SiGe or a compound semiconductor comprising elements of group IB, IIIA and VIA of the periodic table such as alloys of copper, indium, gallium, aluminium, selenium and sulfur.

In a preferred embodiment of the present invention, the textured semiconductor layer has a cubic, tetragonal or orthorhombic crystal structure and a crystallographic texture selected from a group comprising of but not limited to {100}<100>, {210}<100> and {110}<100>.

The semiconductor device article in accordance with this invention can also include at least one buffer layer on said substrate selected from a group comprising a metal, an alloy, a nitride, boride, oxide, fluoride, carbide, silicide or combinations thereof.

The buffer layer can be a nitride buffer layer corresponding to a composition of MN, wherein N is Nitrogen and M is selected from a group comprising Ti, Ce, Y, Zr, Hf, V, Nb, Nd, La, and Al and their combinations thereof.

The buffer layer can be an oxide buffer layer selected from a group comprising gamma Al$_2$O$_3$ (cubic form of Al$_2$O$_3$); perovskites such as but not limited to SrTiO$_3$, (Sr,Nb)TiO$_3$, BaTiO$_3$, (Ba,Ca)TiO$_3$, LaMnO$_3$, LaAlO$_3$, doped perovskites such as (La,Sr)MnO$_3$, (La,Ca)MnO$_3$; layered perovskites such as Bi$_4$Ti$_3$O$_{12}$; pyrochlores such as but not limited to La$_2$Zr$_2$O$_7$, Ca$_2$Zr$_2$O$_7$, Gd$_2$Zr$_2$O$_7$; flourites such as Y$_2$O$_3$, YSZ; rock-salt oxides such as but not limited to MgO; spinels such as but not limited to MgAl$_2$O$_4$, The buffer layer can comprise a mixture of a nitride and an oxide with a chemical formula MN$_x$O$_y$ (1<x, y>0), wherein N is Nitrogen and O is Oxygen, and M is selected from a group comprising Ti, Ce, Y, Zr, Hf, V, Nb, Nd, La, and Al and their combinations thereof.

The buffer layer can be a silicide buffer layer or an intermetallic alloy with germanium corresponding to a layer with a chemical formula, MSi or MSi$_2$, MSi$_3$, MGe or MGe$_2$, MGe$_3$, wherein M is a metal such as but not limited to Ni, Cu, Fe, Ir, and Co.

The buffer layer can also be a carbide layer corresponding to the cubic form of SiC.

In a preferred embodiment, at least the top buffer layer is electrically conducting.

The buffer layer can be a "graded buffer layer" comprising of multiple buffer layers with varying lattice parameters to provide a good lattice match to the semiconductor layer.

In a preferred embodiment, the electronic device further comprises a semiconductor template layer between the buffer layer(s) and the semiconductor device layer to provide a good lattice match to the semiconductor device layer.

The semiconductor template layer can be a "graded semiconductor template" layer with multiple layers of varying lattice parameters so as to provide a good lattice match to the semiconductor device layer.

In a preferred embodiment, the buffer layer has a triaxial texture characterized by a FWHM of less than 10 degrees in all three major crystallographic directions.

In a preferred embodiment, the substrate comprising the electronic device has a triaxial texture such that the distribution of grain orientations comprising the substrate is characterized by a FWHM of less than 10 degrees with respect to all three major crystallographic directions. The substrate can be selected from a group comprising Cu, Ni, Al, Mo, Nb and Fe and their alloys thereof.

In a preferred embodiment, the substrate is a single crystal with a mosaic less than 2 degrees.

In a preferred embodiment, the substrate comprises a single grain having a length of at least 0.1 meter, said single grain substrate having sub-grain boundaries with sub-grain boundary misorientations less than 2 degrees.

In a preferred embodiment, the electronic device is a photovoltaic device comprising at least one pn junction parallel to the substrate surface.

In yet another preferred embodiment, the electronic device is a photovoltaic device comprising a multi-junction cell with at least two and preferably three pn junctions parallel to the substrate surface.

In a preferred embodiment, the photovoltaic conversion efficiency of said device layer is greater than 8% and preferably better than 12%.

In yet another preferred embodiment, the semiconductor layer comprising the electronic device has the (100) or (200) crystallographic plane of the device layer parallel to the surface of the substrate within 10 degrees.

In yet another preferred embodiment, the semiconductor layer comprising the electronic device has the (110) or (220) or (210) crystallographic plane of the device layer parallel to the surface of the substrate within 10 degrees.

The electronic device in accordance with this invention can be used for an application selected from a group comprising of photovoltaic devices, flat-panel displays, thermophotovoltaic devices, ferroelectric devices, light emitting diode devices, computer hard disc drive devices, magnetoresistance based devices, photoluminescence based devices, non-volatile memory devices, dielectric devices, thermoelectric devices and quantum dot laser devices.

In a preferred embodiment, the electronic device has an area larger than 50 in$^2$ In yet a further preferred embodiment, the electronic device has an area larger than 113 in$^2$.

In a preferred embodiment, the electronic device in accordance with this invention can comprise at least one device component selected from a group comprising of two terminal devices such as a diode; three terminal devices such as a transistor, thyristor or rectifier; and multi-terminal devices such as a microprocessor, random access memory, read-only-memory or a charge-coupled device.

BRIEF DESCRIPTION OF THE DRAWINGS

A fuller understanding of the present invention and the features and benefits thereof will be accomplished upon review of the following detailed description together with the accompanying drawings, in which:

FIG. 1 shows an idealized schematic representation in cross-section of various embodiments of multilayer structures in accordance with the present invention. FIG. 1A shows the most basic structure, namely a flexible metal, alloy or ceramic substrate with a triaxially textured semiconductor layer(s) on top of it. FIG. 1B shows a flexible metal, alloy or ceramic substrate with a triaxially textured semiconductor layer(s) on top of it and with an intervening set of buffer layers. FIG. 1C shows a flexible metal, alloy or ceramic substrate with a triaxially textured semiconductor layer(s) on top of it and with an intervening set of buffer layers. In addition it includes a set of semiconductor "template" layer(s) between the device layer(s) and the buffer layer(s). FIG. 1D shows the same structure as in FIG. 1C with an additional layer comprised of a transparent conductor layer, contact layer, anti-reflection coating layer or a protective layer.

FIG. 2A shows a device comprising a flexible metal/alloy substrate, single or multiple buffers layers on the substrate, a triaxially textured p-type and n-type semiconductor layer on the top buffer layer, a transparent conductor layer, an antireflection coating and metal grid lines. FIG. 2B shows the same device as in FIG. 2A with an additional semiconductor layer between the buffer layer(s) and the triaxially textured semiconductor layer forming the p-n junction. One use of such a device as shown in FIG. 2 is for solar power generation.

FIG. 5A shows a tri-junction cell of GaInP (Eg=eV)/GaAs (1.4 eV)/Ge (0.7 eV); FIG. 5B shows a tri-junction cell of GaInP (Eg=eV)/GaInAs (1.25 eV)/Ge (0.7 eV); and FIG. 5C shows a four-junction cell of GaInP (Eg=eV)/GaAs (1.4 eV)/GaInAs (1.25 eV)/Ge (0.7 eV).

FIG. 6A shows a device comprising a flexible metal/alloy substrate, single or multiple buffers layers on the substrate, a triaxially textured bottom cell comprising a pn junction, a tunnel junction, a top cell comprising a pn junction, a transparent conductor layer, an antireflection coating and metal grid lines. FIG. 6B shows the same device as in FIG. 6A with an additional semiconductor layer between the buffer layer(s) and the triaxially textured bottom cell. One use of devices shown in FIG. 6 is for solar power generation.

FIG. 7A shows a device comprising a flexible metal/alloy substrate, single or multiple buffers layers on the substrate, a triaxially textured bottom cell comprising a pn junction, a tunnel junction, a middle cell comprising a pn junction, a tunnel junction, a top cell comprising a pn junction, a transparent conductor layer, an antireflection coating and metal grid lines. FIG. 7B shows the same device as in FIG. 7A with a additional semiconductor layer between the buffer layer(s) and the triaxially textured bottom cell. One use of devices shown in FIG. 7 is for solar power generation.

FIG. 11 shows an idealized schematic representation in cross-section of electronic devices containing a triaxially textured semiconductor device in accordance with the present invention. FIG. 11A shows a device comprising a flexible, traixially textured metal/alloy substrate, single or multiple triaxially textured buffer layers on the substrate, and triaxially textured, single or multiple semiconductor layer(s) on the top buffer layer. FIG. 11B shows the same device as in FIG. 11A with a additional triaxially textured semiconductor template layer between the buffer layer(s) and the triaxially textured semiconductor device layer. One use of such a device is for solar power generation.

FIG. 14 shows an idealized schematic representation in cross-section of a triaxially textured, flexible NiW alloy with a triaxially textured Si semiconductor layer on top of it with an intervening triaxially textured buffer layer of TiN.

FIG. 17 shows an orientation image micrograph created from acquiring and indexing electron backscatter Kikuchi diffraction patterns on a hexagonal grid at a spacing of 0.6 microns. A given grey scale shading in FIG. 17A indicates an interconnected region with misorientations less than 2 degrees. A given grey scale shading in FIG. 17B indicates an interconnected region with misorientations less than 3 degrees. Clearly, the silicon layer is representative of a large single crystal with some mosaic. The mound like particles seen in the image are there because the film was grown using the pulsed laser ablation technique in which such particulate like features are known to form. Growing a film using electron beam evaporation or chemical vapor deposition would result in nice smooth films.

FIG. 23 shows pole figures from a single crystal Ni sheet fabricated using a solid state, secondary recrystallization process. FIG. 18A shows a (200) pole figure and FIG. 18B shows a (111) pole figure.

DETAILED DESCRIPTION OF THE PREFERRED EMBODIMENTS

Figure 2:
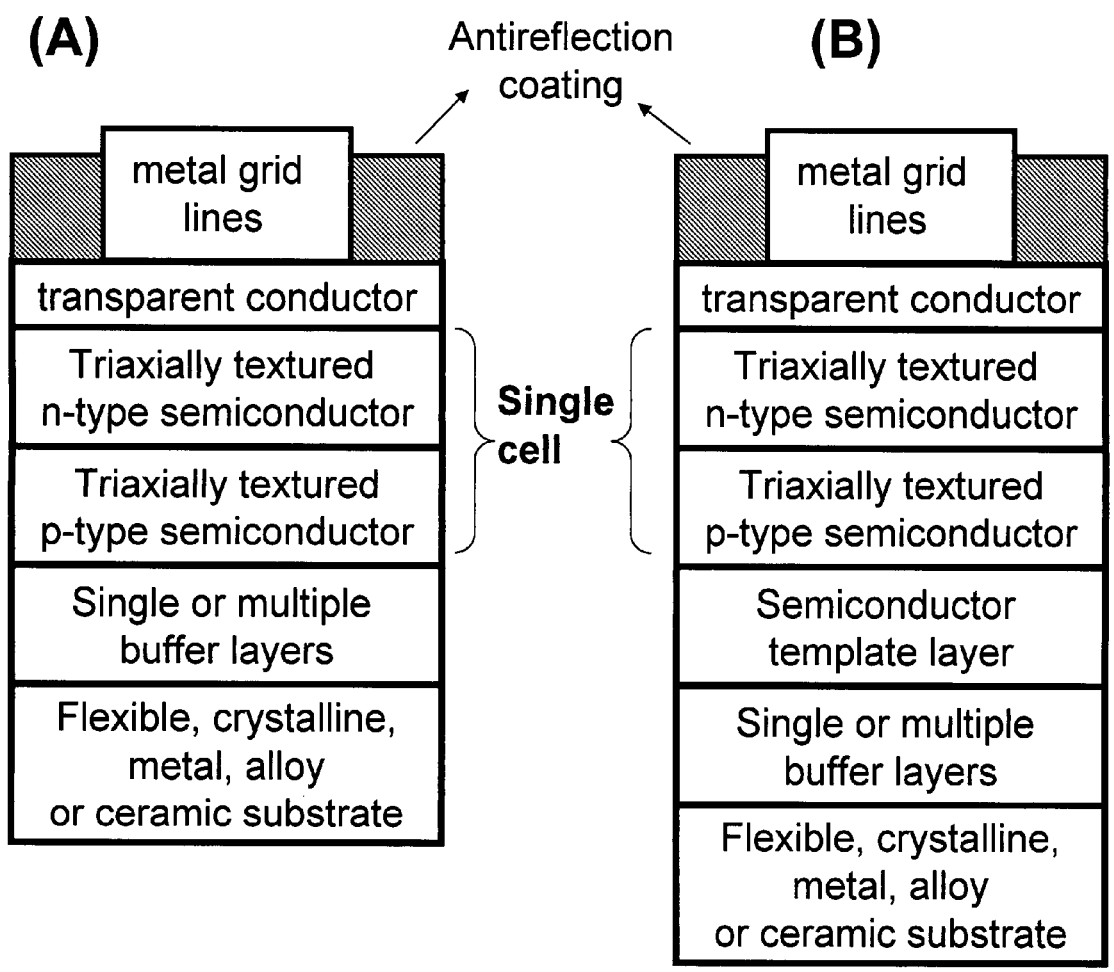
FIG. 2 shows an idealized schematic representation in cross-section of an electronic device containing a triaxially textured pn junction in accordance with the present invention, with the pn junction being parallel to the substrate surface.

The invention relates to fabrication of large-area, flexible, triaxially textured, single-crystal or single-crystal-like, semiconductor based electronic devices which have high performance. The invention also enables continuous fabrication of such devices using reel-to-reel deposition. The invention also results in high performance devices because of the single crystal-like nature of the device at a low cost.

FIG. 1 shows some of the embodiments of the present invention. FIG. 1A shows a triaxially textured semiconductor device comprising of single or multiple layers on a flexible, crystalline, metal/alloy or ceramic substrate. FIG. 1B shows a flexible, crystalline metal, alloy or ceramic substrate with a triaxially textured semiconductor layer(s) on top of it with an intervening set of buffer layers. FIG. 1C shows a flexible metal, alloy or ceramic substrate with a triaxially textured semiconductor layer(s) on top of it and with an intervening set of buffer layers. In addition, it includes a set of semiconductor "template" layer(s) between the device layer(s) and the buffer layer(s). FIG. 1D shows the same structure as in FIG. 1C with an additional layer comprised of a transparent conductor layer, contact layer, anti-reflection coating layer or a protective layer. A triaxially textured semiconductor is useful for achieving high device performance. Buffer layer(s) are used to provide a chemical barrier and a structural template on which to grow the semiconductor layer(s). A chemical barrier is needed to prevent diffusion of elements from the metal/alloy or ceramic substrate to the semiconductor layer(s). A structural template is needed to obtain a good lattice match to the semiconductor layer being grown so as to minimize the defect density in the semiconductor layer. In some cases as shown in FIG. 1C, an additional semiconductor template layer is used before the semiconductor device layer(s). This semiconductor template layer again is used to provide for a better lattice match to semiconductor device layer. Another function of the top buffer layer is to provide a stable, smooth and dense surface to grow the semiconductor layer on. Buffer layer surfaces can be conditioned chemically or thermally. In chemical conditioning, one or more chemical species in gaseous or solution form is used modify the surface of the buffer layer. In thermal conditioning, the buffer layer is heated to an elevated temperature wherein surface reconstruction takes place. Surface conditioning can also be done using standard and well developed techniques of plasma etching and reactive ion etching (see for example, Silicon processing for the VSLI Era, Vol. 1, eds. S. Wolf and R. N. Tanber, pages 539-574, Lattice Press, Sunset Park, Calif., 1986).

The said triaxially textured semiconductor device layer in FIG. 1 can be selected from a group comprising of but not limited to those based on indirect bandgap semiconductors such as Si, Ge, GaP; direct bandgap semiconductors such as CdTe, CuInGaSe$_2$ (CIGS), GaAs, AlGaAs, GaInP and AlInP; multiband semiconductors such as II-O-VI materials like $Zn_{1-y}Mn_yO_xTe_{1-x}$ and III-N-V multiband semiconductors such as $GaN_xAs_{1-x-y}P_y$, and combinations thereof. This includes minor dopants of other materials in the semiconductor layers for obtaining the required n-type or p-type semiconducting properties. Definitions of a "direct", "indirect" and "multiband" semiconductor can be obtained from literature in the field or from the online free encyclopedia, Wikipedia (http://en.wikipedia.org/wiki/Main Page). For example, as stated in Wikipedia, the definition of direct and indirect bandgap semiconductor is—"In semiconductor physics, a direct bandgap means that the minimum of the conduction band lies directly above the maximum of the valence band in momentum space. In a direct bandgap semiconductor, electrons at the conduction-band minimum can combine directly with holes at the valence band maximum, while conserving momentum. The energy of the recombination across the bandgap will be emitted in the form of a photon of light. This is radiative recombination, also called spontaneous emission. In indirect bandgap semiconductors such as crystalline silicon, the momentum of the conduction band minimum and valence band maximum are not the same, so a direct transition across the bandgap does not conserve momentum and is forbidden. Recombination occurs with the mediation of a third body, such as a phonon or a crystallographic defect, which allows for conservation of momentum. These recombinations will often release the bandgap energy as phonons, instead of photons, and thus do not emit light. As such, light emission from indirect semiconductors is very inefficient and weak. There are new techniques to improve the light emission by indirect semiconductors. See indirect bandgap for an explanation. The prime example of a direct bandgap semiconductor is gallium arsenide—a material commonly used in laser diodes."

In a preferred embodiment of the present invention, the said semiconductor layer in the article is a compound semiconductor composed of elements from two or more different groups of the Periodic Table, including compounds of Group III (B, Al, Ga, In) and Group V (N, P, As, Sb, Bi) for the compounds AlN, AlP, AlAs, GaN, GaP, GaAs, InP, InAs, InSb, AlInGaP, AlGaAs, InGaN etc, and the compounds of Group II (Zn, Cd, Hg) and Group VI (O, S, Se, Te) such as ZnS, ZnSe, ZnTe, CdTe, HgTe, CdHgTe etc. In addition to binary compounds of the above, ternary (three elements, e.g. InGaAs) and quaternary (four elements, e.g. InGaAsP) compounds are also are included.

The semiconductor layer in the article can also comprise an elemental semiconductor or alloys of elements within the same group such as SiC and SiGe or a compound semiconductor comprising elements of group IB, IIIA and VIA of the periodic table such as alloys of copper, indium, gallium, aluminium, selenium and sulfur.

Shown in FIG. 2 is an idealized schematic representation in cross-section of a semiconductor-based electronic device containing a triaxially textured p-n junction in accordance with the present invention, with the p-n junction being parallel to the substrate surface. FIG. 2A shows a device comprising a flexible metal/alloy substrate, single or multiple buffers layers on the substrate, a triaxially textured p-type and n-type semiconductor layer on the top buffer layer, a transparent conductor layer, an antireflection coating and metal grid lines. FIG. 2B shows the same device as in FIG. 2A with an additional semiconductor layer between the buffer layer(s) and the triaxially textured semiconductor layer forming the p-n junction. A p-type semiconductor is obtained by carrying out a process of doping in which certain types of atoms are incorporated into the semiconductor in order to increase the number of free (in this case positive) charge carriers. When the doping material is added, it takes away (accepts) weakly-bound outer electrons from the semiconductor atoms. This type of doping agent is also known as acceptor material and the semiconductor atoms that have lost an electron are known as holes. The purpose of p-type doping is to create an abundance of holes. In the case of silicon, a trivalent atom (typically from group IIIA of the periodic table, such as boron or aluminium) is substituted into the crystal lattice. The result is that one electron is missing from one of the four covalent bonds normal for the silicon lattice. Thus the dopant atom can accept an electron from a neighboring atoms' covalent bond to complete the fourth bond. Such dopants are called acceptors. The dopant atom accepts an electron, causing the loss of half of one bond from the neighboring atom and resulting in the formation of a "hole". Each hole is associated with a nearby negative-charged dopant ion, and the semiconductor remains electrically neutral as a whole. However, once each hole has wandered away into the lattice, one proton in the atom at the hole's location will be "exposed" and no longer cancelled by an electron. For this reason a hole behaves as a quantity of positive charge. When a sufficiently large number of acceptor atoms are added, the holes greatly outnumber the thermally-excited electrons. Thus, the holes are the majority carriers, while electrons are the minority carriers in p-type materials. An n-type semiconductor is obtained by carrying out a process of doping, that is, by adding an impurity of valence-five elements to a valence-four semiconductor in order to increase the number of free (in this case negative) charge carriers. When the doping material is added, it gives away (donates) weakly-bound outer electrons to the semiconductor atoms. This type of doping agent is also known as donor material since it gives away some of its electrons. The purpose of n-type doping is to produce an abundance of mobile or "carrier" electrons in the material. To help understand how n-type doping is accomplished, consider the case of silicon (Si). Si atoms have four valence electrons, each of which is covalently bonded with one of four adjacent Si atoms. If an atom with five valence electrons, such as phosphorus (P), arsenic (As), or antimony (Sb), is incorporated into the crystal lattice in place of a Si atom, then that atom will have four covalent bonds and one unbonded electron. This extra electron is only weakly bound to the atom and can easily be excited into the conduction band. At normal temperatures, virtually all such electrons are excited into the conduction band. Since excitation of these electrons does not result in the formation of a hole, the number of electrons in such a material far exceeds the number of holes. In this case the electrons are the majority carriers and the holes are the minority carriers. Because the five-electron atoms have an extra electron to "donate", they are called donor atoms. Hence, p and n-type semiconductors can be fabricated by appropriate doping of elements. The device in FIG. 2 is referred to a p-n junction, with the junction being parallel to the substrate surface. The p-type and n-type layer combination is referred to as a single cell. This device shown in FIG. 2 is only a simple example of a possible device structure that can be fabricated based on this invention. A possible use of such a device is as a solar cell or a photovoltaic cell to convert sunlight into electrical energy. The order of which layer, namely the p-type or n-type can be changed. Also, in some cases it may be desirable to include layers of p+ in which the excess mobile hole concentration is very large. Similarly an n+ layer can be deposited. Such layers can also be used for making electrical contacts in devices.

The basic structures shown in FIG. 1 and FIG. 2 can be used to fabricate a whole range of electronic devices such as photovoltaic devices, flat-panel displays, thermophotovoltaic devices, ferroelectric devices, light emitting diode devices, computer hard disc drive devices, magnetoresistance based devices, photoluminescence based devices, non-volatile memory devices, dielectric devices, thermoelectric devices and quantum dot laser devices. Electronic devices that can readily be envisioned are two terminal devices such as a diode; three terminal devices such as a transistor, thyristor or rectifier; and multi-terminal devices such as a microprocessor, random access memory, read-only-memory or a charge-coupled device.

Figure 3:
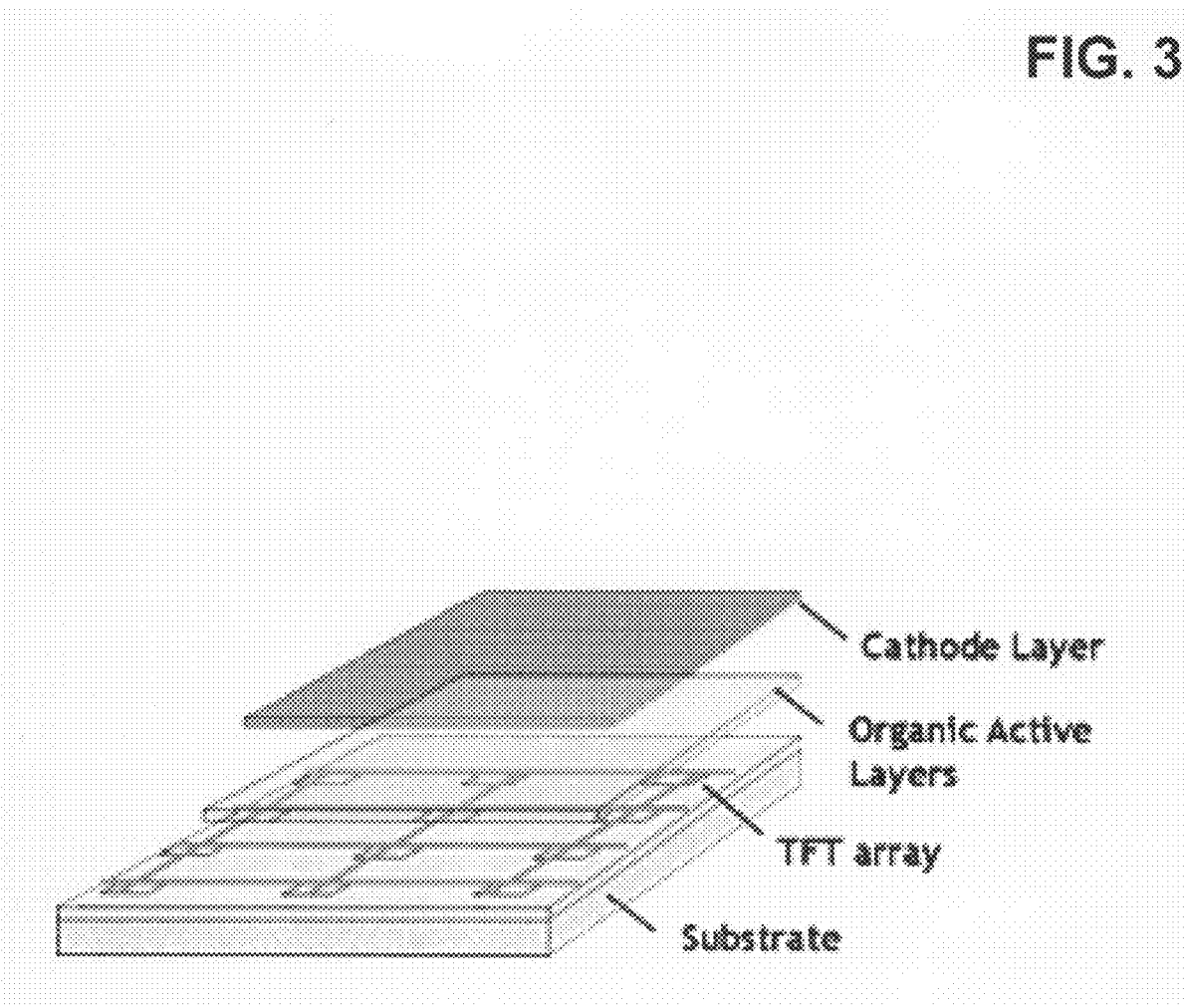
FIG. 3 shows an idealized schematic of a simple active-matrix, organic light emitting diode (AMOLED).

Some of most exciting applications are in photovoltaics or solar cells and for displays such as thin-film transistors. In both of these areas, there is has been a drive to use thin films on metal substrates. However, in these cases, the semiconductor is either amorphous or polycrystalline and hence with lower performance than obtained from a single crystal device of the same semiconductor. Mechanically flexible electronics have the potential to realize novel applications in which in which physical and mechanical restrictions do not permit the use of rigid substrates. Furthermore, with flexible substrates, roll-to-roll manufacturing can be envisioned similar to a printing press with a throughput significantly higher than normal discrete semiconductor device manufacturing. In some of the applications alluded to above, relatively relaxed device requirements exists compared to other semiconductor devices. The integration of triaxially textured, single-crystal-like semiconductor layers and devices on large-area, flexible, metal, alloy and ceramic substrates, can revolutionize these applications in these areas. Single-crystal devices on flexible substrates will result in photovoltaic cells with high efficiencies and thin-film transistors (TFT) with higher electron mobilities. There is significant interest in the fabrication of TFT circuits on flexible metal or alloy foils. See for example—Thesis S. D. and Wagner S., "Amorphous silicon thin-film transistors on steel foil substrates," IEEE Electron Device Lett., vol. 17, no. 12, pp. 578-580, December 1996; Serikawa T. and Omata F., "High-mobility poly-Si TFT's fabricated on flexible stainless steel substrates," IEEE Electron Device Lett., vol. 20, no. 11, pp. 574-576, November 1999; Afentakis T. and Hatalis M., "High performance polysilicon circuits on thin metal foils," Proc. SPIE, vol. 5004, pp. 122-126, 2003; Howell R. S., Stewart M., Karnik S. V., Saha S. K. and Hatalis M. K., IEEE Electron Device Left., vol. 21, no. 2, pp. 70-72, February 2000. In all four of these papers, the result is an oriented, polycrystalline or amorphous Si layer. In most cases wherein polycrystalline Si is used, it is a laser crystallized layer of Si. An amorphous layer of Si is first deposited on to the substrate followed by a crystallization step. This crystallization can also be done using infrared lamps which provide for a high heating rate. A similar process can be used to fabricate epitaxial silicon on the substrates disclosed in this invention. This process of first depositing a precursor film of amorphous Si followed by a subsequent crystallization step is referred to as an "ex-situ" process. Crystalline Si can also be directly deposited epitaxially on single crystal-like substrate at elevated temperatures. Triaxially textured, single-crystal devices on flexible metal, alloy and ceramic substrates will result in thin-film transistors (TFT) with higher electron mobilities than can be fabricated using unoriented silicon and hence truly have the potential for revolutionizing this application. Advanced flat panel displays including active matrix liquid crystal displays (LCD) have mainly used thick glass as the substrate which offers advantages of transparency and stability but is very fragile and heavy. The substrates suggested here will be rugged and light weight and because of the device layer being triaxially textured or single-crystal-like, will have a performance far superior to those possible on rigid glass substrates. Flat panel display applications are enormous and include computer monitors, televisions, large electronic billboards, cell phones, calculators and display screens on a whole set of consumer electronics. For portable displays active-matrix liquid crystal displays (AMLCDs) and active-matrix organic light emitting diode (AMOLED), using a low temperature processed polycrystalline Si on glass is being widely considered for large-scale applications. An active-matrix OLED (AMOLED) display consists of organic light emitting diode (OLED) pixels that have been deposited or integrated onto a thin film transistor (TFT) array to form a matrix of pixels that illuminate light upon electrical activation. In contrast to a passive-matrix OLED display, where electricity is distributed row by row, the active-matrix TFT backplane acts as an array of switches that control the amount of current flowing through each OLED pixel. The TFT array continuously controls the current that flows to the pixels, signaling to each pixel how brightly to shine. Typically, this continuous current flow is controlled by at least two TFTs at each pixel, one to start and stop the charging of a storage capacitor and the second to provide a voltage source at the level needed to create a constant current to the pixel. As a result, the AMOLED operates at all times (i.e., for the entire frame scan), avoiding the need for the very high currents required for passive matrix operation. Poly-Silicon backplane technology for fabricating the TFT array is the technology-of-choice for OLEDs today because it provides reasonable mobilities that meet OLED current drive requirements (see for example, Afentakis T., Hatalis M., Voutsas T. and Hartzell J., "Poly-silicon TFT AM-OLED on thin flexible metal substrates," Proc. SPIE, vol. 5004, pp. 187-191, 2003). Poly-Si technology also allows for the integration of the drive circuitry directly onto the substrate. There are many key challenges, however, to address: reducing threshold voltage non-uniformities of poly-Si, and demonstrating commercially-viable manufacturing yields. These issues can potentially be addressed using the devices of this invention wherein triaxially textured or single-crystal-like nature of the semiconductor device layer will reduce non-uniformities and increase yields, significantly increase mobilities and still be light weight because no glass is used. FIG. 3 shows a schematic of a simple AMOLED device. FIG. 3 when coupled with FIGS. 1 and 2, shows how an AMOLED based on this invention can be fabricated, wherein the TFT/Substrate array is fabricated using this invention.

An important application of the devices disclosed in this invention is in the area of photovoltaics. The devices shown schematically in FIG. 2 can be used as a photovoltaic or solar cell. These devices will be large-area and flexible and can be put on roofs. Flexible solar cells are also useful for space applications since large arrays or spools of photovoltaic modules can be wrapped up and then unspooled in space.

Figure 4:
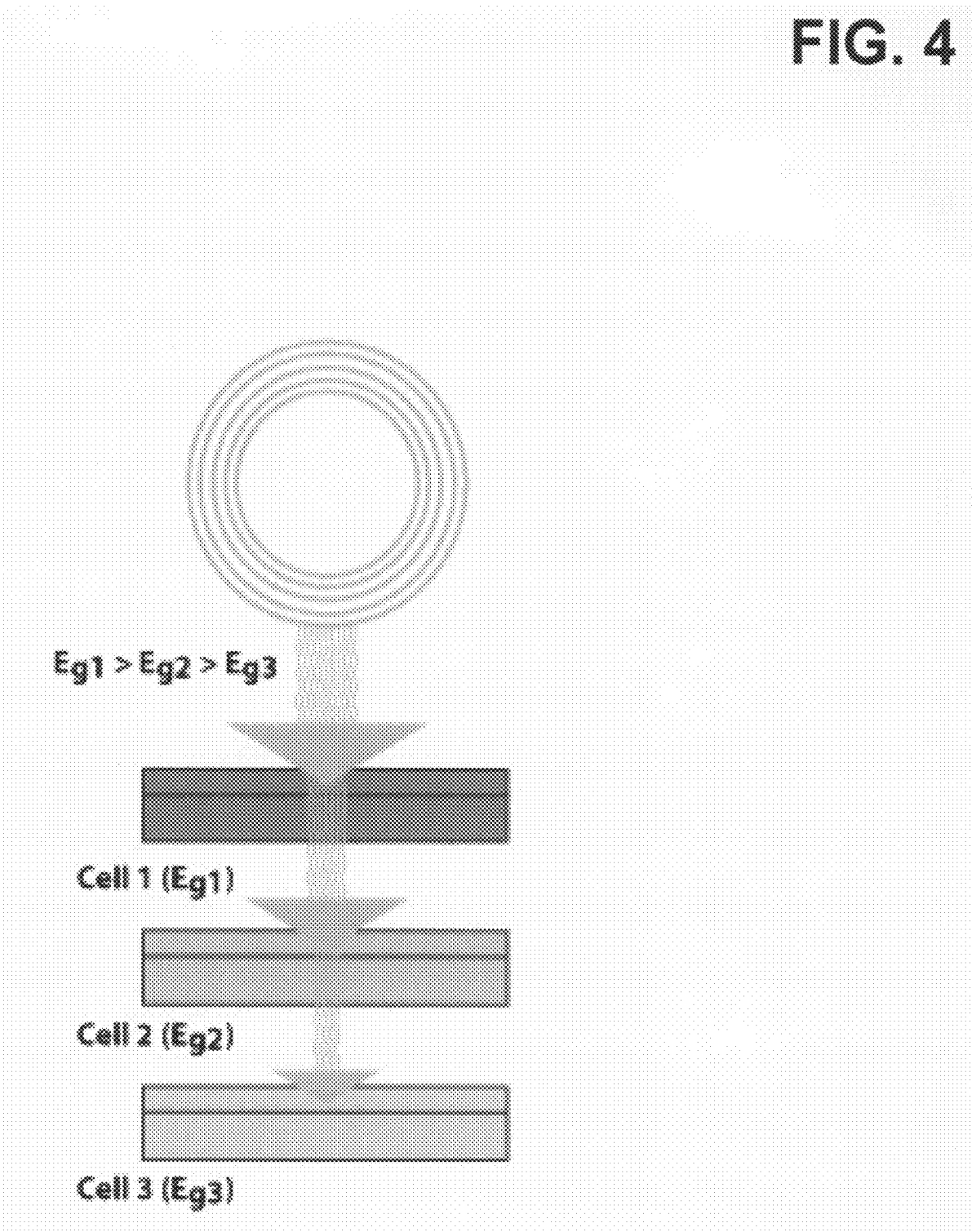
FIG. 4 shows an idealized schematic representation of a multijunction cell containing three cells in accordance with the present invention. In a typical multijunction cell, individual cells with different bandgaps are stacked on top of one another. The individual cells are stacked in such a way that sunlight falls first on the material having the largest bandgap. Photons not absorbed in the first cell are transmitted to the second cell, which then absorbs the higher-energy portion of the remaining solar radiation while remaining transparent to the lower-energy photons. These selective absorption processes continue through to the final cell, which has the smallest bandgap. In essence, a multijunction device is a stack of individual single-junction cells in descending order of bandgap ($E_g$). The top cell captures the high-energy photons and passes the rest of the photons on to be absorbed by lower-bandgap cells.

One way to make solar cells more efficient is to find a material that will capture energy from a larger portion of the spectrum of sunlight—from infrared to visible light to ultraviolet. Energy transfers from photons to a photovoltaic material when the material absorbs lightwaves that contain the same amount of energy as its bandgap. A bandgap is the energy ($E_g$) required to push an electron from a material's valence band to the conduction band where electrons are free to flow. FIG. 4 shows a schematic of a device containing three photovoltaic cells of different bandgaps. This structure, also called a cascade or tandem cell, can achieve a higher total conversion efficiency by capturing a larger portion of the solar spectrum. In the typical multijunction cell, individual cells with different bandgaps are stacked on top of one another. The individual cells are stacked in such a way that sunlight falls first on the material having the largest bandgap. Photons not absorbed in the first cell are transmitted to the second cell, which then absorbs the higher-energy portion of the remaining solar radiation while remaining transparent to the lower-energy photons. These selective absorption processes continue through to the final cell, which has the smallest bandgap. Such multijunction cells can result in very high efficiencies. Principals of multijunction cells can be obtained from prior art (Martin A. Green, Keith Emery, Klaus Büccher, David L. King, Sanekazu Igari, "Solar cell efficiency tables (version 11)," Progress in Photovoltaics: Research and Applications, Volume 6, Issue 1, Pages 35-42, 4 May 1999; Karam, N. H.; King, R. R.; Cavicchi, B. T.; Krut, D. D.; Ermer, J. H.; Haddad, M.; Li Cai; Joslin, D. E.; Takahashi, M.; Eldredge, J. W.; Nishikawa, W. T.; Lillington, D. R.; Keyes, B. M.; Ahrenkiel, R. K., "Development and characterization of high-efficiency Ga0.5In0.5P/GaAs/Ge dual- and triple-junction solar cells," Electron Devices, IEEE Transactions on, Vol. 46, No. 10, pp. 2116-2125, October 1999; H. Hou, K. Reinhardt, S. Kurtz, J. Gee, A. Allerman, B. Hammons, P. Chang, E. Jones, Novel InGaAsN pn junction for high-efficiency multiple-junction solar cells, The Second World Conference on PV Energy Conversion, 1998, pp. 3600-3603; D. Friedman, J. Geisz, S. Kurtz, J. Olson, 1-eV GaInNAs solar cells for ultra high efficiency multijunction devices, The Second World Conference on PV Energy Conversion, 1998, pp. 3-7; T. V. Torchynska and G. Polupan, "High efficiency solar cells for space applications," Superficies y Vacío 17(3), 21-25, septiembre de 2004; R. McConnell and M. Symko-Davies, "DOE High Performance Concentrator PV Project," International Conference on Solar Concentrators for the Generation of Electricity or Hydrogen, 1-5 May 2005, Scottsdale, Arizona, NREL/CD-520-38172).

Figure 5:
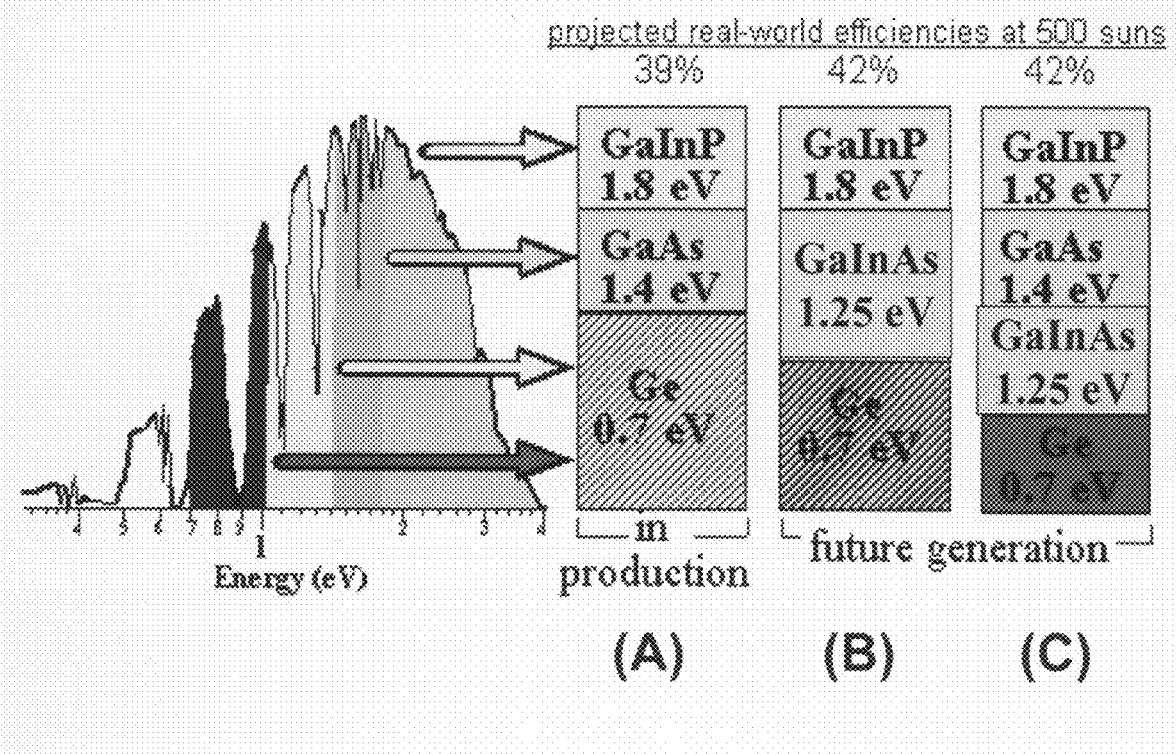
FIG. 5 shows the cross-section of some multijunction cells that have been reported in the literature. The schematic shows the portion of the sun's spectrum that they capture and the projected conversion efficiencies of these cells which are all close to 40%.
Figure 6:
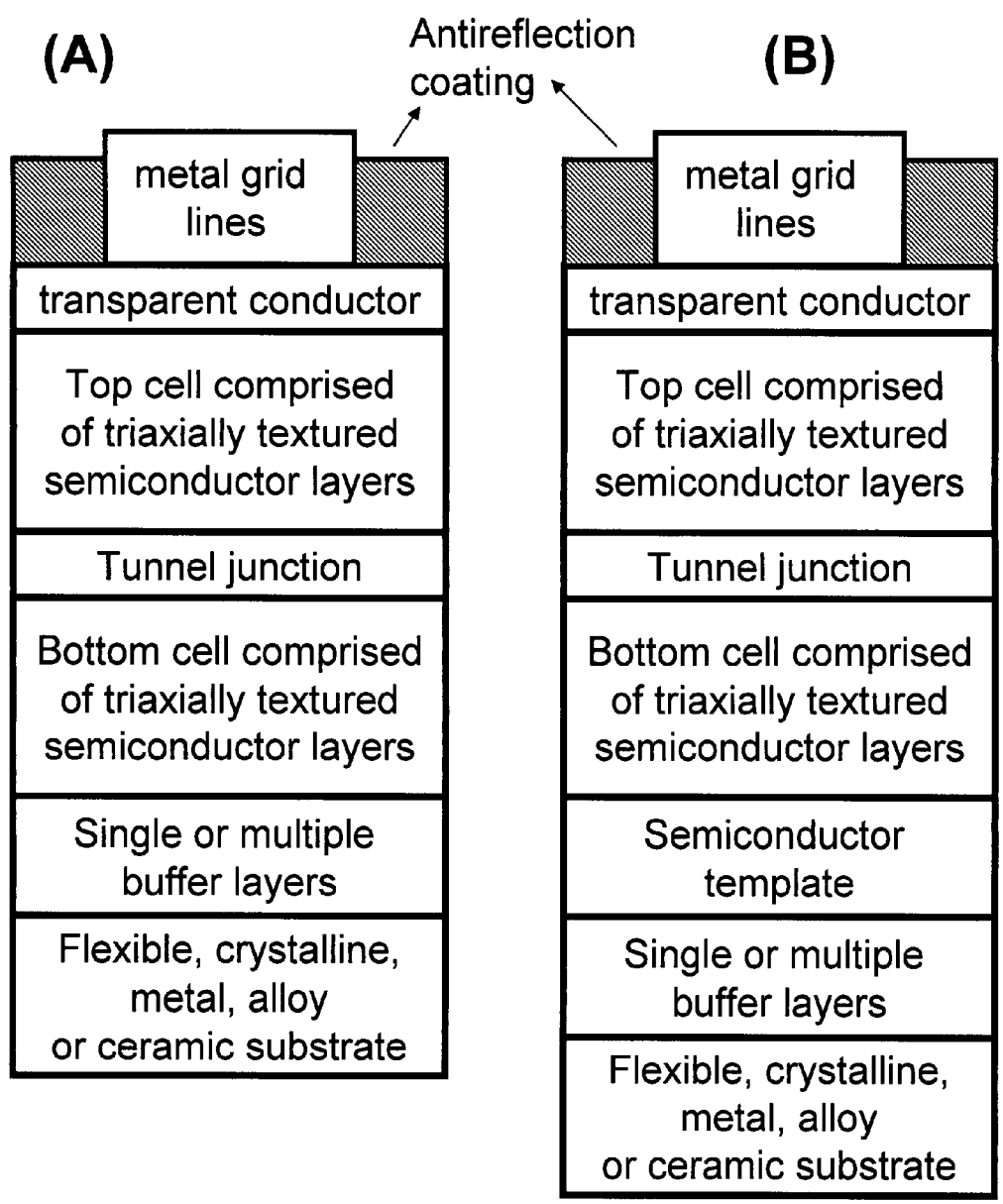
FIG. 6 shows an idealized schematic representation in cross-section of a multijunction electronic device containing two triaxially textured pn junctions in accordance with the present invention, with the pn junctions being parallel to the substrate surface.
Figure 7:
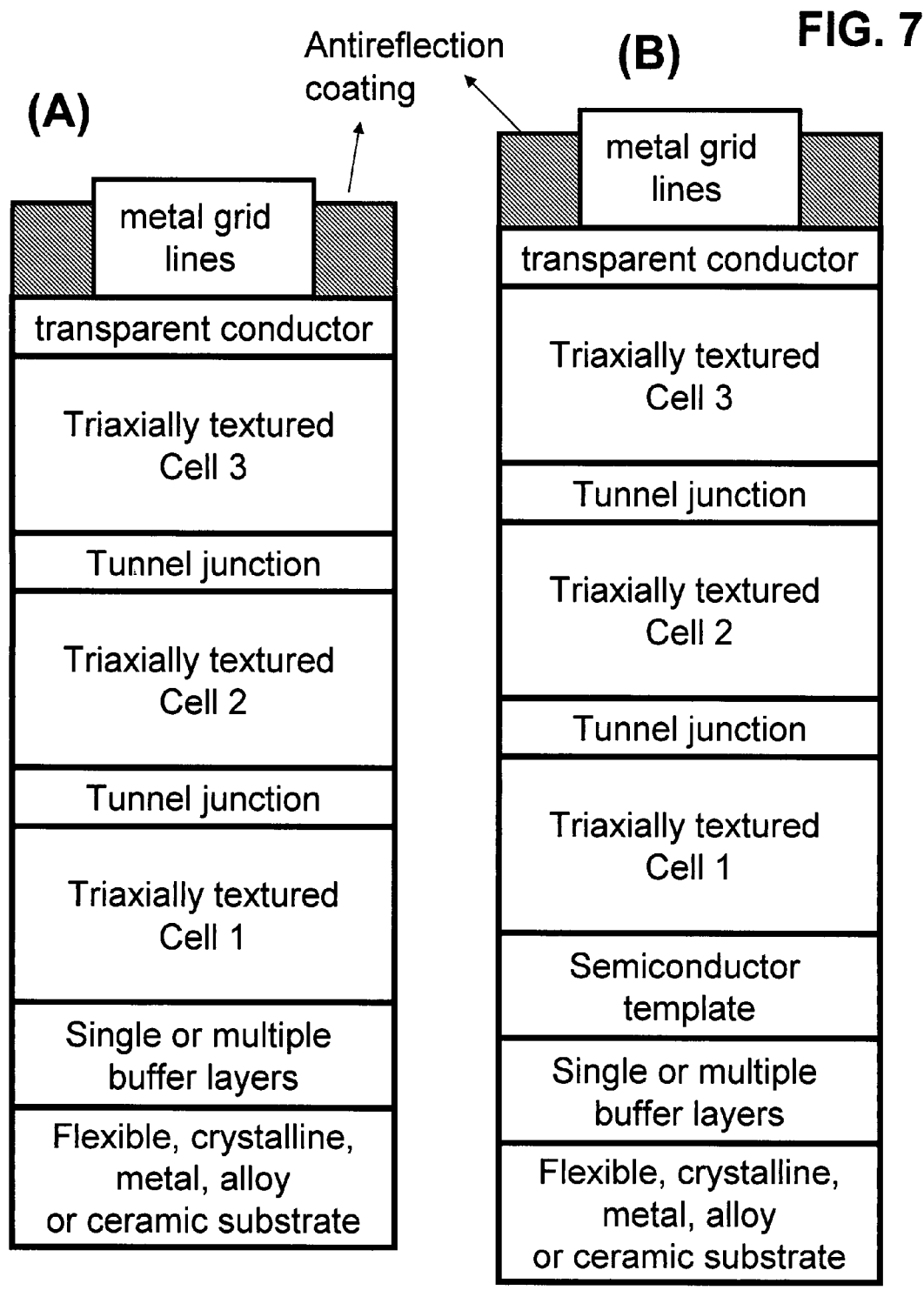
FIG. 7 shows an idealized schematic representation in cross-section of a multijunction electronic device containing three triaxially textured pn junctions in accordance with the present invention, with the pn junctions being parallel to the substrate surface.

Shown in FIG. 5 is the cross-section of some multijunction cells that have been reported in the literature. The schematic shows the portion of the sun's spectrum that they capture and the projected conversion efficiencies of these cells which are all close to 40%. FIG. 5A shows a tri-junction cell of GaInP (Eg=eV)/GaAs (1.4 eV)/Ge (0.7 eV); FIG. 5B shows a tri-junction cell of GaInP (Eg=eV)/GaInAs (1.25 eV)/Ge (0.7 eV); and FIG. 5C shows a four-junction cell of GaInP (Eg=eV)/GaAs (1.4 eV)/GaInAs (1.25 eV)/Ge (0.7 eV). Clearly the advantage of capturing a higher portion of sun's spectrum is a higher conversion efficiency. FIG. 6 shows an idealized schematic representation in cross-section of a multijunction electronic device containing two triaxially textured pn junctions in accordance with the present invention, with the pn junctions being parallel to the substrate surface. FIG. 6A shows a device comprising a flexible metal/alloy substrate, single or multiple buffers layers on the substrate, a triaxially textured bottom cell comprising a pn junction, a tunnel junction, a top cell comprising a pn junction, a transparent conductor layer, an antireflection coating and metal grid lines. FIG. 6B shows the same device as in FIG. 6A with an additional semiconductor layer between the buffer layer(s) and the triaxially textured bottom cell. One use of devices shown in FIG. 6 is for solar power generation. FIG. 7 shows an idealized schematic representation in cross-section of a multijunction electronic device containing three triaxially textured pn junctions in accordance with the present invention, with the pn junctions being parallel to the substrate surface. FIG. 7A shows a device comprising a flexible metal/alloy substrate, single or multiple buffers layers on the substrate, a triaxially textured bottom cell comprising a pn junction, a tunnel junction, a middle cell comprising a pn junction, a tunnel junction, a top cell comprising a pn junction, a transparent conductor layer, an antireflection coating and metal grid lines. FIG. 7B shows the same device as in FIG. 7A with a additional semiconductor layer between the buffer layer(s) and the triaxially textured bottom cell. One use of devices shown in FIG. 7 is for solar power generation. FIGS. 5-7 teach how a multijunction cell can be fabricated wherein the active device layer is triaxially textured.

Figure 8:
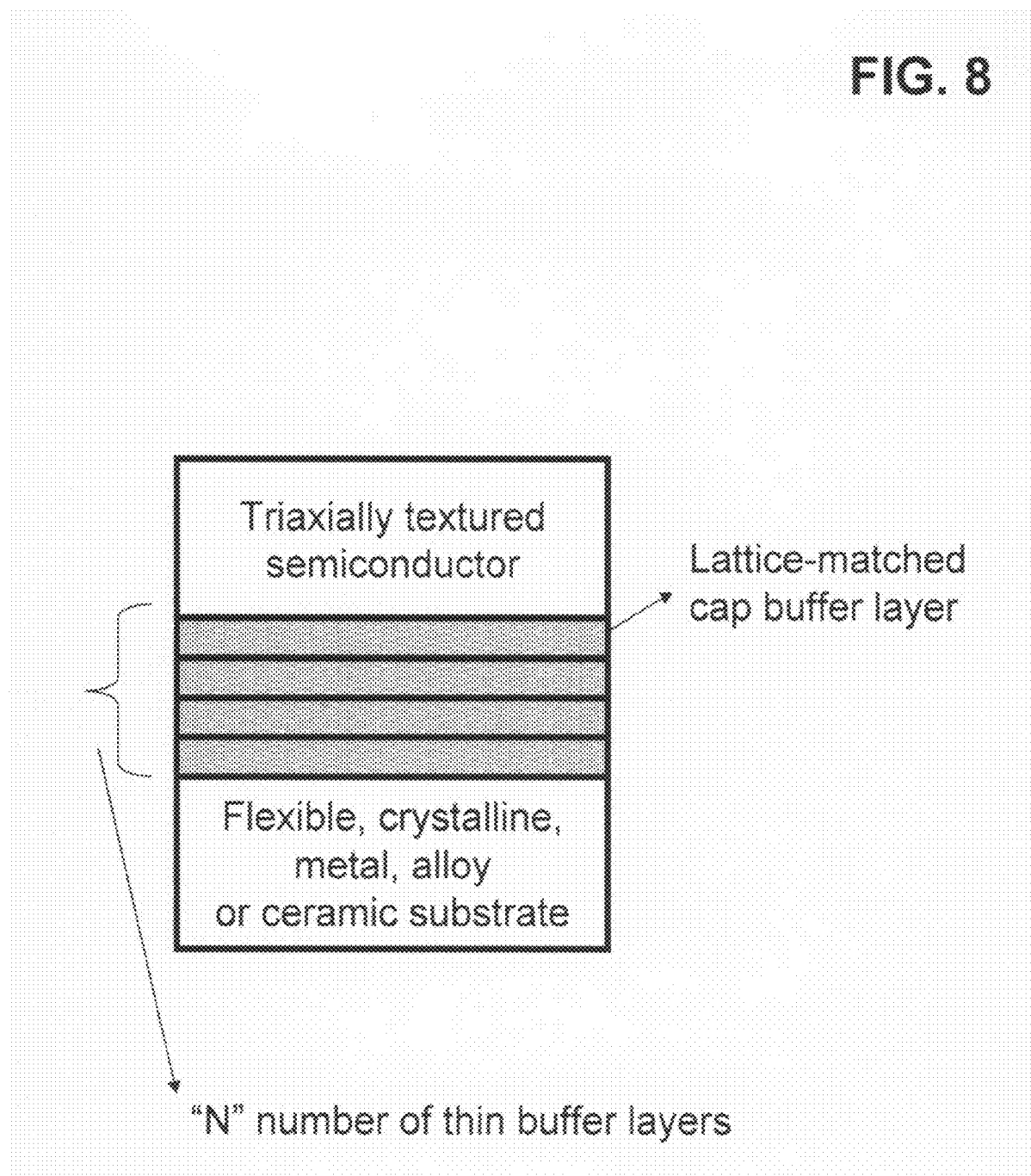
FIG. 8 shows an idealized schematic representation in cross-section of an electronic device as depicted in FIG. 1-7, with the buffer layer stack comprised of a number of thin buffer layers so as to provide a good lattice match to the semiconductor layer grown on the top buffer template. This referred to as a "graded buffer approach" for providing a good lattice match to the semiconductor to minimize defect density in the semiconductor layer.

Performance of electronic device is dependent on defect density. One way to reduce defect density in the active semiconductor layer is to reduce its lattice mismatch to the top buffer layer. This can be done using a "graded buffer layer" approach. FIG. 8 shows an idealized schematic representation in cross-section of an electronic device as depicted in FIG. 1-7, with the buffer layer stack comprised of a number of thin buffer layers with gradually differing lattice parameters so as to provide a good lattice match to the semiconductor layer grown on the top buffer template. This is referred to as a "graded buffer approach" for providing a good lattice match to the semiconductor to minimize defect density in the semiconductor layer. The number of layers of graded lattice parameter buffers that need to be deposited depends on lattice mismatch between the semiconductor and the substrate.

Figure 9:
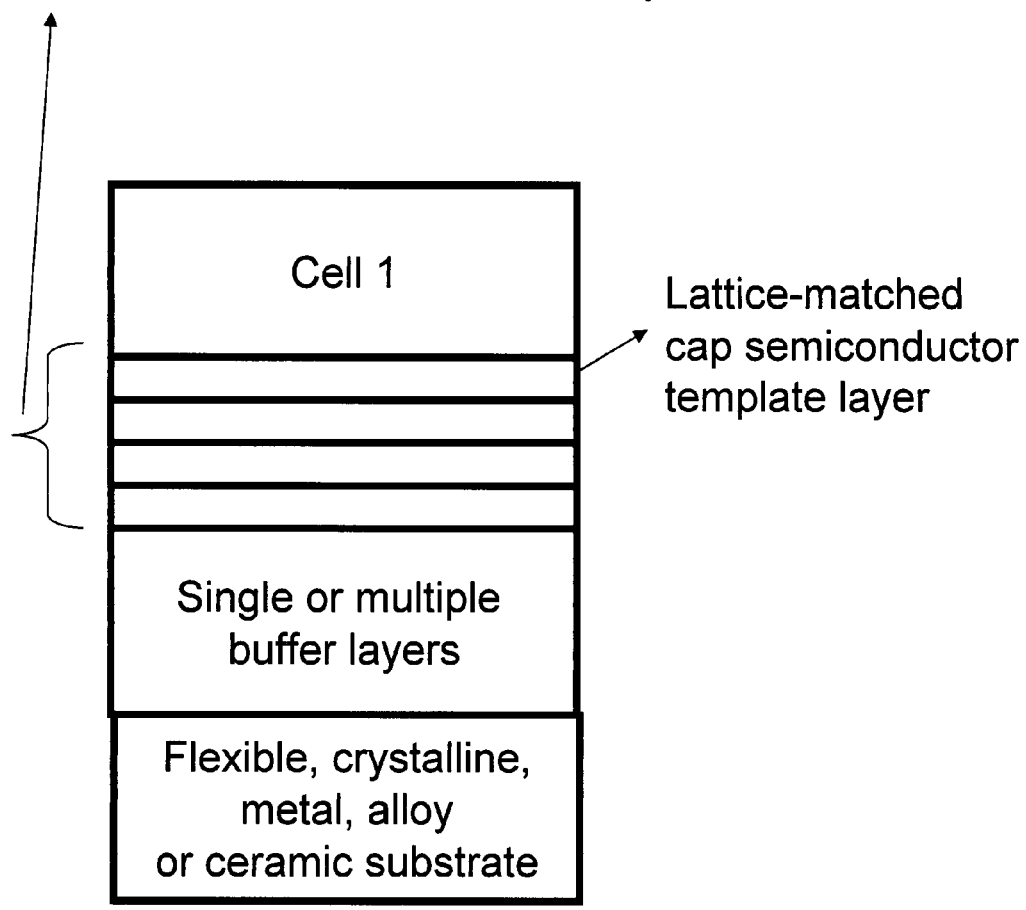
FIG. 9 shows an idealized schematic representation in cross-section of an electronic device as depicted in FIG. 1-8, with the semiconductor template layer comprised of a number of thin layers so as to provide a good lattice match to the semiconductor device layer or the first cell comprising the pn junction and grown on top of the semiconductor template layer. This is referred to as a "graded semiconductor approach" for providing a good lattice match to the semiconductor device layer to further minimize defect density in the semiconductor device layer.
Figure 10:
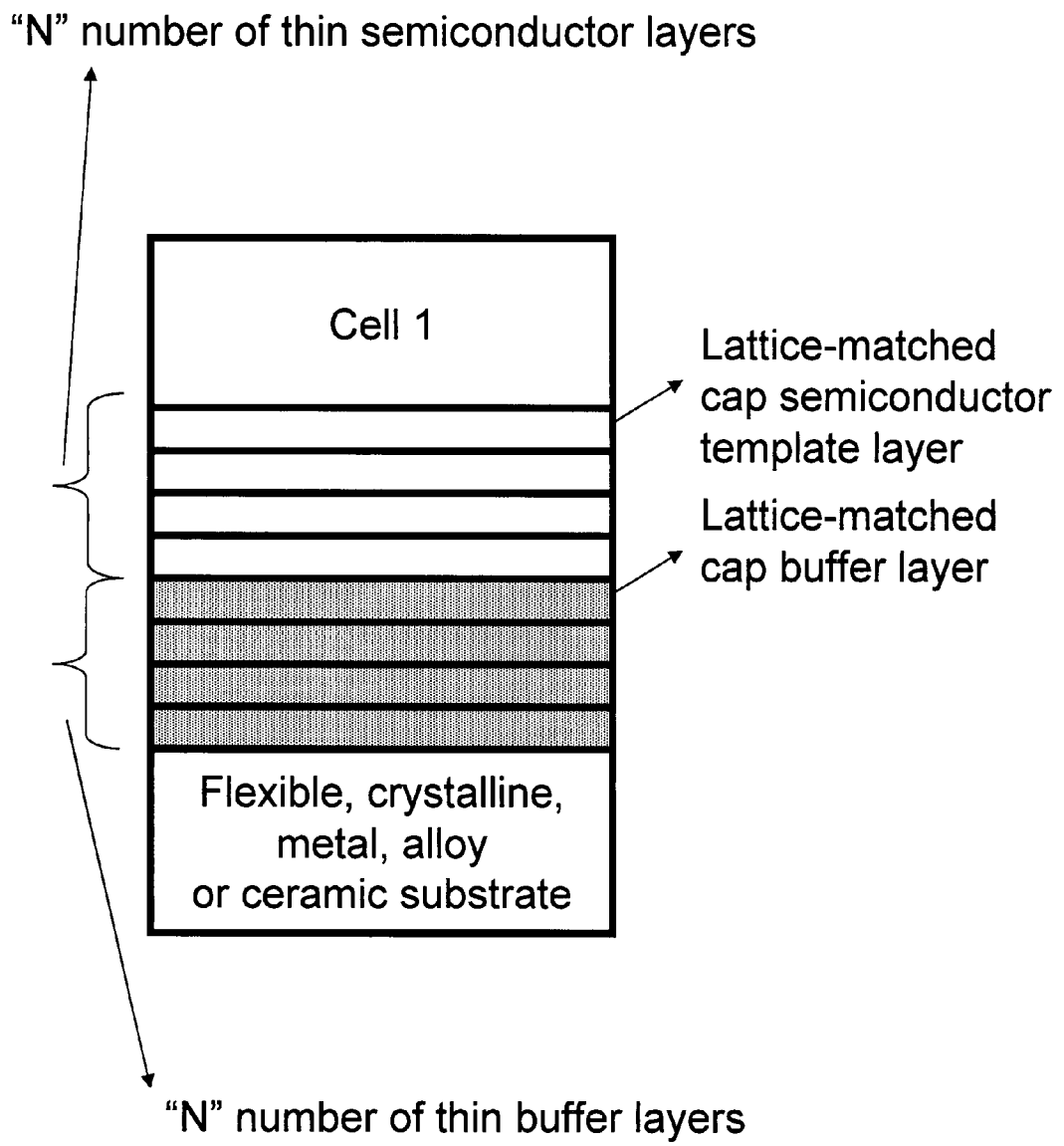
FIG. 10 shows an idealized schematic representation in cross-section of an electronic device as depicted in FIG. 1-9, with the buffer layer stack comprised of a number of thin buffer layers so as to provide a good lattice match to the semiconductor template layer grown on the top buffer template. In addition, the semiconductor template layer is comprised of a number of thin layers so as to provide a good lattice match to the semiconductor device layer or the first cell comprising the pn junction and grown on top of the semiconductor template layer. This referred to as a combination of the "graded buffer approach" and the "graded semiconductor approach" for providing a good lattice match to the semiconductor device layer to minimize defect density in the this layer.

In some cases, it is more desirable to use a "graded semiconductor template" approach to reduce the defect density in the active semiconductor layer comprising the electronic device. FIG. 9 shows an idealized schematic representation in cross-section of an electronic device as depicted in FIG. 1-8, with the semiconductor template layer comprised of a number of thin layers with gradually differing lattice parameters, so as to provide a good lattice match to the semiconductor device layer or the first cell comprising the pn junction and grown on top of the semiconductor template layer. This is referred to as a "graded semiconductor approach" for providing a good lattice match to the semiconductor device layer to further minimize defect density in the semiconductor device layer. In the final case, one can envision a combination of the "graded buffer layer" and the "graded semiconductor template" approach. FIG. 10 shows an idealized schematic representation in cross-section of an electronic device as depicted in FIG. 1-9, with the buffer layer stack comprised of a number of thin buffer layers so as to provide a good lattice match to the semiconductor template layer grown on the top buffer template. In addition, the semiconductor template layer is comprised of a number of thin layers so as to provide a good lattice match to the semiconductor device layer or the first cell comprising the pn junction and grown on top of the semiconductor template layer. This referred to as a combination of the "graded buffer approach" and the "graded semiconductor approach" for providing a good lattice match to the semiconductor device layer to minimize defect density in the this layer.

Figure 12:
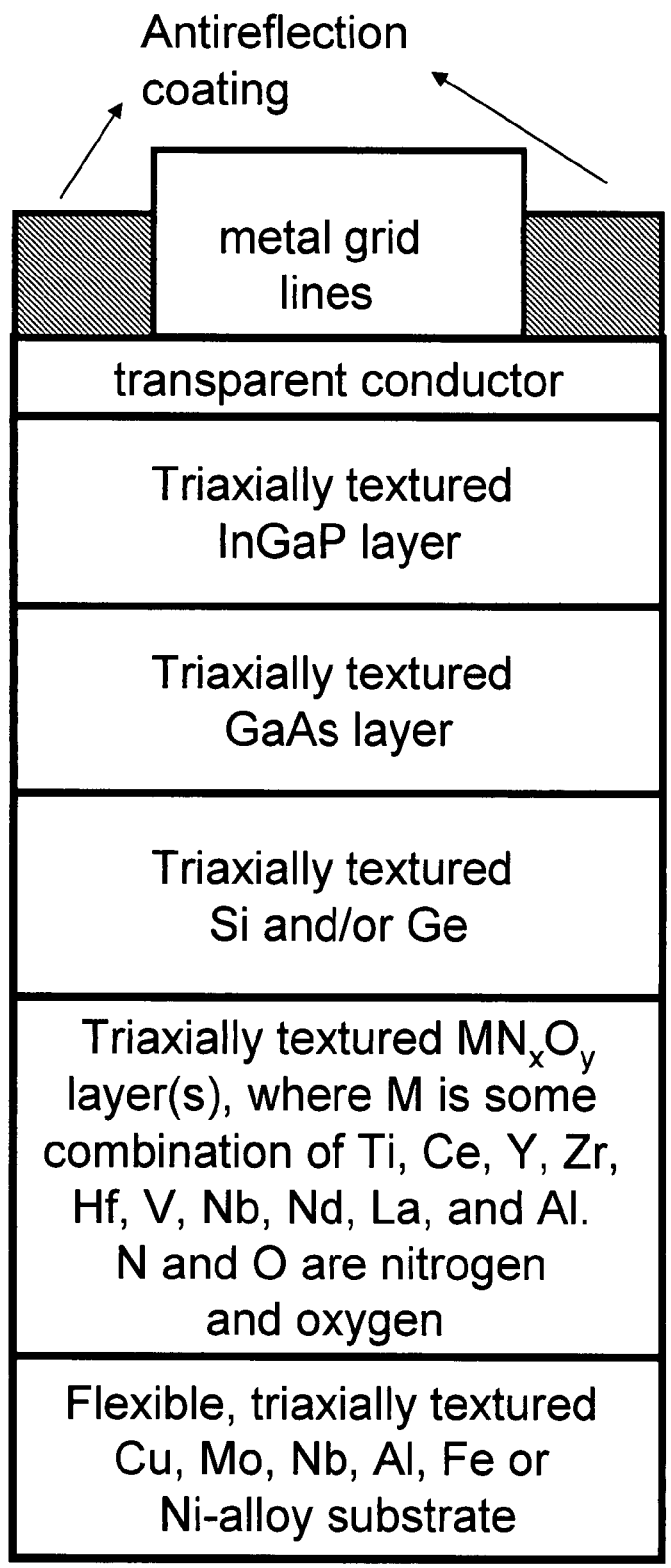
FIG. 12 shows an idealized schematic representation in cross-section of an electronic device containing a triaxially textured semiconductor device in accordance with the present invention. The device comprises a flexible, triaxially textured metal/alloy substrate; triaxially textured $MN_xO_y$ layer(s), where M is some combination of Ti, Ce, Y, Zr, Hf, V, Nb, Nd, La, and Al. N and O are nitrogen and oxygen; a triaxially textured layer of Si and/or Ge; a triaxially textured GaAS layer; a triaxially textured InGaP layer; a transparent conductor layer, and optional antireflection coating and metal grid lines. The representation forms the general basis of a device. One can envisage additional semiconductor layers or junctions and/or buffer layers in this multilayered stack. One use of such a device is for solar power generation.
Figure 13:
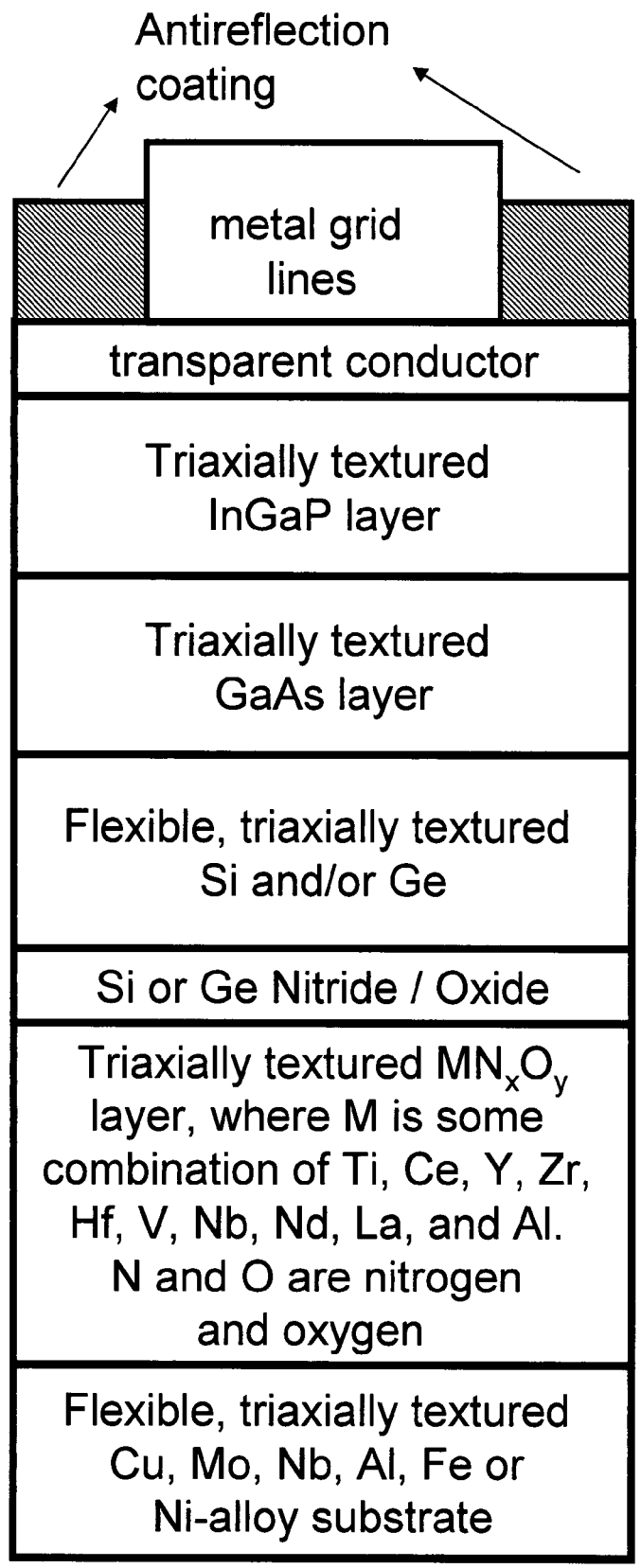
FIG. 13 shows an idealized schematic representation in cross-section of an electronic device containing a triaxially textured semiconductor device in accordance with the present invention. The device comprises a flexible, triaxially textured metal/alloy substrate; triaxially textured $MN_xO_y$ layer(s), where M is some combination of Ti, Ce, Y, Zr, Hf, V, Nb, Nd, La, and Al. N and O are nitrogen and oxygen; a Si or GE nitride, oxide or oxynitride layer; a triaxially textured layer of Si and/or Ge; a triaxially textured GaAS layer; a triaxially textured InGaP layer; a transparent conductor layer, and optional antireflection coating and metal grid lines. The representation forms the general basis of a device. One can envisage additional semiconductor layers or junctions and/or buffer layers in this multilayered stack. One use of such a device is for solar power generation.

FIG. 11 show some more embodiments of the present invention which are a special case of FIG. 1-2 and 6-10. Shown in FIG. 11 is an idealized schematic representation in cross-section of electronic devices containing a triaxially textured device in accordance with the present invention. FIG. 11A shows a device comprising a flexible, traixially textured metal/alloy substrate, single or multiple triaxially textured buffer layers on the substrate, and triaxially textured, single or multiple semiconductor layer(s) on the top buffer layer. FIG. 11B shows the same device as in FIG. 11A with a additional triaxially textured semiconductor template layer between the buffer layer(s) and the triaxially textured semiconductor device layer. Shown in FIG. 12 is an idealized schematic representation in cross-section of an electronic device containing a triaxially textured, multijunction semiconductor device in accordance with the present invention which is a combination of the device presented in FIG. 11 and FIG. 6-7. The device comprises a flexible, triaxially textured metal/alloy substrate; triaxially textured $MN_xO_y$ layer(s), where M is some combination of Ti, Ce, Y, Zr, Hf, V, Nb, Nd, La, and Al. N and O are nitrogen and oxygen; a triaxially textured layer of Si and/or Ge; a triaxially textured GaAS layer; a triaxially textured InGaP layer; a transparent conductor layer, and optional antireflection coating and metal grid lines. The representation forms the general basis of a device. One can envisage additional semiconductor layers or junctions and/or buffer layers in this multilayered stack. One use of such a device is for solar power generation. FIG. 13 shows an idealized schematic representation in cross-section of an electronic device containing a triaxially textured, multijunction semiconductor device in accordance with the present invention. The device comprises a flexible, triaxially textured metal/alloy substrate; triaxially textured $MN_xO_y$ layer(s), where M is some combination of Ti, Ce, Y, Zr, Hf, V, Nb, Nd, La, and Al. N and O are nitrogen and oxygen; a Si or Ge nitride, oxide or oxynitride layer; a triaxially textured layer of Si and/or Ge; a triaxially textured GaAS layer; a triaxially textured InGaP layer; a transparent conductor layer, and optional antireflection coating and metal grid lines. The representation forms the general basis of a device. One can envisage additional semiconductor layers or junctions and/or buffer layers in this multilayered stack. The difference between the devices depicted in FIGS. 12 and 13 is the presence of a Si or Ge nitride or oxide layer between the triaxially textured buffer below this layer and the triaxially textured semiconductor above this layer.

EXAMPLE 1

Shown in FIG. 14 is an idealized schematic representation in cross-section of a triaxially textured, flexible NiW alloy with a triaxially textured Si semiconductor layer on top of it with an intervening triaxially textured buffer layer of TiN.

Figure 15:
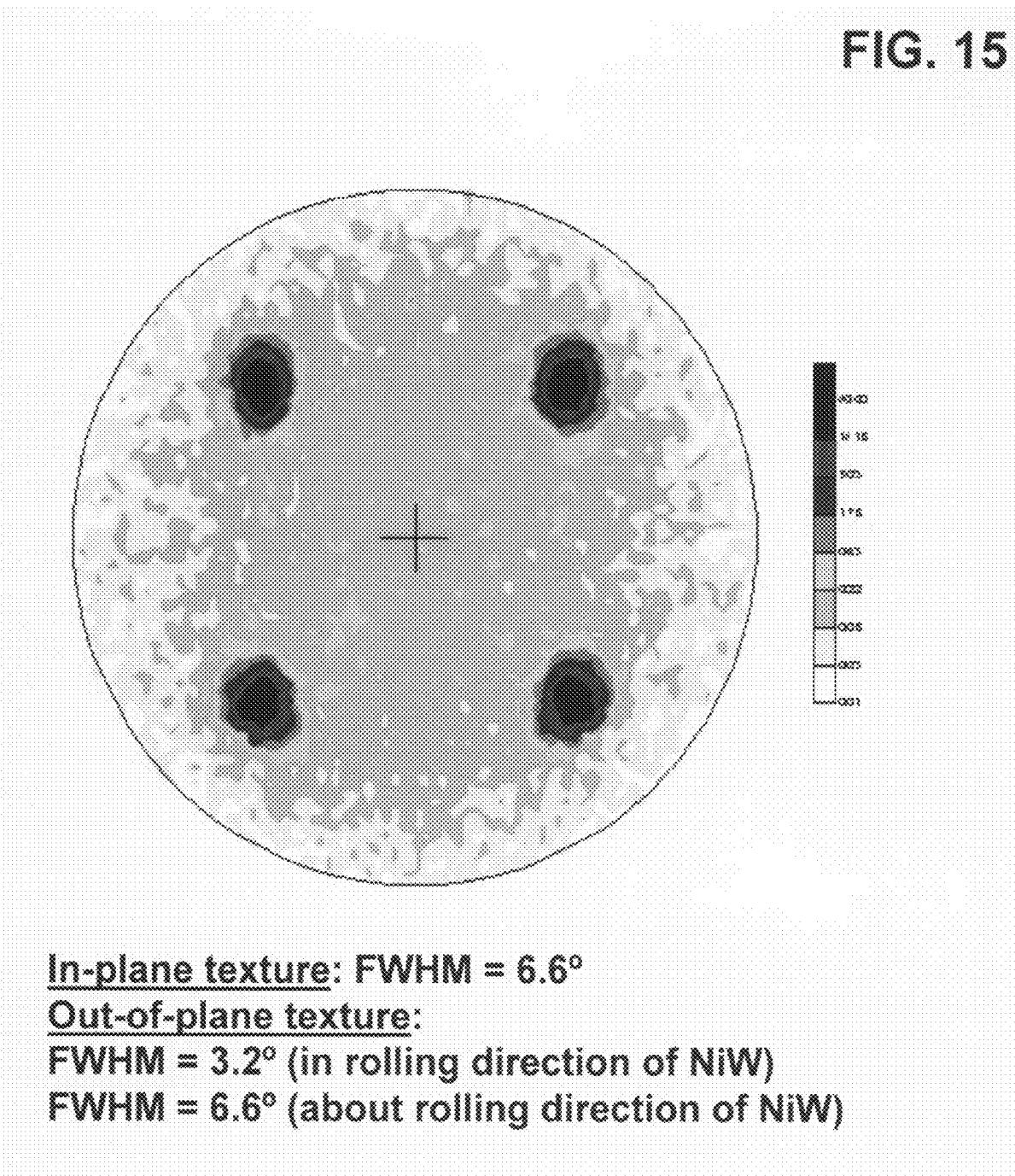
FIG. 15 shows a (111) X-ray pole figure of a sample of TiN grown epitaxially on triaxially textured Ni-3at % W substrate. Only four crystallographically equivalent peaks are seen implying a strong {100}<100> orientation. The full-width-half-maximum (FWHM) of the in-plane texture measured using the (111) phi-scan and the out-of-plane texture as measured by the (200) omega-scan using X-ray diffraction are also indicated on the figure.
Figure 16:
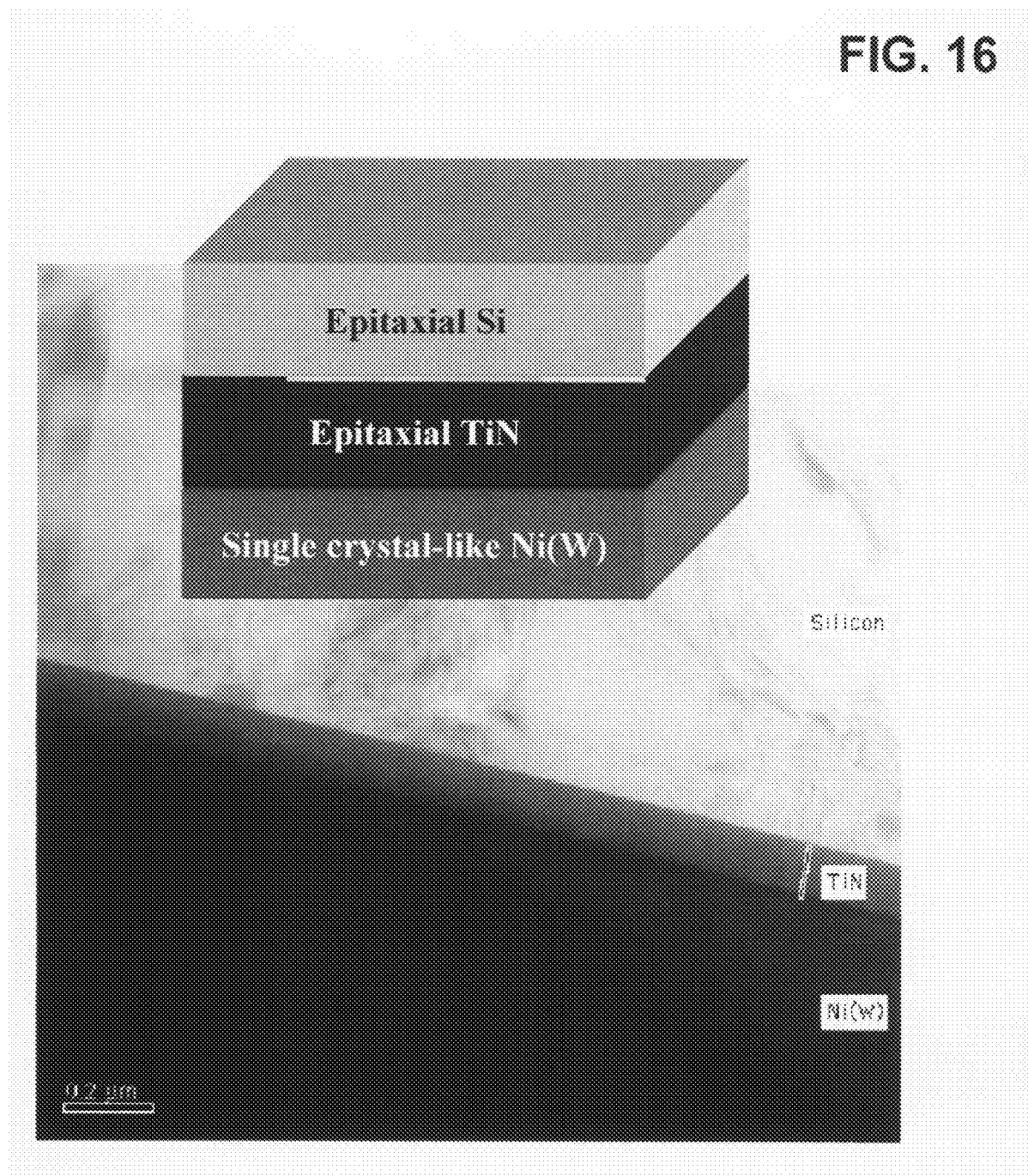
FIG. 16 shows a low-magnification TEM cross-section of a sample of Ni-3 at % W/TiN/Si. All three layers can clearly be distinguished in the micrograph.
Figure 18:
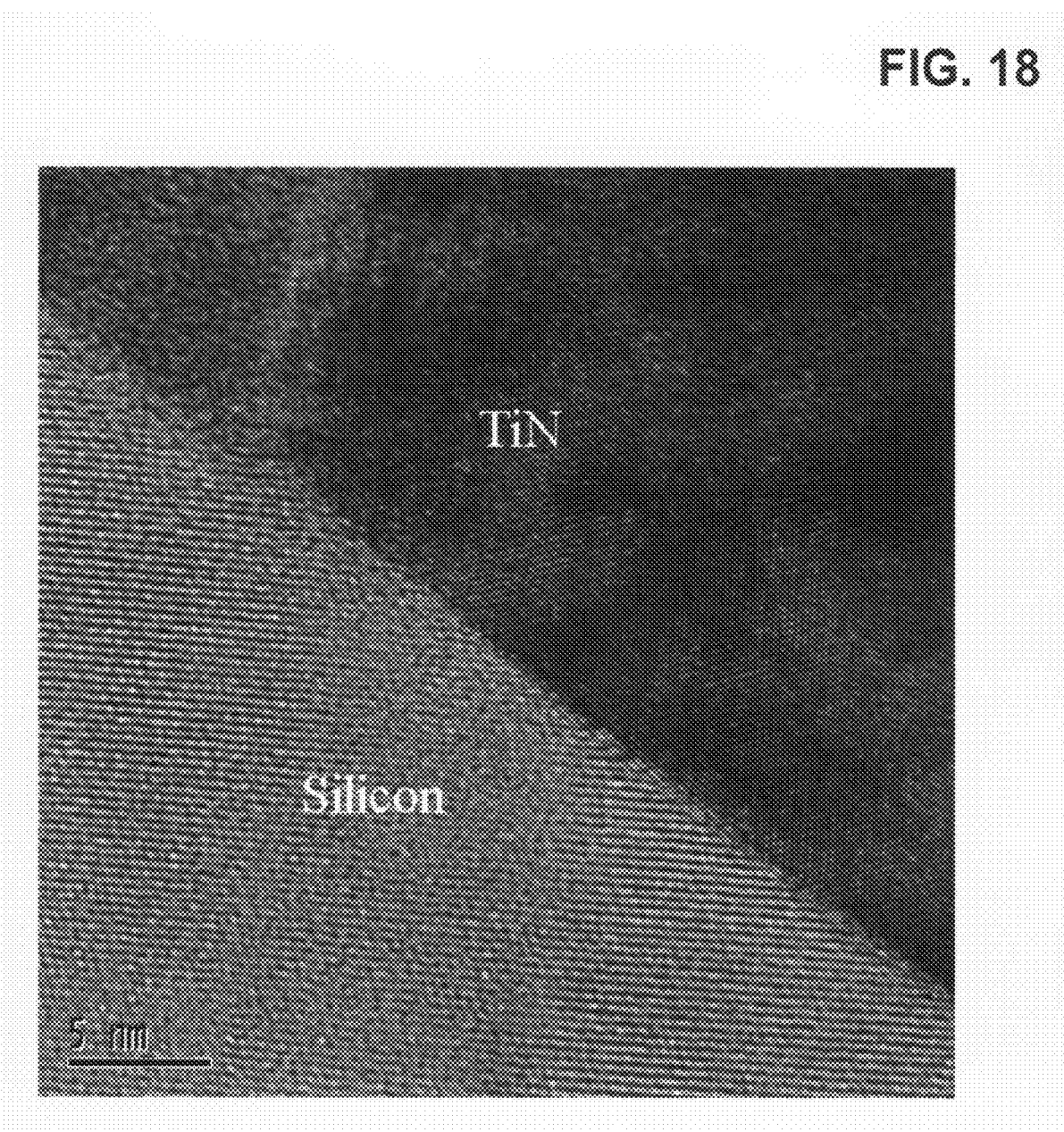
FIG. 18 shows a high resolution image of the Si/TiN interface showing epitaxial growth.
Figure 19:
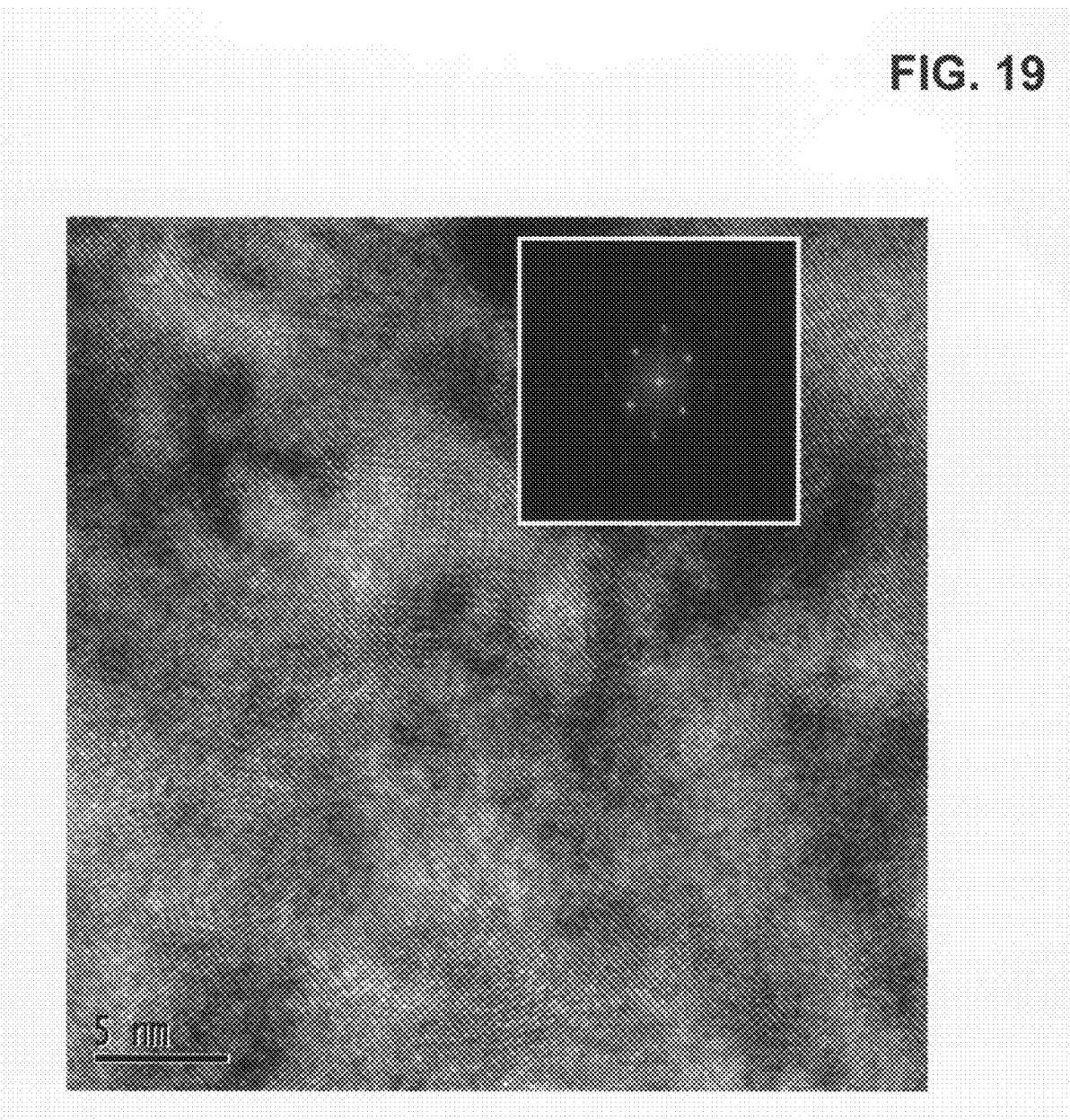
FIG. 19 shows a plan view, high-resolution, transmission electron micrograph of the epitaxial silicon layer along <100>. The inset shows a fast Fourier transform (FFT) pattern of the image.
Figure 20:
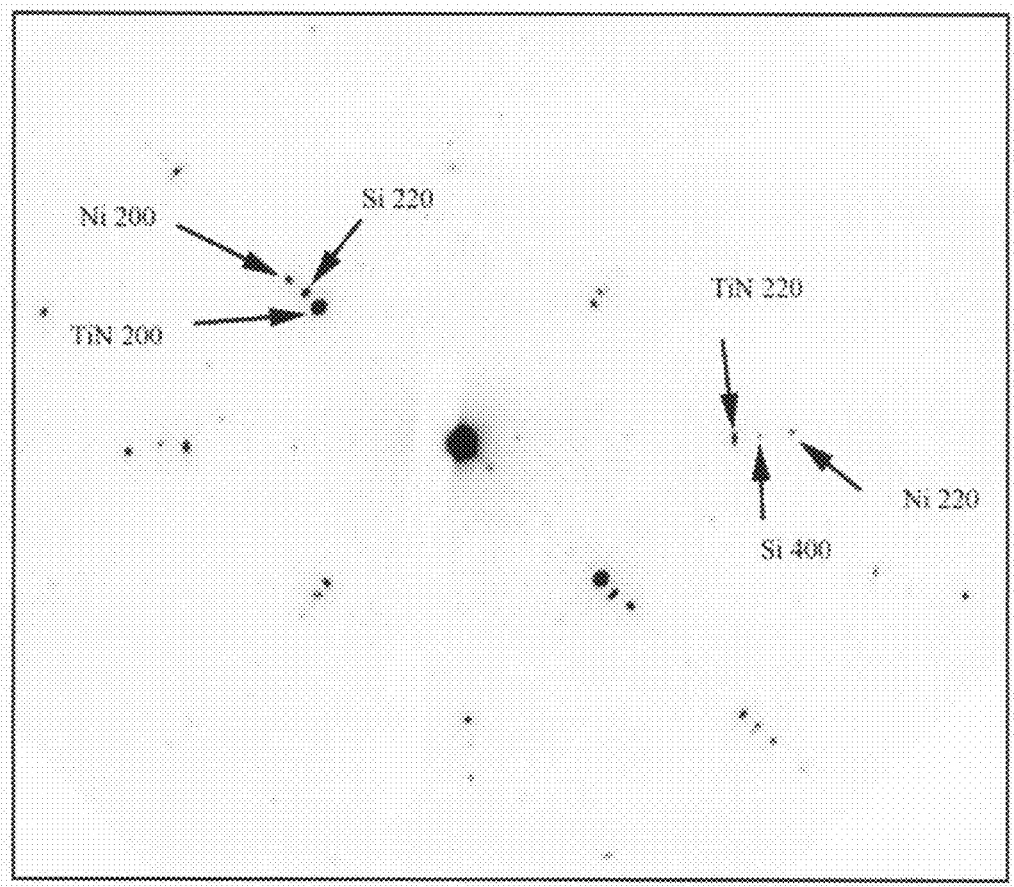
FIG. 20 shows a selected area diffraction pattern from the <100> zone axis of a plan view of transmission electron microscopy specimen of Si/TiN/NiW, showing epitaxial alignment of Si{220}, TiN{200} and Ni{200} diffraction spots.
Figure 21:
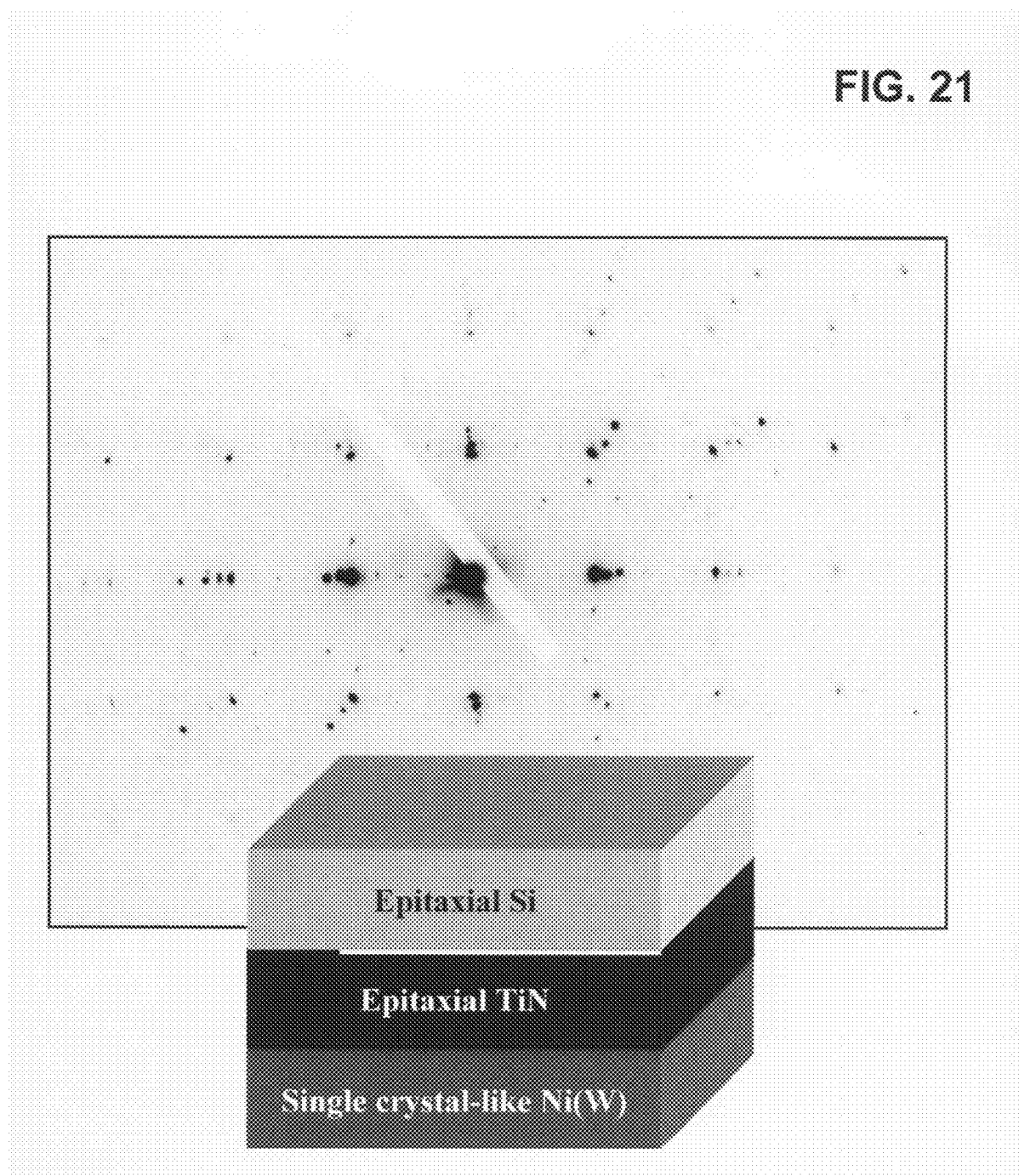
FIG. 21 also shows a selected area diffraction pattern from the <100> zone axis of a plan view of transmission electron microscopy specimen of Si/TiN/NiW, showing epitaxial alignment of Si{220}, TiN{200} and Ni{200} diffraction spots. In this case the region from where the diffraction pattern was obtained is larger.

This device is consistent with the devices depicted in FIG. 12. Biaxially textured Ni-3at % W was prepared by successive rolling of a powder metallurgy derived alloy coil from about 120 mils to a foil of about 2 mils or 50 microns in thickness. As-rolled crystallographic texture of the foil or tape was the standard Cu-type rolling texture of heavily deformed FCC metals. After the tape was degreased and dried, it was loaded into a reel-to-reel high vacuum ($10^{-8}$ Torr) chamber, which contained a radio frequency induction heated furnace. The tape was pulled through the hot zone of the furnace at a rate that heated each part to 1250° C. for twenty minutes with a partial pressure of hydrogen sulfide gas of ~$3\times10^{-7}$ Torr in order to form a sulfur c(2×2) superstructure on the surface of the tape. After the high temperature anneal, the NiW tape is completely cube textured and has a sharp texture corresponding to the orientation, {100}<100>, and also has a surface reconstruction corresponding to a c(2× 2) sulfur superstructure. Both the TiN and Si layers were then epitaxially deposited on the NiW tape. The TiN was grown using a stoichiometric hot pressed TiN target. These films were deposited via pulsed laser ablation at 700° C. with a laser energy of about 2-3 J/cm$^2$ with a base pressure of $3\times10^{-8}$ Torr for 15 minutes and at a repetition rate of 10 Hz. FIG. 15 shows a typical (111) X-ray pole figure of a sample of TiN grown epitaxially on triaxially textured Ni-3at % W substrate. Only four crystallographically equivalent peaks are seen implying a strong {100}<100> orientation. The full-width-half-maximum (FWHM) of the in-plane texture measured using the (111) phi-scan and the out-of-plane texture as measured by the (200) omega-scan using X-ray diffraction are also indicated on the figure. The in-plane texture FWHM is typically around 6.6° and the out-of-plane FWHM is 3.2° for rocking along the rolling direction of the substrate and 6.6° for rocking about the rolling direction. The "true" FWHM of the phi-scan after accounting for the width of the omega scans is about ~5°. Silicon films were then deposited on the TiN layer with a base vacuum of ~$10^{-7}$ Torr using KrF ($\lambda$=248 nm, $\tau$=25 ns) pulsed excimer laser with energy density 5-7 J-cm$^{-2}$. Initially during the Si deposition, for the first 2 minutes, the ablation rate was 2 Hz and the substrate temperature was in the range of 650-700° C. Subsequent to this, the temperature for growth was lowered to the temperature range of 520-550° C. and Si growth was performed for 15 minutes, at a repetition rate of 10 Hz. FIG. 16 shows a low-magnification TEM cross-section of a sample of Ni-3at % W/TiN/Si. All three layers can clearly be distinguished in the micrograph. The TiN layer was about 110 nm thick and the Si film was about 1 μm thick. FIG. 17 shows an orientation image micrograph created from acquiring and indexing electron backscatter Kikuchi diffraction patterns on a hexagonal grid at a spacing of 0.6 microns. A given grey scale shading in FIG. 17A indicates an interconnected region with misorientations less than 2 degrees. A given grey scale shading in FIG. 17B indicates an interconnected region with misorientations less than 3 degrees. Clearly, the silicon layer is representative of a large single crystal with some mosaic. The mound like particles seen in the image are there because the film was grown using the pulsed laser ablation technique in which such particulate like features are known to form. Growing a film using electron beam evaporation or chemical vapor deposition would result in nice smooth films. FIG. 17 shows that epitaxial, high oriented, triaxially textured Si films can be deposited on traixially textured NiW/TiN substrates. FIG. 18 shows a high resolution cross-section image of the Si/TiN interface showing epitaxial growth. The micrograph clearly indicates the epitaxial nature of growth as well as the sharpness of the interface between TiN and Si layers. FIG. 19 shows a plan view, high-resolution, transmission electron micrograph of the epitaxial silicon layer taken along the <100> direction. The inset shows a fast Fourier transform (FFT) pattern of the image. Clearly an epitaxial Si film is growing on the TiN buffered NiW. FIG. 20 shows a selected area diffraction pattern from the <100> zone axis of a plan view of transmission electron microscopy specimen of Si/TiN/NiW, showing epitaxial alignment of Si{220}, TiN{200} and Ni{200} diffraction spots. Spots from all three layers are clearly evident and marked in the diffraction pattern. There is a rotation of 45° between the Si and TiN while TiN on Ni has a cube on cube, epitaxial relationship. FIG. 21 also shows a selected area diffraction pattern from the <100> zone axis of a plan view of transmission electron microscopy specimen of Si/TiN/NiW, showing epitaxial alignment of Si{220}, TiN{200} and Ni{200} diffraction spots. In this case the region from where the diffraction pattern was obtained is larger. While the Si in this case was deposited using pulsed laser ablation, there are a wide range of techniques available for Si deposition. Many of these have recently been reviewed (see for example, Michelle J. McCann, Kylie R. Catchpole, Klaus J. Weber, Andrew W. Blakers, "A review of thin-film crystalline silicon for solar cell applications. Part 1: Native substrates," Solar Energy Materials and Solar Cells, Vol. 68, Issue 2, May 2001, Pages 135-171; Kylie R. Catchpole, Michelle J. McCann, Klaus J. Weber and Andrew W. Blakers, "A review of thin-film crystalline silicon for solar cell applications. Part 2: Foreign substrates," Solar Energy Materials and Solar Cells, Vol. 68, Issue 2, May 2001, Pages 173-215).

Figure 22:
FIG. 22 shows a high resolution, transmission electron micrograph showing that some twin boundaries are present in the silicon layer.

FIG. 22 shows a high resolution, transmission electron micrograph showing that some first order, coherent twin boundaries are present in the silicon layer. Hence, the Si layer is not completely free of defects. However, such coherent twin boundaries are not quite detrimental and are not electronically active (Hjemas, P. C., Lohne, O., Wandera, A., Tathgar, H. S., "The effect of grain orientations on the efficiency of multicrystalline solar cells," Solid State Phenomena, vol. 95-96, pp. 217-222, 2004; B. Cunningham, H. Strunk and D. G. Ast, "First and second order twin boundaries in edge defined film growth silicon ribbon, Appl. Phys. Lett., 40, pp. 237-239, 982). While no other defects were clearly observed in the films made, if other defects to nucleate, they can be passivated to become electrically inactive or very less detrimental electronically. Such defects which need passivation commonly occur in single crystal wafers and ribbons used for solar cell fabrication. There is numerous prior art which establishes that such defects can be passivated (M. Rinio, M. Kaes, G. Hahn and D. Borchert, "Hydrogen passivation of extended defects in multicrystalline silicon solar cells," Presented at the 21$^{st}$ European Photovoltaic Solar Energy Conference and Exhibition, Dresden, Germany, 4-8, 9, 2006; A. Ebong, M. Hilali, A. Rohtagi, D. Meier and D. S. Ruby, "Belt furnace gettering and passivation of n-web silicon for high-efficiency screen-printed front-surface field solar cells," Progress in Photovoltaics: Research and Applications, 9, pp. 327-332, 2001; C. H. Seager, D. J. Sharp and J. K.

G. Panitz, "Passivation of grain boundaries in silicon," J. Vac. Sci. & tech., 20, pp. 430-435, 1982; N. H. Nickel, N. M. Johnson and W. B. Jackson, "Hydrigen passivation of grain boundary defects in polycrystalline silicon thin films," Appl. Phys. Lett., 62, pp. 3285-3287, 1993; A. Ashok, "Research in hydrogen passivation of defects and impurities in silicon," NREL Report No. NREL/SR-520-36096, May 2004; M. Lipinski, P. Panek, S. Kluska, P. Zieba, A. Szyszka and B. Paszkiewicz, "Defect passivation of multicrystalline silicon solar cells by silicon nitride coatings," Materials Science-Poland, vol. 24, pp. 1003-1007, 2006; V. Yelundur, "Understanding and implementation of hydrogen passivation of defects in string ribbon silicon for high-efficiency, manufacturable, silicon solar cells," Ph.D. thesis, Georgia Institute of Technology, Atlanta, Ga., November 2003.)

While all kinds of biaxial or triaxial texture in a metal or alloy substrate is of interest, particular interest is in three kinds of crystallographic orientations. These include the $\{100\}<100>$, $\{110\}<100>$ and the $\{210\}<100>$ orientation. In all of these, the $<100>$ direction is parallel to the long axis of the theormomechanically processed, rolled and recrystallized tape. The $\{100\}<100>$ is produced by annealing above the primary recrystallization temperature of the metal or alloy. The $\{110\}<100>$ and $\{210\}<100>$ orientations are produced by annealing above the secondary recrystallization temperature of the metal or alloy. The $\{100\}<100>$ orientation is readily produced in many face centered cubic metals and alloys such as Ni, Al, Cu based alloys. The $\{110\}<100>$ texture is most readily produced in body centered cubic metals and alloys such Fe-based alloys. The $\{210\}<100>$ orientation is readily produced in alloys such as Ni—Fe alloys. Thermomechanical processing to fabricate such textured substrates can be extended to fabricate long and wide substrates of arbitrary lengths.

Single crystal metal or alloy foils can also be fabricated as opposed to polycrystalline alloys which are crystallographically textured. FIG. 23 shows a secondary recrystallized sheet of Ni fabricated by directional annealing of a Ni sheet with the Cu-type rolling texture. The Ni (200) and (111) pole figures show the presence of single crystal or single grain material. It is expected that such a method to form single crystals of metals and alloys by directional annealing above the secondary recrystallization temperature can be extended to a whole range of alloy compositions, specially for Ni, Cu, Fe and Al based substrates. This method can be characterized as a high-rate, solid state method to produce near net shaped single crystals of metals and alloys. This method can be extended to fabricate long and wide substrates of arbitrary lengths.

Figure 24:
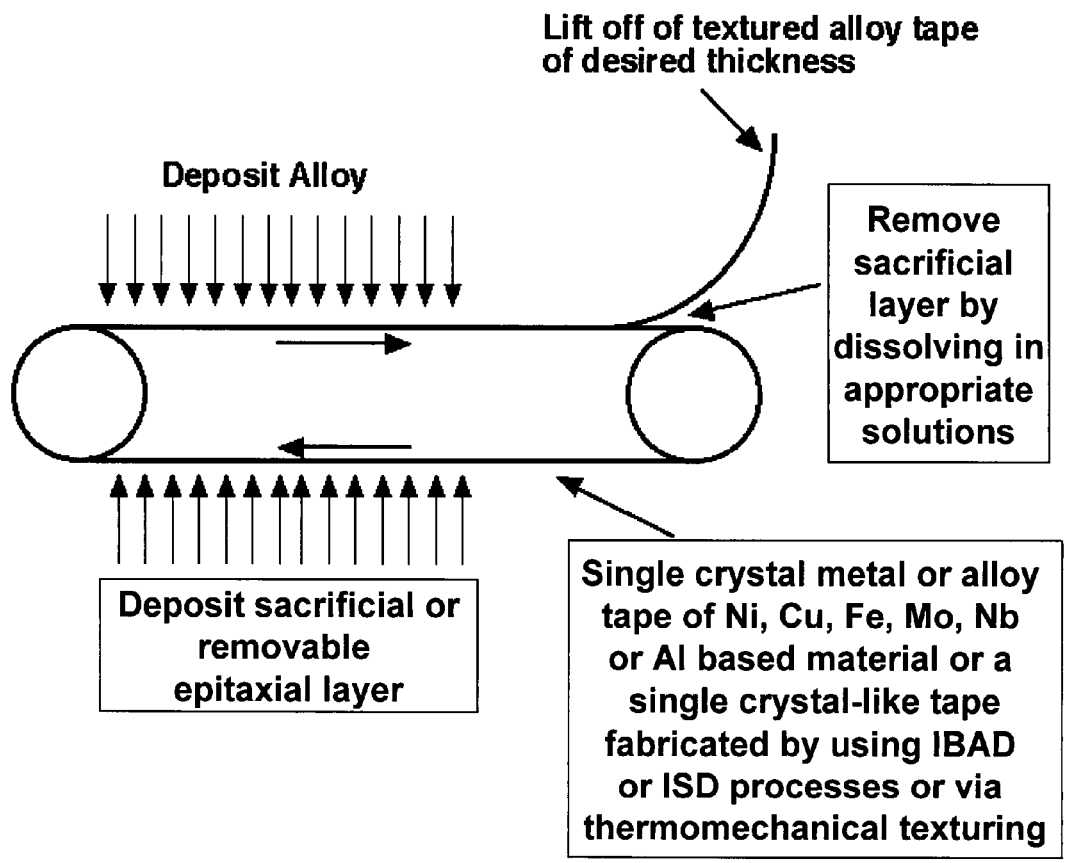
FIG. 24 shows a schematic representation of a continuous process to fabricate single crystal metal/alloy substrates using a belt of a single crystal or a single crystal-like material, epitaxially depositing a sacrificial or removable layer, then epitaxially depositing a layer of the desired metal/alloy, followed by removal of the sacrificial layer by chemical etching, dissolving in appropriate solvents. The process can be continuous and variations to this general concept can be multiple depositions stations etc. before removal of the sacrificial layer.
Figure 25:
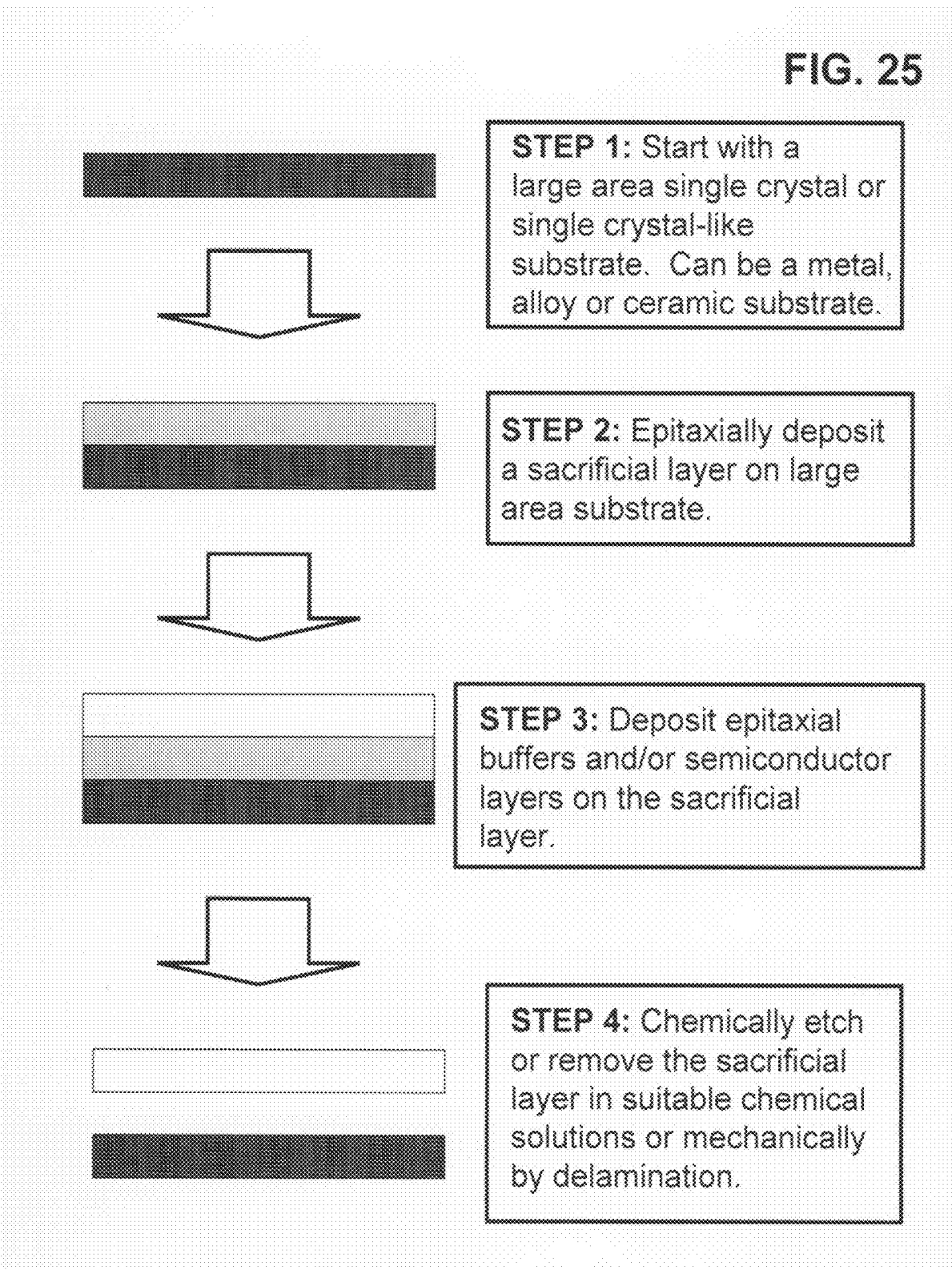
FIG. 25 shows a schematic representation of a semi-continuous process to fabricate single crystal metal/alloy substrates using a templating substrate of a single crystal or a single crystal-like material, epitaxially depositing a sacrificial or removable layer, then epitaxially depositing a layer of the desired metal/alloy, followed by removal of the sacrificial layer by chemical etching, dissolving in appropriate solvents or by mechanical delamination. Variations to this general concept can be multiple depositions stations etc. before removal of the sacrificial layer. This process is essentially similar to that shown in FIG. 19, except it is done in a semi-continuous or a discrete process.

Single crystals can also be fabricated using a method shown in FIG. 24. Here a single crystal or single-crystal-like belt of a material is used. A sacrificial layer of a material which can be dissolved in a chemical solvent is epitaxially deposited on the belt. Then the desired metal/alloy composition is deposited on the sacrificial layer to the desired thickness. Following this, the sacrificial layer is removed by chemical etching and a single crystal metal/alloy tape of the desired composition can be removed. As shown in FIG. 24, the process can be easily automated to continuously fabricate long lengths of single crystal-like substrates. Metal/alloy and sacrificial layer depositions can be done by a variety of deposition methods including physical vapor deposition (electron beam evaporation, thermal evaporation, sputtering, pulsed laser ablation, pulsed electron deposition, cathodic arc deposition), chemical vapor deposition, electrochemical deposition (such as electroplating or electrodeposition) and via chemical solution deposition (sol-gel, metallorganic deposition). FIG. 25 shows a schematic representation of a semi-continuous process to fabricate single crystal metal/alloy substrates using a templating substrate of a single crystal or a single crystal-like material, epitaxially depositing a sacrificial or removable layer, then epitaxially depositing a layer of the desired metal/alloy, followed by removal of the sacrificial layer by chemical etching, dissolving in appropriate solvents. Variations to this general concept can be multiple depositions stations etc. before removal of the sacrificial layer. This process is essentially similar to that shown in FIG. 24, except it is done in a semi-continuous or a discrete process.

Figure 26:
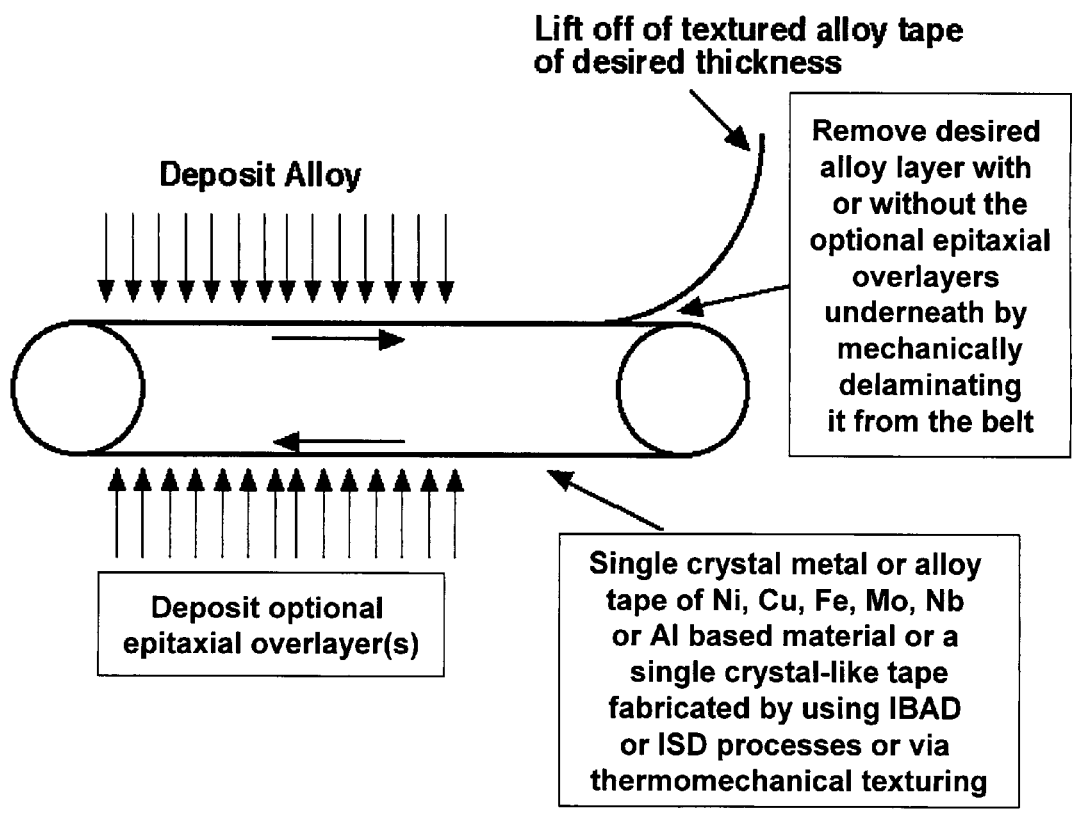
FIG. 26 shows a schematic representation of a continuous process to fabricate single crystal metal/alloy substrates using a belt of a single crystal or a single crystal-like material, epitaxially depositing optional overlayer(s), then epitaxially depositing a layer of the desired metal/alloy, followed by removal of the desired layer by mechanical delamination. The delamination plane can be chosen so that the delaminated tape has an overlayer(s) on its underside or not. The process can be continuous and variations to this general concept can be multiple depositions stations etc. before removal of the desired layer by mechanical delamination.

A variation of this process can be to continuously remove the deposited metal/alloy tape via delamination as opposed to dissolution of a sacrificial layer. FIG. 26 shows a schematic representation of a continuous process to fabricate single crystal metal/alloy substrates using a belt of a single crystal or a single crystal-like material, epitaxially depositing optional overlayer(s), then epitaxially depositing a layer of the desired metal/alloy, followed by removal of the desired layer by mechanical delamination. The delamination plane can be chosen so that the delaminated tape has an overlayer(s) on its underside or not. The process can be continuous and variations to this general concept can be multiple depositions stations etc. before removal of the desired layer by mechanical delamination.

Once a flexible, triaxially textured or single crystal substrate is obtained then using the illustrations in FIGS. 1-25, a variety of traixially textured electronic devices can be fabricated.

Another method for producing long and continuous, large-area single crystals of metals and alloys is by unidirectional continuous casting of a metal or alloy ribbon from the melt using either a horizontal or a vertical configuration. U.S. Pat. Nos. 4,789,022 and 4,665,970 incorporated herein by reference, teach a method to produce long, continuous sheets or ribbons of single crystal metals and alloys. Using this unidirectional continuous casting process, long continuous ribbons or sheets or foils of single crystal substrates such as metals and alloys can be fabricated at high speeds. At still higher speeds, while multiple grains may appear through the thickness of the sheet or foil, a single grain is parallel to the surface of the sheet or foil. Epitaxial deposition of layers leading to the devices of this invention as described herein is then possible.

Yet another method of fabricating large-area, single crystal sheets of metals, alloys and certain ceramic materials such as $Al_2O_3$ at high speeds is the edge-defined film-fed growth process. This is a well established process and is also used to fabricate ribbon silicon sheet. However, for the purposes of this invention, the interest is to fabricate single crystals of metals, alloys and insulating ceramics by this technique to produce thin, flexible, large-area, single crystal sheets. Epitaxial deposition of layers is then performed on these flexible, large-area substrates leading to a triaxially textured semiconductor device layer as shown in FIG. 11-13 and in FIG. 28.

A very large fraction of the Silicon wafers used in the photovoltaic industry worldwide are in the form of 8 inch wafers which are rejects from the electronic industry. These wafers which contain many defects are otherwise single crystal crystallographically and have an area of 50.2 square inches (50.2 $in^2$). Recently, the electronic fabrication shops worldwide have re-tooled to accommodate larger silicon wafers of 12 inch diameter. It is possible for the photovoltaic industry to use reject wafers containing defects which are 12 inch in diameter as well with an area of 113 $in^2$ However, this is the maximum possible size of single crystal wafers available and that can be grown world-wide. This invention allows one to fabricate flexible, large-area, single-crystal or single crystal-like semiconductor materials which are larger than 50.2 in$^2$ or 113.0 in$^2$. Triaxially textured metal and alloy substrates can be fabricated using thermomechanical processing to produce materials which have a {100}<100>, {110}<100> and the {210}<100> texture. In such cases, continuous sheets of large-area substrates can be made upon which epitaxial layers are deposited leading to a triaxially textured electronic device. Substrates of lengths exceeding 100 meters and widths approaching one meter are possible. Also, as taught previously, several methods of continuously producing single crystal or single grain metal and/or alloy substrates are possible. Use of IBAD, ISD, recrystallization of a uniaxially textured film in the presence of suitably oriented ion-beams and electrodeposition in the presence of a magnetic field can all also result in a triaxially textured buffer layer or even the semiconductor device layer directly on a substrate. If a textured buffer layer is grown, then the semiconductor layer is grown epitaxially on it. In each of the above cases, devices with areas greater than 113.0 in$^2$ can be grown which is not possible via single crystal growth of silicon or any other semiconductor.

EXAMPLE 2

Starting with a biaxially textured, Ni-3at % W substrate, a 75 nm thick, epitaxial layer of γ-Al$_2$O$_3$ is grown by electron beam evaporation at a substrate temperature in the range of 700-850° C. This is followed by deposition of an epitaxial Si layer using chemical vapor deposition in the temperature range of 500-900° C. Numerous reports exist in the literature of epitaxial growth of Si on γ-Al$_2$O$_3$ see for example, Liwen tan, Qiyuan Wang, Jun Wang, Yuanhuan Yu, Zhongli Liu and Lanying Lin, "Fabrication of novel double-hetero-epitaxial SOI structure Si/γ-Al$_2$O$_3$/Si," Journal of Crystal Growth, vol. 247, pp. 255-260, 2003; K. Sawada, M. Ishida, T. Nakamura and N. Ohtake, "Metalorganic molecular beam epitaxy of films on si at low growth temperatures,"Appl. Phys. Lett., vol. 52, pp. 1672-1674, 1988; M. Shahjahan, Y. Koji, K. Sawada and M. Ishida, "Fabrication of resonance tunnel diode by gamma-Al2O3/Si multiple heterostructures," Japn. J. of Appl. Phys. Part 1, vol. 41 (4B), pp. 2602-2605, 2002).

EXAMPLE 3

Starting with a biaxially textured, Ni-3at % W substrate, a 75 nm thick Y$_2$O$_3$ layer is deposited epitaxially on NiW substrate using electron beam evaporation at a substrate temperature in the range of 300-700° C. This is followed by deposition of a 50 nm thick, epitaxial layer of γ-Al$_2$O$_3$ by electron beam evaporation at a substrate temperature in the range of 700-850° C. This is followed by deposition of an epitaxial Si layer using chemical vapor deposition in the temperature range of 500-900° C.

EXAMPLE 4

Starting with the experimental procedure of Example 1, a Germanium (Ge) layer is deposited upon the epitaxial Si layer. This is followed by deposition of an epitaxial GaAs layer by chemical vapor deposition. This is then followed by deposition of an epitaxial InGaP layer. A transparent conductor is then deposited, followed by deposition of an antireflection coating and metal grid lines. The device shown schematically in FIG. 12 is now fabricated.

EXAMPLE 5

During the fabrication of the device of Example 2, a Si nitride reaction layer is formed at the interface of the TiN and Si layer. This results in fabrication of the device structure shown in FIG. 13.

EXAMPLE 6

Starting with the experimental procedure of Example 3, a Germanium (Ge) layer is deposited upon the epitaxial Si layer. This is followed by deposition of an epitaxial GaAs layer by chemical vapor deposition. This is then followed by deposition of an epitaxial InGaP layer. A transparent conductor is then deposited, followed by deposition of an antireflection coating and metal grid lines. The device shown schematically in FIG. 12 is now fabricated wherein the buffer layers correspond to Y$_2$O$_3$ and γ-Al$_2$O$_3$.

EXAMPLE 7

During the fabrication of the device of Example 6, a SiO$_2$ reaction layer is formed at the interface of the γ-Al$_2$O$_3$ and Si layer. This results in fabrication of the device structure shown in FIG. 13.

EXAMPLE 8

All the steps in Example 4 were performed on a flexible single crystal or single-grain, Ni-alloy substrate resulting in a single crystal or single grain, semiconductor device.

EXAMPLE 9

All the steps in Example 6 were performed on a flexible single crystal or single-grain, Ni-alloy substrate resulting in a single crystal or single grain, semiconductor device.

EXAMPLE 10

Starting with a polycrystalline, flexible Ni-alloy substrate with a smooth and clean surface (surfaces of substrates can be cleaned and made smoother by chemical etching and/or planarization, reactive ion etching, mechanical polishing or by electropolishing), a triaxially textured MgO layer is deposited by electron beam evaporation using inclined substrate deposition (ISD). Optional amorphous or polycrystalline layers can be deposited before depositing the MgO layer via the inclined substrate deposition technique. During ISD, the substrate is inclined at an angle of 25°-30° towards the MgO vapor during deposition. High deposition rates >3 nm/s are used. Growth selection by shadowing results in only MgO grains with good in plane alignment and a surface tilt of about 20°. Upon this MgO layer a TiN layer is deposited using sputtering. This is followed by deposition of an epitaxial silicon layer.

EXAMPLE 11

Starting with the experimental procedure of Example 10, a Germanium (Ge) layer is deposited upon the epitaxial Si layer. This is followed by deposition of an epitaxial GaAs layer by chemical vapor deposition. This is then followed by deposition of an epitaxial InGaP layer. A transparent conductor is then deposited, followed by deposition of an antireflection coating and metal grid lines.

EXAMPLE 12

Starting with a polycrystalline, flexible Ni-alloy substrate with a smooth and clean surface (surfaces of substrates can be cleaned and made smoother by chemical etching and/or planarization, reactive ion etching, mechanical polishing or by electropolishing), a triaxially textured MgO layer is deposited by electron beam evaporation using inclined substrate deposition (ISD). Optional amorphous or polycrystalline layers can be deposited before depositing the MgO layer via the inclined substrate deposition technique. During ISD, the substrate is inclined at an angle of 25°-30° towards the MgO vapor during deposition. High deposition rates >3 nm/s are used. Growth selection by shadowing results in only MgO grains with good in plane alignment and a surface tilt of about 20°. Upon this MgO layer a 50 nm thick, epitaxial layer of $\gamma$-$Al_2O_3$ is deposited using electron beam evaporation at a substrate temperature in the range of 700-850° C. This is followed by deposition of an epitaxial silicon layer.

EXAMPLE 13

Starting with the experimental procedure of Example 12, a Germanium (Ge) layer is deposited upon the epitaxial Si layer. This is followed by deposition of an epitaxial GaAs layer by chemical vapor deposition. This is then followed by deposition of an epitaxial InGaP layer. A transparent conductor is then deposited, followed by deposition of an antireflection coating and metal grid lines.

EXAMPLE 14

Starting with a polycrystalline, flexible Ni-alloy substrate with a smooth and clean surface (surfaces of substrates can be cleaned and made smoother by chemical etching and/or planarization, reactive ion etching, mechanical polishing or by electropolishing), a triaxially textured MgO layer is deposited by electron beam evaporation using ion-beam assisted deposition (IBAD) using the process taught in U.S. Pat. No. 6,190,752. Optional amorphous or polycrystalline layers can be deposited before depositing the MgO layer via the IBAD technique. Upon this MgO layer, an additional layer of MgO is deposited using electron beam evaporation. A TiN layer is then deposited using sputtering. This is followed by deposition of an epitaxial silicon layer.

EXAMPLE 15

Starting with the experimental procedure of Example 14, a Germanium (Ge) layer is deposited upon the epitaxial Si layer. This is followed by deposition of an epitaxial GaAs layer by chemical vapor deposition. This is then followed by deposition of an epitaxial InGaP layer. A transparent conductor is then deposited, followed by deposition of an antireflection coating and metal grid lines.

EXAMPLE 16

Starting with a polycrystalline, flexible Ni-alloy substrate with a smooth and clean surface (surfaces of substrates can be cleaned and made smoother by chemical etching and/or planarization, reactive ion etching, mechanical polishing or by electropolishing), a triaxially textured TiN layer is deposited by electron beam evaporation using ion-beam assisted deposition (IBAD) using the process taught in R. Hühne, S. Fäthler, B. Holzapfel, "Thin biaxially textured TiN films on amorphous substrates prepared by ion-beam assisted pulsed laser deposition," Appl. Phys. Lett., vol. 85, pp. 2744-2746, 2004. Optional amorphous or polycrystalline layers can be deposited before depositing the MgO layer via the IBAD technique. This is followed by deposition of an epitaxial silicon layer.

EXAMPLE 17

Starting with the experimental procedure of Example 16, a Germanium (Ge) layer is deposited upon the epitaxial Si layer. This is followed by deposition of an epitaxial GaAs layer by chemical vapor deposition. This is then followed by deposition of an epitaxial InGaP layer. A transparent conductor is then deposited, followed by deposition of an antireflection coating and metal grid lines.

EXAMPLE 18

Starting with the teaching in Example 1, a heterostructure of NiW/TiN/Si is formed. A graded semiconductor template layer of Si—Ge is then deposited upon the Si layer. There is a 4% lattice mismatch between silicon and germanium. This puts enormous stress on a Ge film if deposited directly by epitaxial deposition on the Si layer and can cause many crystalline defects to appear. Hence, as the Si—Ge layer grows, the content of germanium is gradually increased to more or less pure Ge. The Ge layer provides an excellent lattice match for growth of GaAs. The graded semiconductor template approach also reduces thermal expansion mismatch between the top semiconductor template layer and the semiconductor device layer.

EXAMPLE 19

Starting with the teaching in Example 1, a heterostructure of NiW/TiN is formed. A compositionally graded nitride layer is then deposited to form a good lattice match in the top layer with Silicon. Si is then epitaxially deposited on the "graded buffer layer". A graded semiconductor template layer of Si—Ge is then deposited upon the Si layer. There is a 4% lattice mismatch between silicon and germanium. This puts enormous stress on a Ge film if deposited directly by epitaxial deposition on the Si layer and can cause many crystalline defects to appear. Hence, as the Si—Ge layer grows, the content of germanium is gradually increased to more or less pure Ge. The Ge layer provides an excellent lattice match for growth of GaAs. The graded semiconductor template approach also reduces thermal expansion mismatch between the top semiconductor template layer and the semiconductor device layer.

EXAMPLE 20

Starting with a biaxially textured, Ni-3at % W substrate, a 75 nm thick $Y_2O_3$ layer is deposited epitaxially on NiW substrate using electron beam evaporation at a substrate temperature in the range of 300-700° C. This is followed by deposition of a 50 nm thick, epitaxial layer of cubic SiC or $\beta$-SiC using chemical vapor deposition following the procedure of Jin-Hyo Boo, S. A. Ustin and W. Ho, "Supersonic jet epitaxy of single crystalline cubic SiC thin films on Si substrates from t-Butyldimethylsilane," Thin solid Films, vol. 324, pp. 124-128, 1998. This is followed by deposition of an epitaxial Si layer using chemical vapor deposition in the temperature range of 500-900° C.

While GaAs layers can be integrated with large area, flexible substrates as described previously, GaAs can also be grown directly on perovskite oxides such as $SrTiO_3$ (see for example, K. Eisenbeiser, R. Emrick, R. Droopad, Z. Yu, J. Finder, S. Rockwell, J. Holmes, C. Overgaard, and W. Ooms, "GaAs MESFETs Fabricated on Si Substrates Using a $SrTiO_3$ Buffer Layer," IEEE Electron Device Letters, Vol. 23, No. 6, pp. 300-302, 2002; Droopad R, Yu ZY, Li H, Liang Y, Overgaard C, Demkov A, Zhang XD, Moore K, Eisenbeiser K, Hu M, Curless J, Finder J, "Development of integrated hetero structures on silicon by MBE," Journal of Crystal Growth, vol. 251 (1-4), pp. 638-644, 2003). In this work a compliant substrate for the epitaxial growth of compound semiconductors such as GaAs is reported. Perovskite-type buffer layers such as $SrTiO_3$ are first grown epitaxially on a Si single crystal wafer. After growth, a thin amorphous layer of $SiO_2$ about 20 angstroms in thickness is formed between the $SrTiO_3$ layer and the Si substrate. This thin amorphous layer acts as an elastic membrane mechanically decoupled from the Si substrate. If the $SrTiO_3$ layer is also kept thin to about 50 Angstroms, the final mismatch between the GaAs layer and Si is much lower than 4% if GaAs is grown directly on Si. This of course results in higher quality GaAs layer with fewer defects.

EXAMPLE 21

Starting with a biaxially textured, Ni-3at % W substrate, a 75 nm thick $Y_2O_3$ layer is deposited epitaxially on NiW substrate using electron beam evaporation at a substrate temperature in the range of 300-700° C. This was followed by epitaxial deposition of a 100 nm thick $SrTiO_3$ layer on the $Y_2O_3$ Layer using rf-sputtering at a substrate deposition temperature of 300-700° C. A GaAs layer is then deposited heteroepitaxially on the $SrTiO_3$ layer using molecular beam epitaxy (MBE) using the procedure outlined in K. Eisenbeiser, R. Emrick, R. Droopad, Z. Yu, J. Finder, S. Rockwell, J. Holmes, C. Overgaard, and W. Ooms, "GaAs MESFETs Fabricated on Si Substrates Using a $SrTiO_3$ Buffer Layer," IEEE Electron Device Letters, Vol. 23, No. 6, pp. 300-302, 2002 and in Droopad R, Yu ZY, Li H, Liang Y, Overgaard C, Demkov A, Zhang XD, Moore K, Eisenbeiser K, Hu M, Curless J, Finder J, "Development of integrated hetero structures on silicon by MBE," Journal of Crystal Growth, vol. 251 (1-4), pp. 638-644, 2003.

EXAMPLE 22

Starting with a polycrystalline, flexible Ni-alloy substrate with a smooth and clean surface (surfaces of substrates can be cleaned and made smoother by chemical etching and/or planarization, reactive ion etching, mechanical polishing or by electropolishing), a 50 nm thick $SiO_2$ layer is deposited using magnetron sputtering at room temperature. A uniaxially textured gold thin film is then deposited under high vacuum conditions. Before deposition of the gold film, the surface of the $SiO_2$ layer is cleaned with 1 keV Ar+ bombardment for 1 min resulting in a strong (111) fiber texture in the gold film. The gold thin film is then irradiated with 1.0-3.5 MeV N+, Ne+ and Ar+ ions with the ion beam direction at an angle of 35.24 to the surface normal. An ion fluence of $10^{17}$ ions/cm² and target currents in the range of 10-100 nA range were used depending upon the ion species. The temperature during the irradiation was kept at liquid nitrogen temperature. After this procedure the gold film exhibited texture in all directions. The procedure used to fabricate single-crystal-like gold films is outlined in more detail in prior work (Olliges S, Gruber P, Bardill A, Ehrler D, Carstanjen HD and Spolenak R, "Converting polycrystals into single crystals—Selective grain growth by high-energy ion bombardment," Acta Meterialia, vol. 54, pp. 5393-5399). Upon this gold film, a TiN layer was then epitaxially deposited by reactive sputtering followed by epitaxial deposition of a Si layer via CVD. This results in a triaxially textured semiconductor layer on a polycrystalline substrate.

Another suitable substrate upon which multilayers including buffer layers and the semiconductor device layer(s) can be epitaxially deposited to result in high performance is a substrate which is uniaxially textured but has a large average grain size. For example, it is well known that simply via uniaxial compression, a very sharp uniaxial texture can be obtained in a range of metals and alloys. The uniaxial texture is such that the axis perpendicular to the substrate is aligned for all the grains. If the average grain size is now increased by annealing and/or abnormal grain growth, the average grain size can be come very large and over 100 microns in diameter. As long as the grain size is larger than the recombination length of the semiconductor, the semiconductor layer will essentially not be affected by the grain boundaries propagated from the substrate into the semiconductor layer. A strong uniaxial texture with a large grain size can also be imparted in a buffer layer when the substrate itself is unoriented and polycrystalline or amorphous. This can be done by abnormal grain growth (for example, refer to prior art—J. M. E. Harper, J. Gupta, D. A. Smith, J. W. Chang, K. L. Holloway, D. P. Tracey and D. B. Knorr, "Crystallographic texture change during abnormal grain growth in Cu—Co thin films," Appl. Phys. Lettl, vol. 65, pp. 177-179, 1994) or grain growth via ion bombardment (for example, refer to prior art—T. Ohmi, T. Saito, M. Otsuki, T. Shibuta and T. Nitta, "Formation of copper thin films by a low kinetic energy particle process," J. of Electrochemical Soc., vol. 138, pp. 1089-1097, 1991). In all these cases, the device effectively has a "local" triaxial texture with a large grain size. This local biaxial texture on a length-scale larger than the recombination length of the semiconductor used to fabricate the polycrystalline device layer, will result in a photovoltaic cell of similar efficiency as that which is essentially single crystal, since the grain boundaries will not affect the performance.

Deposition of semiconductor layers can be done using a range of techniques. Many of these have recently been reviewed (see for example, Michelle J. McCann, Kylie R. Catchpole, Klaus J. Weber, Andrew W. Blakers, "A review of thin-film crystalline silicon for solar cell applications. Part 1: Native substrates," Solar Energy Materials and Solar Cells, Vol. 68, Issue 2, May 2001, Pages 135-171; Kylie R. Catchpole, Michelle J. McCann, Klaus J. Weber and Andrew W. Blakers, "A review of thin-film crystalline silicon for solar cell applications. Part 2: Foreign substrates," Solar Energy Materials and Solar Cells, Vol. 68, Issue 2, May 2001, Pages 173-215). In addition, there is interest in any low-temperature deposition technique as well since this will further reduce interdiffusion of elements from the metal/alloy substrate to the semiconductor device layer. Many low temperature deposition techniques for Si have been explored (see for example, Lars Oberbeck, Jan Schmidt, Thomas A. Wagner and Ralf B. Bergman, "High rate deposition of epitaxial layers for efficient low-temperature thin film epitaxial silicon solar cells," Progress in Photovoltaics: Research and Applications, vol. 9, pp. 333-340, 2001; J. Carabe and J. J. Gandia, "Thin-film-silicon Solar Cells," OPTO-Electronics Review, vol. 12, pp. 1-6, 2004; S Summers, H S Reehal and G H Shirkoohi, "The effects of varying plasma parameters on silicon thin film growth by ECR plasma CVD," J. Phys. D: Appl. Phys. Vol.

34, pp. 2782-2791, 2001; Thomas A. Wagner, Ph.D. thesis, "Low temperature silicon epitaxy: Defects and electronic properties," Institut für Physikalische Elektronik der Universität at Stuttgart, 2003; Hattangady, S. V., Posthill, J. B., Fountain, G. G., Rudder R. A., Mantini and M. J., Markunas, R. J., "Epitaxial silicon deposition at 300° C. with remote plasma processing using $SiH_4/H_2$ mixtures," Appl. Phys. Lett., vol. 59(3), pp. 339-341, 1991; Wagner, T. A., Oberbeck, L., and Bergmann, R. B., "Low temperature epitaxial silicon films deposited by ion-assisted deposition," Materials Science & Engineering B-Solid State Materials for Advanced Technology, vol. 89, pp. 1-3, 2002; Overbeck, L., Schmidt, J., Wagner, T. A., and Bergmann R. B., "High-rate deposition of epitaxial layers for efficient low-temperature thin film epitaxial silicon solar cells," Progress in Photovoltaics, vol. 9(5), pp. 333-340, 2001; Thiesen, J., Iwaniczko, E., Jones, K. M., Mahan, A., and Crandall, R., "Growth of epitaxial silicon at low temperatures using hot-wire chemical vapor deposition," Appl. Phys. Lett., vol. 75(7), pp. 992-994, 1999; Ohmi, T., Hashimoto, K., Morita, M., Shibata, T., "Study on further reducing the epitaxial silicon temperature down to 250° C. in low-energy bias sputtering," Journal of Appl. Phys., vol. 69(4), pp. 2062-2071, 1991.)

Semiconductor layers can also be deposited using an ex-situ process. In this process, a precursor film of the semiconductor layer is first deposited followed by epitaxial crystallization of the semiconductor layer (see for example, International Patent Application No. WO 2004/033769 A1 titled "Fabrication method for crystalline semiconductor on foreign substrates"; Ngo Duong Sinh, Gudrun Andrä, Fritz Falk, Ekkehart Ose, Joachim Bergmann, "Optimization of Layered Laser Crystallization for Thin-Film Crystalline Silicon Solar Cells," Solar Energy Materials & Solar Cells 74 (2002), 295-303; Nickel, N. H.; Brendel, K.; Saleh, R., "Laser crystallization of hydrogenated amorphous silicon," Physica status solidi. C. Conferences and critical reviews, vol. 1, no5, pp. 1154-1168, 2004; J. B. Boyce, J. P. Lu, J. Ho, R. A. Street, K. van Schuylenbergh and Y. Wang, "Pulsed laser crystallization of amorphous silicon for polysilicon flat panel imagers," Journal of Non-Crystalline Solids, Vol. 299-302, pp. 731-735, 2002; Lulli, G.; Merli, P. G.; Antisari, M. Vittori, "Solid-phase epitaxy of amorphous silicon induced by electron irradiation at room temperature," Physical Review B (Condensed Matter), Volume 36, Issue 15, Nov. 15, 1987, pp. 8038-8042; Mohadjeri, B.; Linnros, J.; Svensson, B. G.; Östling, M., "Nickel-enhanced solid-phase epitaxial regrowth of amorphous silicon," Physical Review Letters, Volume 68, Issue 12, Mar. 23, 1992, pp. 1872-1875; Yann Civale, Lis K. Nanver, Peter Hadley, Egbert J. G. Goudena, and Hugo Schellevis, "Sub-500° C. Solid-Phase Epitaxy of Ultra-Abrupt p+-Silicon Elevated Contacts and Diodes," IEEE Electron Device Letters, Vol. 27, 2006; Cline H. E., "A single crystal silicon thin-film formed by secondary recrystallization," Journal of Appl. Phys., vol. 55 (12), pp. 4392-4397, 1984; Santos, P. V.; Trampert, A.; Dondeo, F.; Comedi, D.; Zhu, H. J.; Ploog, K. H.; Zanatta, A. R.; Chambouleyron, I. "Epitaxial pulsed laser crystallization of amorphous germanium on GaAs," Journal of Applied Physics, Vol. 90, pp. 2575-2581, 2001; T. Sameshima, H. Watakabe, H. Kanno, T. Sadoh and M. Miyao, "Pulsed laser crystallization of silicon-germanium films," Thin Solid Films Vol. 487 pp. 67-71, 2005; R. D. Ott, P. Kadolkar, C. A. Blue, A. C. Cole, and G. B. Thompson, "The Pulse Thermal Processing of Nanocrystalline Silicon Thin-Films," JOM, vol. 56, pp. 45-47, October, 2004).

Solar cells based on polycrystalline $Cu(In,Ga)Se_2$ (CIGS) thin films are also of significant interest and a record efficiency of 19.2% has been demonstrated in laboratory scale. Scale-up of this process on flexible substrates continues in the industry, however, efficiencies obtained in production runs are much lower. Even the high efficiency solar cells made using the CIGS thin films are polycrystalline with an average grain size of about 2 μm. So far not much is completely established about the exact effect or influence of grain boundaries in CIGS solar cells. It has been proposed that oxygen may be passivating the otherwise detrimental grain boundaries (see for example, D. Cahen and R. Noufi, "Defect chemical explanation for the effect of air anneal on CdS/$CuInSe_2$ solar cell performance," Appl. Phys. Lett., vol. 54, pp. 558-560, 1989). It has also been suggested that the diffusion of sodium (Na) to the grain boundaries catalyzes this beneficial oxygenation (see for example, L. Kronik, D. Cahen, and H. W. Schock, "Effects of Sodium on Polycrystalline $Cu(In,Ga)Se_2$ and Its Solar Cell Performance," Advanced Materials, vol. 10, pp. 31-36, 1999). It has also been demonstrated that recombination charge carriers at grain boundaries is different from that of the bulk (see for example, M. J. Romero, K. Ramanathan, M. A. Contreras, M. M. Al-Jassim, R. Noufi, and P. Sheldon, "Cathodoluminescence of $Cu(In,Ga)Se_2$ thin films used in high-efficiency solar cells," Appl. Phys. Lett., vol. 83, pp. 4770-4772, 2003). It has been suggested that intrinsic passivation occurs at grain boundaries because of a wider gap at grain boundaries (see for example, Persson C, Zunger A., "Anomalous grain boundary physics in polycrystalline $CuInSe_2$: the existence of a hole barrier," Phys. Rev. Lett. vol. 91, pp. 266401-266406, 2003). It has been suggested that the beneficial local built-in potential at grain boundaries is dependent on the Ga content (see for example, C.-S. Jiang, R. Noufi, K. Ramanathan, J. A. AbuShama, H. R. Moutinho, and M. M. Al-Jassim, "Local Built-in Potential on Grain Boundary of $Cu(In,Ga)Se_2$ Thin Films," Conference Paper, NREL/CP-520-36981, 2005). It has been reported that there is a reduction in the Cu content at the grain boundaries and that this leads to the less detrimental effect of grain boundaries (see for example, M. J. Hetzer, Y. M. Strzhemechny, M. Gao, M. A. Contreras, A. Zunger, and L. J. Brillson, "Direct observation of copper depletion and potential changes at copper indium gallium diselenide grain boundaries," Appl. Phys. Left. vol. 86, pp. 162105-162107, 2005). It has also been suggested that the crystallographic texture is also important for the higher efficiency CIGS based solar cells (see for example, S. Chaisitsak, A. Yamada and M. Konagai, "Preferred Orientation Control of $Cu(In1-xGax)Se_2$ (x≈0.28) Thin Films and Its Influence on Solar Cell Characteristics," Jpn. J. Appl. Phys. vol. 41, pp. 507-513, 2002). Taken together, these above studies suggest that while grain boundaries may not be very detrimental in general in CIGS-based solar cells, it is important what the composition of the grain boundary is so as to control its electronic activity. This requires very good control of grain boundary structure which is not possible in randomly or weakly uniaxially textured CIGS films. If the orientation of all the CIGS grains were controlled by fabricating triaxially textured cells, then in run after run, the composition of the CIGS film grain boundaries will be the same. This will allow one to fabricate large-area CIGS-based cells with very high efficiencies in industrial settings which is not possible presently.

Figure 27:
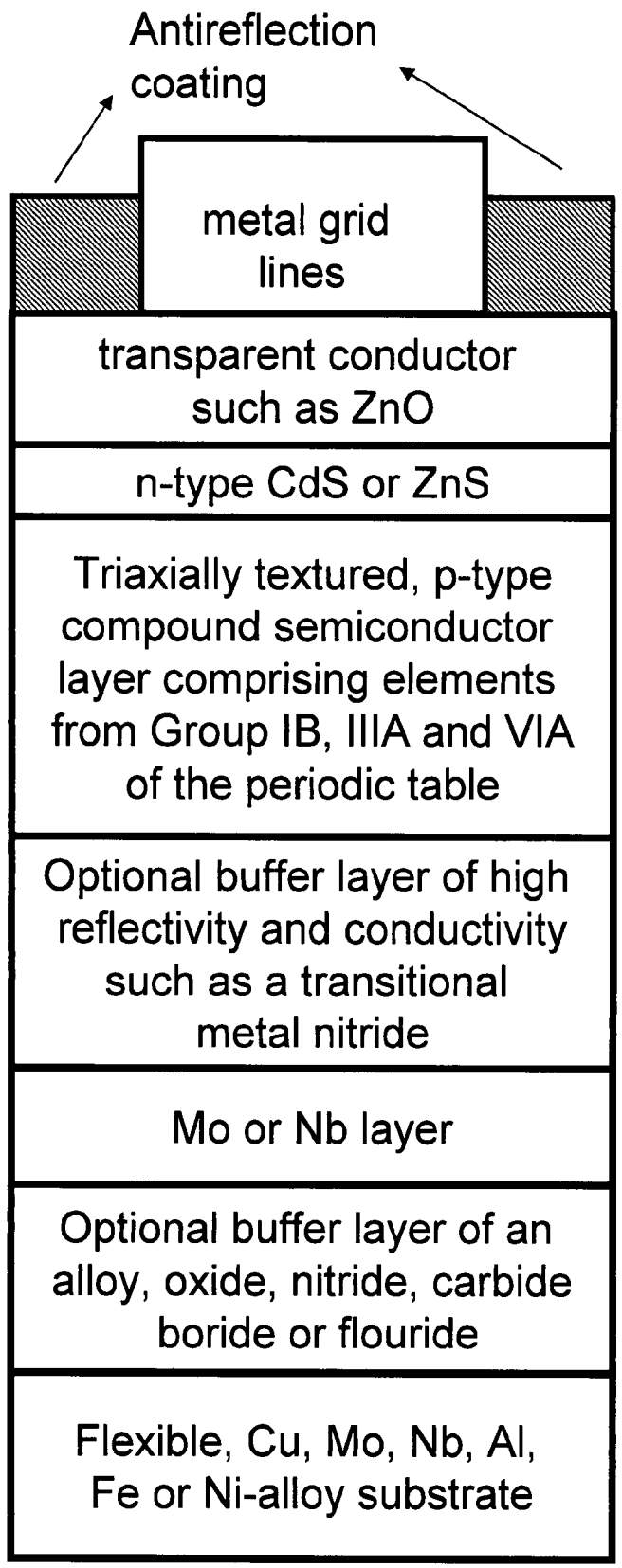
FIG. 27 shows an idealized schematic representation in cross-section of an electronic device containing a triaxially textured semiconductor device in accordance with the present invention. The device comprises a flexible, Cu, Mo, Nb, Al, Fe or Ni-alloy substrate; optional buffer layer(s) of an alloy, oxide, nitride, carbide boride or fluoride; a Mo or a Nb layer; an optional buffer layer of a high reflectivity and conductivity such as a transitional metal nitride; a triaxially textured, p-type compound semiconductor layer comprising elements from Group IB, IIIA and VIA of the periodic table; an n-type layer such as a CdS or ZnS layer; a transparent conductor such as a ZnO layer; and optional antireflection coating and metal grid lines. The representation forms the general basis of a device. One can envisage additional semiconductor layers or junctions and/or buffer layers in this multilayered stack. One use of such a device is for solar power generation.

Shown in FIG. 27 is an idealized schematic representation in cross-section of a triaxially textured, CIGS-based, electronic device in accordance with the present invention. The device comprises a flexible, Cu, Mo, Nb, Al, Fe or Ni-alloy substrate; optional buffer layer(s) of an alloy, oxide, nitride, carbide boride or fluoride; a Mo or a Nb layer; an optional buffer layer of a high reflectivity and conductivity such as a transitional metal nitride; a triaxially textured, p-type compound semiconductor layer comprising elements from Group IB, IIIA and VIA of the periodic table; an n-type layer such as a CdS or ZnS layer; a transparent conductor such as a ZnO layer; and optional antireflection coating and metal grid lines. The representation forms the general basis of a device. One can envisage additional semiconductor layers or junctions and/or buffer layers in this multilayered stack. One use of such a device is for solar power generation.

Figure 28:
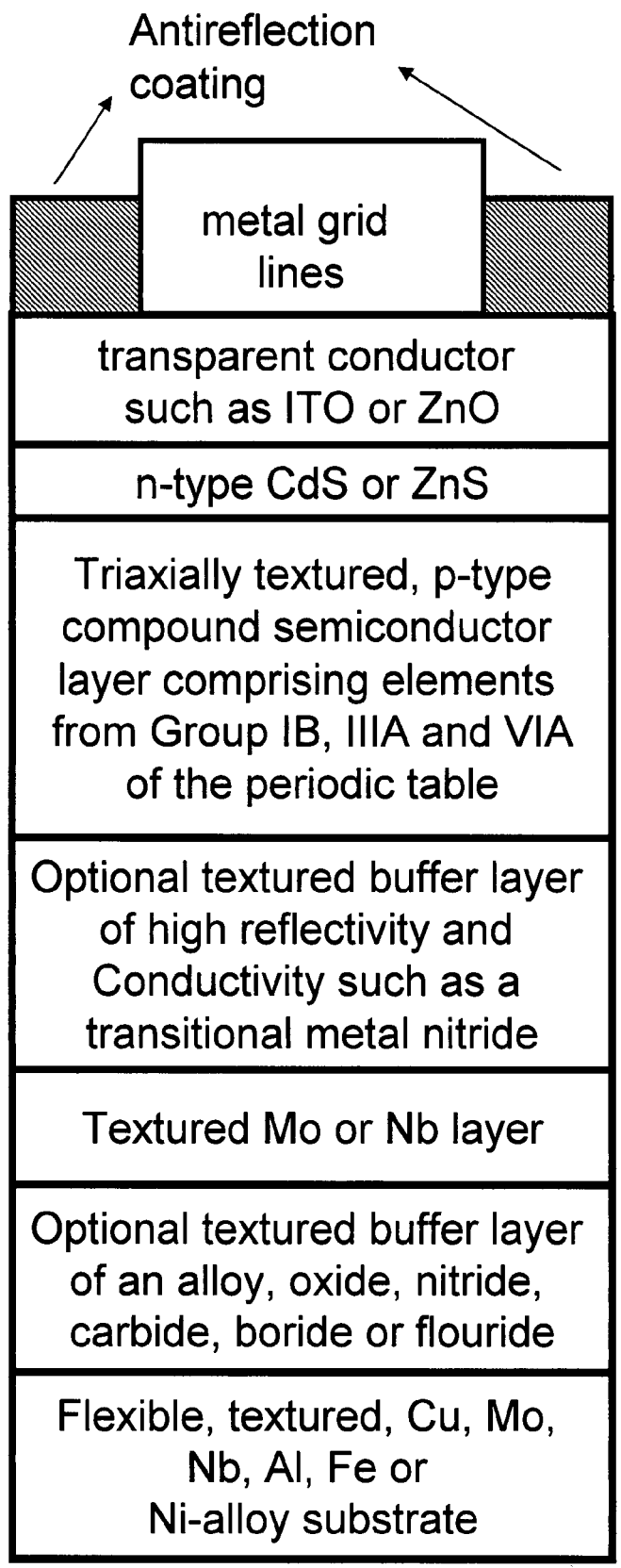
FIG. 28 shows an idealized schematic representation in cross-section of an electronic device containing a triaxially textured semiconductor device in accordance with the present invention. The device comprises a flexible, textured Cu, Mo, Nb, Al, Fe or Ni-alloy substrate; optional buffer layer(s) of an alloy, oxide, nitride, carbide boride or fluoride; a textured Mo or a Nb layer; an optional textured buffer layer of a high reflectivity and conductivity such as a transitional metal nitride; a triaxially textured, p-type compound semiconductor layer comprising elements from Group IB, IIIA and VIA of the periodic table; an n-type layer such as a CdS or ZnS layer; a transparent conductor such as a ZnO layer; and optional antireflection coating and metal grid lines. The representation forms the general basis of a device. One can envisage additional semiconductor layers or junctions and/or buffer layers in this multilayered stack. One use of such a device is for solar power generation.

Shown in FIG. 28 is an idealized schematic representation in cross-section of a triaxially textured, CIGS-based, electronic device in accordance with the present invention using a triaxially textured metal/alloy substrate. The device comprises a flexible, textured Cu, Mo, Nb, Al, Fe or Ni-alloy substrate; optional buffer layer(s) of an alloy, oxide, nitride, carbide boride or fluoride; a textured Mo or a Nb layer; an optional textured buffer layer of a high reflectivity and conductivity such as a transitional metal nitride; a triaxially textured, p-type compound semiconductor layer comprising elements from Group IB, IIIA and VIA of the periodic table; an n-type layer such as a CdS or ZnS layer; a transparent conductor such as a ZnO layer; and optional antireflection coating and metal grid lines. The representation forms the general basis of a device. One can envisage additional semiconductor layers or junctions and/or buffer layers in this multilayered stack. One use of such a device is for solar power generation.

Other applications of flexible electronics or circuits are as connectors in various applications where flexibility, space savings, or production constraints limit the serviceability of rigid circuit boards or hand wiring. Another common application of flex circuits is in computer keyboard manufacturing; most keyboards made today use flexible circuits for the switch matrix.

Figure 29:
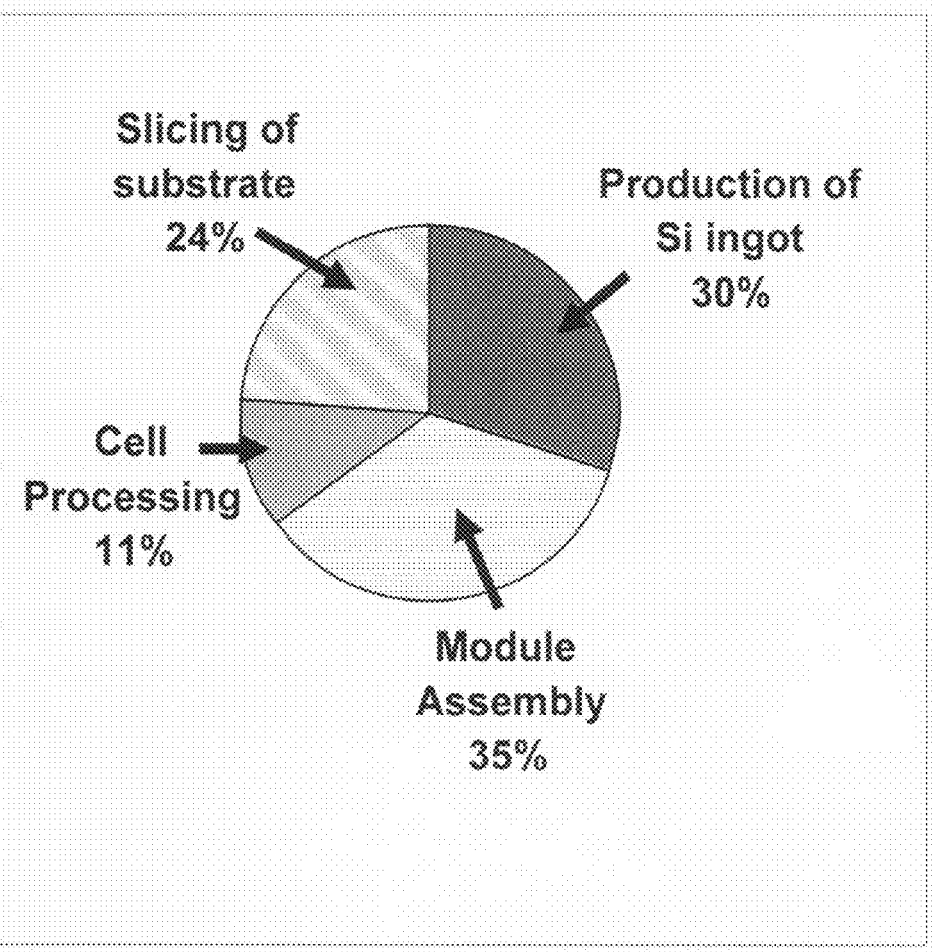
FIG. 29 shows a pie chart of typical production cost breakdown for crystalline silicon solar cell modules.

Since the present invention results in triaxially textured or single-crystal-like devices, their performance is excellent. However, the present invention also results in cheaper devices. FIG. 29 shows a pie chart of a typical production cost breakdown for crystalline silicon solar cell modules. As can be seen from this chart, the slicing of the Si substrate, cell processing and module assembly accounts for 70% of the total cost of the module. Using the present invention to make solar cells, no slicing and module assembly is required. Module assembly involving assembling a number of processed si wafers into a module, alone accounts for 35% of the total cost of the solar cell module. In the present invention, very large-area, triaxially textured cells can be fabricated using continuous or static processes. The device can then be patterned appropriately to delineate various cells in the large-area module.

The electronic device in accordance with this invention can be used for an application selected from a group comprising of photovoltaic devices, flat-panel displays, thermophotovoltaic devices, ferroelectric devices, light emitting diode devices, computer hard disc drive devices, magnetoresistance based devices, photoluminescence based devices, non-volatile memory devices, dielectric devices, thermoelectric devices and quantum dot laser devices. In a preferred embodiment, the electronic device has an area larger than 50 in$^2$. In yet a further preferred embodiment, the electronic device has an area larger than 113 in$^2$. Electronic devices in accordance with this invention can comprise at least one device component selected from a group comprising of two terminal devices such as a diode; three terminal devices such as a transistor, thyristor or rectifier; and multi-terminal devices such as a microprocessor, random access memory, read-only-memory or a charge-coupled device.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof.

I claim:

1. A flexible, electronic device comprising;
   a. a polycrystalline, metal, alloy or ceramic substrate having a substrate surface with a single triaxial texture;
   b. at least one polycrystalline, multi-grain, layer of a semiconductor material on said substrate surface having a single triaxial texture and having a distribution of grain orientations characterized by a FWHM of less than 10 degrees with respect to all three major crystallographic directions.

2. The article of claim 1 wherein said triaxially layer textured has a crystallographic plane selected from the group consisting of {100}, {200}, {110}, {220} and {210} to be parallel within 10 degrees of the substrate surface.

3. The article of claim 1, wherein said textured layer has a crystallographic texture selected from a group {100}<100>, {210}<100>and {110}<100>.

4. The article of claim 1, further comprising at least one buffer layer on said substrate selected from a group consisting of a metal, alloy, nitride, boride, oxide, fluoride, carbide, silicide and an intermetallic alloy with germanium.

5. The article of claim 4 wherein said nitride buffer layer corresponds to a composition of MN, wherein N is Nitrogen and M is selected from a group comprising Ti, Ce, Y, Zr, Hf, V, Nb, Nd, La, and Al.

6. The article of claim 4 wherein said oxide buffer layer is selected from a group consisting gamma $Al_2O_3$ (cubic form of $Al_2O_3$), $SrTiO_3$, $(Sr,Nb)TiO_3$, $BaTiO_3$, $(Ba,Ca)TiO_3$, $LaMnO_3$, $LaAlO_3$, $(La,Sr)MnO_3$, $(La,Ca)MnO_3$, $Bi_4Ti_3O_{12}$, $La_2Zr_2O_7$, $Ca_2Zr_2O_7$, $Gd_2Zr_2O_7$, $Y_2O_3$, YSZ; MgO and $MgAl_2O_4$.

7. The article of claim 4 wherein said buffer layer comprises a mixture of a nitride and an oxide such as $MN_XO_Y$ (1 <x, y >0), wherein N is Nitrogen and O is Oxygen and M is selected from the group consisting of Ti, Ce, Y, Zr, Hf, V, Nb, Nd, La, and Al.

8. The article of claim 4 wherein said silicide buffer layer or an intermetallic alloy with germanium corresponds to a layer with a chemical formula, MSi or $MSi_2$, $MSi_3$, MGe or $MGe_2$, $MGe_3$, wherein M is a metal comprising Ni, Cu, Fe, Ir, or Co.

9. The article of claim 4 wherein said carbide buffer layer corresponds to the cubic form of SiC.

10. The article of claim 4 wherein the said buffer layer is a graded buffer layer comprising of multiple buffer layers with varying lattice parameters to provide a good lattice match to the triaxially textured layer.

11. The article of claim 4 wherein the buffer layer is electrically conducting.

12. The article of claim 4 wherein said buffer layer has a triaxial texture characterized by a FWHM of less than 10 degrees in all three major crystallographic directions.

13. The article of claim 4 wherein said oxide buffer layer has a crystal structure selected from the group consisting of flourite, perovskite, rock-salt, pyrochlore and spinel crystal structures.

14. The article of claim 1 further comprising a semiconductor template layer to provide a good lattice match to the layer.

15. The article of claim 14 wherein the semiconductor template layer is a graded semiconductor template layer with multiple layers of varying lattice parameters to provide a good lattice match to the triaxially textured layer.

16. The article of claim 1 wherein said substrate has a triaxial texture such that the distribution of grain orientations is characterized by a FWHM of less than 10 degrees with respect to all three major crystallographic directions.

17. The article of claim 16 wherein said substrate is selected from a group comprising Cu, Ni, Al, Mo, Nb and Fe and their alloys thereof.

18. The article of claim 1 wherein said triaxially textured layer provides a photovoltaic device comprising at least one pn junction parallel to said substrate surface.

19. The article of claim 18 wherein the conversion efficiency of said triaxially textured layer is greater than 8%.

20. The article of claim 18 wherein the conversion efficiency of said triaxially textured layer is greater than 12%.

21. The article of claim 1 wherein said electronic device has an area greater than 50 in$^2$.

22. The article of claim 1 wherein said electronic device has an area greater than 113 in$^2$.

23. The article of claim 1 wherein said electronic device is selected from a the group consisting of photovoltaic devices, flat-panel displays, thermophotovoltaic devices, ferroelectric devices, light emitting diode devices, computer hard disc drive devices, magnetoresistance based devices, photoluminescence based devices, non-volatile memory devices, dielectric devices, thermoelectric devices and quantum dot laser devices.

24. The article of claim 1 wherein said electronic device forms a component of a flat-panel active-matrix liquid crystal display (AMLCD) or a flat-panel active-matrix organic light-emitting diode (AMOLED) display.

25. The article of claim 1 wherein said electronic device is selected from the group consisting of diodes, transistors, thyristors, rectifiers, microprocessors, random access memories, read-only-memories and charge-coupled devices.

26. The article of claim 1 wherein said polycrystalline semiconductor material is selected from the group consisting of indirect bandgap, direct bandgap and multiband semiconductors.

27. The article of claim 26, wherein said triaxially textured layer is selected from the group consisting of an elemental semiconductor or an alloy of elements within the same group of the Periodic table.

28. The article of claim 26 wherein said polycrystalline semiconductor material is a binary, ternary or a quarternary compound semiconductor, composed of elements from two or more different groups of the Periodic Table.

29. The article of claim 26, wherein said triaxially textured layer is selected from the group consisting of Si, Ge, GaP, GaN, GaAs, CdTe, InP, InAs, InSb, ZnS, ZnSe, ZnTe, CdTe, HgTe, $Si_xGe_{1-x}$, CdHgTe, $CuInGaSe_2$ (CIGS), AlGaAs, GaInP, InGaN, AlInGaP, AlInP, $Zn_{1-y}Mn_yO_xTe_{1-x}$ and $GaN_xAs_{1-x-y}P_y$.

* * * * *